(12) United States Patent
Tsuchi

(10) Patent No.: US 8,243,003 B2
(45) Date of Patent: Aug. 14, 2012

(54) LEVEL SHIFT CIRCUIT, AND DRIVER AND DISPLAY SYSTEM USING THE SAME

(75) Inventor: Hiroshi Tsuchi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 745 days.

(21) Appl. No.: 12/314,909

(22) Filed: Dec. 18, 2008

(65) Prior Publication Data

US 2009/0160848 A1    Jun. 25, 2009

(30) Foreign Application Priority Data

Dec. 19, 2007   (JP) ................................. 2007-327492

(51) Int. Cl.
*G09G 5/00* (2006.01)
*G03K 17/00* (2006.01)

(52) U.S. Cl. ........ 345/100; 345/204; 345/690; 345/214; 345/92; 327/333; 327/407; 327/241

(58) Field of Classification Search .................. 345/214, 345/100, 204, 690, 92; 327/333, 241, 407
See application file for complete search history.

(56) References Cited

U.S. PATENT DOCUMENTS

| | | | |
|---|---|---|---|
| 6,583,647 B2 * | 6/2003 | Kim et al. ...................... | 326/81 |
| 2001/0013795 A1 * | 8/2001 | Nojiri ............................ | 326/81 |
| 2007/0216613 A1 * | 9/2007 | Ogura et al. ................... | 345/76 |
| 2008/0088565 A1 * | 4/2008 | Chang ........................... | 345/100 |

FOREIGN PATENT DOCUMENTS

| JP | 2001-298356 | 10/2001 |
|---|---|---|
| JP | 2006-325193 | 11/2006 |

OTHER PUBLICATIONS

Japanese Notice of Grounds for Rejection dated Jun. 12, 2012, with partial English-language translation.

* cited by examiner

*Primary Examiner* — Lun-Yi Lao
*Assistant Examiner* — MD Saiful A Siddiqui
(74) *Attorney, Agent, or Firm* — McGinn IP Law Group, PLLC

(57) ABSTRACT

Disclosed is a level shift circuit including a first level shift circuit that is connected between a first power supply terminal and first and second output terminals and receives first and second input signals from the first and second input terminals, respectively, and sets one of the first and second output terminals to a first voltage level, based on the first and second input signals; a second level shift circuit that is connected between a second power supply terminal and the first and second output terminals, and sets the other of the first and second terminals to a second voltage level; and a circuit that performs control to disconnect a current path in the second level shifter between the second power supply terminal and one of the first and second output terminals that is driven to the second voltage level at a time point when the first and second input signals are supplied to the first and second input terminals for a predetermined period including the time point when the first and second input signals are supplied to the first and second input terminals, and to cancel the disconnection of the current path in the second level shifter between the one output terminal and the second power supply terminal after the predetermined period. Output amplitudes at the first and second output terminals are set to be larger than amplitudes of the first and second input signals.

22 Claims, 22 Drawing Sheets

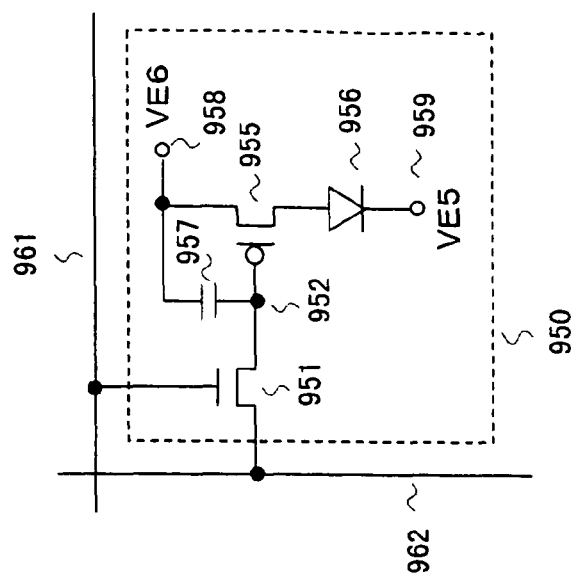
FIG.20C ACTIVE MATRIX ORGANIC EL DISPLAY UNIT
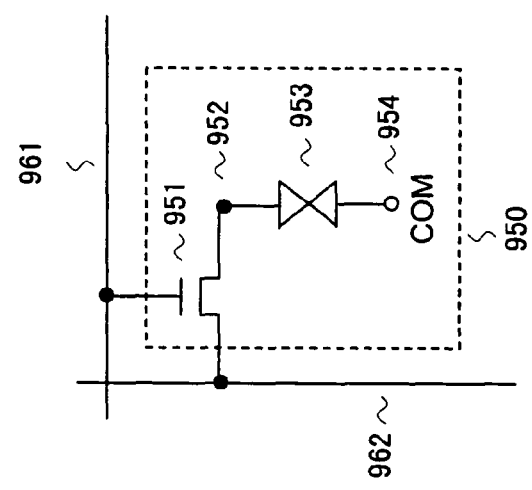
FIG.20B ACTIVE MATRIX LIQUID CRYSTAL DISPLAY UNIT
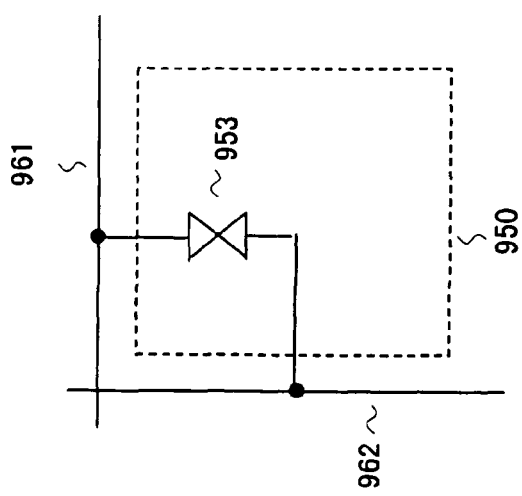
FIG.20A PASSIVE MATRIX LIQUID CRYSTAL DISPLAY UNIT

LEVEL SHIFT CIRCUIT, AND DRIVER AND DISPLAY SYSTEM USING THE SAME

REFERENCE TO RELATED APPLICATION

This application is based upon and claims the benefit of the priority of Japanese patent application No. 2007-327492 filed on Dec. 19, 2007, the disclosure of which is incorporated herein in its entirety by reference thereto.

FIELD OF THE INVENTION

The present invention relates to a level shift circuit and a driver and a display system that use the level shift circuit.

BACKGROUND OF THE INVENTION

Recently, in the field of display systems, displays that use various display devices, such as a liquid crystal display system and a display that uses organic EL (Electro Luminescence) elements, have been developed. Higher image quality (increased gray scales) is demanded for these display systems, and voltage amplitudes of a scan signal and a gray scale signal tend to be increased. For this reason, higher voltages of a row driver that drives a scan line of a display panel and a column driver that drives a data line of the display panel using the gray scale signal are demanded.

On the other hand, higher-speed transfer and low EMI (Electro-Magnetic Interference) using a small number of signal lines are demanded for various control signals and image data signals supplied from the row driver and the column driver from a display controller. Lower amplitudes of those signals are being achieved.

Further, even in the row driver and the column driver, a fine fabrication process has been adopted in order to reduce an increase in the area (cost) of logic circuits that handle data, the amount of which increases accompanying a higher definition and the increased gray scales. With a fine fabrication process, the power supply voltage of the logic circuit tends to be reduced.

That is, lower voltages of input sections of the row driver and the column driver and higher voltages of output sections of the row driver and the column driver are demanded.

For this reason, in a level shift circuit that converts a low-voltage signal in an input section thereof to a high-voltage signal in an output section thereof, a low-amplitude signal must be converted to a high-amplitude signal at high speed.

FIG. 21 is a diagram showing an example of a typical configuration of the level shift circuit that converts a low-amplitude signal to a high-amplitude signal (refer to Patent Document 1 listed below). Referring to FIG. 21, this level shift circuit receives a low-voltage signal IN and outputs a high-voltage output signal OUT and a high-voltage output signal OUTB which is a reverse phase signal of the signal OUT. The level shift circuit includes P-channel MOS transistors P1 and P2 which have sources connected to a power supply terminal VDD3, have gates connected to output terminals W2 and W1, respectively, and have drains connected to the output terminals W1 and W2, respectively. The P-channel MOS transistors P1 and P2 function as charging elements for the output terminals W1 and W2, respectively. The P-channel MOS transistors P1 and P2 respectively receive at gates thereof the high-amplitude output signal OUT output from the output terminal W2 and the output signal OUTB output from the output terminal W1. The maximum absolute value of a gate-to-source voltage VGS of each of the P-channel MOS transistors P1 and P2 is |VSS−VDD3|. N-channel MOS transistors N1 and N2 function as discharging elements for the output terminals W1 and W2, respectively. N-channel MOS transistors N1 and N2 have sources connected to a power supply terminal VSS and have drains connected to the output terminals W1 and W2, respectively. N-channel MOS transistors N1 and N2 respectively receive at gates thereof the low-voltage input signal IN and the inverted signal of the input signal IN (both being low-amplitude signals).

The maximum gate-to-source voltage of each of the discharging elements N1 and N2 is set to the amplitude of the input signal IN. Discharging capability of each of the discharging elements N1 and N2 is lower than charging capability of each of the charging elements P1 and P2 of which the maximum absolute value of the gate-to-source voltage VGS is |VSS−VDD3|. A drain current of each of the discharging elements N1 and N2 and the charging elements P1 and P2 is proportional to the square of [(gate-to-source voltage)−(threshold voltage)]. A drain current of each of the charging elements P1 and P2, whose gate-to-source voltage in an on state is set to a larger value, is larger than a drain current of each of the discharging elements N1 and N2.

Then, in order to increase discharging capability of respective discharging elements N1 and N2, the element size of the respective discharging elements N1 and N2 (W/L ratio; where W is a channel width and L is a channel length) needs to be sufficiently large.

By the way, the discharging capability of respective discharging elements N1 and N2 must be set to exceed the charging capability of the respective charging elements P1 and P2. This can be readily understood in view of a discharging operation of the respective discharging elements N1 and N2.

As a specific example, a change from a state (initial state) where the output terminals W1 and W2 respectively have a potential VDD3, (which is a High potential) and a potential VSS, (which is a Low potential) will be considered, for example. In this state, the charging element P1 is in an on state, while the charging element P2 is in an off state. Further, the input signal IN is Low, the discharging element N1 is in an off state, and the discharging element N2 is in an on state.

Then, when the input signal IN is changed from Low to High, the discharging element N1 is turned on, and the discharging element N2 is turned off. However, the charging element P1 immediately after the change of the input signal IN from Low to High is kept in an on state. Thus, in order to change the output terminal W1 to Low (VSS) by the discharging element N1, the discharging capacity of the discharging element N1 (drain current of the NMOS transistor N1) needs to exceed the charging capability of the charging element P1 (drain current of the PMOS transistor P1).

Accordingly, in order to cause the level shift circuit in FIG. 21 to operate normally, the element size (W/L ratio) of the respective discharging elements N1 and N2 must be set to be sufficiently large, and also the element size (W/L ratio) of the respective charging elements P1 and P2 must be set to be sufficiently small so that the discharging capability exceeds the charging capability. That is, the size of each of discharging elements in the level shift circuit in FIG. 21 is increased and the area of the level shift circuit is increased. Especially when operated at low voltage of the input signal IN, the discharging capability of the discharging elements N1 and N2 is relatively reduced. Thus, the circuit area will further increase.

Further, it becomes difficult to set a transistor size so that the discharging capability of the respective devices N1 and N2 sufficiently exceeds the charging capability of the respective charging elements P1 and P2.

When W/L ratios of the discharging elements N1 and N2 are increased, a level shift operation is slowed down due to an increase in parasitic capacitances. Thus, a period where the discharging element N1 and the charging element P1 are simultaneously in an on state or a period where the discharging element N2 and the charging element P2 are simultaneously in an on state is prolonged. Thus, there also arises a problem that a short circuit current that flows transiently increases, so that power dissipation increases.

FIG. 22 is a diagram showing a configuration shown in Patent Document 1. Referring to FIG. 22, the level shift circuit in Patent Document 1 includes P-channel MOS transistors P51 and P52, P-channel MOS transistors P3 and P4, P-channel MOS transistors P1 and P2, and N-channel MOS transistors N1 and N2. The P-channel MOS transistors P51 and P52 have sources connected to a power supply terminal VDD3 and have drains connected to nodes W3 and W4, respectively. The P-channel MOS transistors P3 and P4 have sources connected to the power supply terminal VDD3 and drains connected to the nodes W3 and W4, respectively. The P-channel MOS transistors P1 and P2 have sources connected to the nodes W3 and W4, respectively, and drains connected to nodes W1 and W2, respectively, and gates cross-connected to the nodes W2 and W1, respectively. The N-channel MOS transistors N1 and N2 have sources connected to a power supply terminal VSS, drains connected to the nodes W1 and W2, respectively, and gates connected to an input terminal IN and an output of an inverter INV0 that inverts a signal from the input terminal IN. To gates of the P-channel MOS transistors P3 and P52, a signal obtained by inverting a signal at the node W2 by the inverter INV1 is supplied. To gates of the P-channel MOS transistors P4 and P51, a signal obtained by inverting an output of the inverter INV1 by an inverter INV2 is supplied. An output of the inverter INV2 is connected to an output terminal OUT. When the P-channel MOS transistors P51 and P52 are set to high-resistance transistors, and when one of control terminals of the discharging elements N1 and N2 is changed from a Low level of a low amplitude to a High level of the low amplitude, the level shift circuit in Patent Document 1 aims to readily reduce a voltage at the output node (W1 or W2), thereby achieving a high-speed level shift operation and suppressing a short circuit current.

As an initial state, for example, consider a state where the input signal IN is at a Low level of a low amplitude, the discharging elements N1 and N2 are turned off and on, respectively, the charging elements P1 and P2 are turned on and off, respectively, the nodes W1 and W2 are respectively at a High level and a Low level of a high amplitude, the P-channel MOS transistors P3 and P52 that receive the inverted-phase signal of the output signal of the output node W2 via the inverter INV1 are turned off, and the P-channel MOS transistors P4 and P51 that receive the in-phase signal of the output signal of the output node W2 via the inverter INV2 are turned on. In this case, the output node W1 is kept at the High level of the high amplitude by weak charging capability of the P-channel MOS transistor P51 that constitutes a high-resistance transistor.

Next, a time when the input signal IN is changed from Low to High from the initial state will be considered. At this time point, the discharging elements N1 and N2 are turned on and off, respectively, and the output node W1 is discharged from the High level to the Low level of the high amplitude by the discharging element N1.

Discharging capability of the discharging element N1 immediately after the discharging element N1 has been turned on must exceed charging capability of the charging element P1. In this case, the charging capability of the charging element P1 is determined by the high-resistance transistor P51. Thus, the discharging element N1 may change the output node W1 to a Low level comparatively readily.

The charging element P2 is turned on by the change of the output node W1 to a Low level. The output node W2 is thereby changed to a High level. In this case, charging capability of the charging element P2 is determined by charging capability of the P-channel MOS transistor P4. The charging element P2 may readily change the output node W2 to a High level.

When the output node W2 goes to a High level, the P-channel MOS transistors P3 and P52 of which gates are connected to the output of the inverter INV1 are both turned on, and the P-channel MOS transistors P4 and P51 of which the gates are connected to the output of the inverter INV2 are both turned off. With this arrangement, the output node W2 that has been changed to a High level of the high amplitude is kept at the High level by weak charging capability of the P-channel MOS transistor P52 that constitutes the high-resistance transistor.

[Patent Document 1] JP Patent Kokai Publication No. JP-P-2001-298356A

SUMMARY OF THE DISCLOSURE

The following is a result of analysis by the inventor of the present invention.

In the level shift circuit shown in FIG. 22, the element size of the respective discharging elements N1 and N2 may be set such that the discharging capability of the respective discharging elements N1 and N2 exceeds the charging capability of the respective high-resistance transistors P51 and P52. Further, the charging capability of the respective charging elements P1 and P2 may also be set to be equal to or higher than the charging capability of the respective high-resistance transistor P51 and P52.

The number of elements in the level shift circuit in FIG. 22 becomes larger than in the level shift circuit in FIG. 21. However, the transistor size of each of elements in the level shift circuit in FIG. 22 is comparatively small, and the area of the overall level shift circuit is saved. Further, the level shift circuit in FIG. 22 may perform a speedy operation, and may achieve lower power consumption because a transient current is suppressed.

However, when resistance values of the high-resistance transistors P51 and P52 are too low in the level shift circuit in FIG. 22, a short circuit current flows from a high-potential power supply to a low-potential power supply at a time of a level shift operation. The operation is thereby slowed down.

On the other hand, when resistance values of the high-resistance transistors P51 and P52 are too high, the charging capability of the respective high-resistance transistors P51 and P52 is extremely reduced. A potential at the output node to be maintained at the High level of the high amplitude tends to be unstable (which means that reliability of the circuit is low).

Especially when a same state continues for a long period, the output node held at the High level of the high voltage (VDD3) changes to a Low level due to ambient noise or the like. A malfunction or the short circuit current may be thereby brought about.

As the power supply voltage VDD3 assumes a higher potential, the resistance values of the high-resistance transistors P51 and P52 are reduced. For this reason, in order to maintain the resistance values of the high-resistance transistors P51 and P52, the channel length size of the respective high-resistance transistors P51 and P52 must be sufficiently increased. As a result, there arises a problem that the area of the level shift circuit increases.

It is an object of the present invention to provide a level shift circuit that converts a low-amplitude input signal to a high-amplitude signal at high speed.

Another object of the present invention is to provide a multiple output driver that needs a lot of level shift circuits but can achieve lower power dissipation, area saving, and low cost while implementing a higher-speed operation, and a display system including the driver.

The invention disclosed in this application is generally configured as follows.

According to one aspect of the present invention, there is provided a level shift circuit including:

a first level shifter connected between a first power supply terminal that supplies a first voltage and first and second output terminals, the first level shifter receiving first and second input signals from the first and second input terminals, respectively, and setting one of the first and second output terminals to the level of the first voltage (first voltage level), based on the first and second input signals;

a second level shifter connected between a second power supply terminal that supplies a second voltage and the first and second output terminals, the second level shifter setting the other of the first and second terminals to the level of the second voltage (second voltage level), while the one output terminal being set to the first voltage level; and a circuit for receiving a first control signal and performing control to disconnect a current path between the second power supply terminal and one of the first and second output terminals that is driven to the second voltage level at a time point when the first and second input signals are supplied to the first and second input terminals, for a first time interval including the time point when the first and second input signals are supplied to the first and second input terminals, and to cancel the disconnection of the current path between the one of the output terminals and the second power supply terminal for a second time interval after the first time interval. Output amplitudes at the first and second output terminals are set to be larger than amplitudes of the first and second input signals.

In the level shift circuit according to the present invention, the first and second input signals are supplied to the first and second input terminals in a predetermined cycle; the first time interval includes periods before and after the time point when the first and second input signals are supplied to the first and second input terminals, and a sum of the first and second time intervals is set to be the same as a period of the single cycle (a period of each of the first and second input signals).

The level shift circuit according to the present invention may include: a latch unit that receives respective voltages at the first and second output terminals, has a latch operation of the voltage at each of the first and second output terminals controlled therein, based on the first control signal, and outputs second and third control signals as output signals thereof. The second level shifter may include: a first switch unit that performs control to disconnect current paths between the second power supply terminal and the respective first and second output terminals for the first time interval and then cancel the disconnection for the second time interval, based on the first control signal; and a second switch unit that performs control to disconnect, for the first time interval, the current path between the second power supply terminal and the one of the first and second output terminals that assumes the second voltage level at a time of a start of the first time interval and to cancel the disconnection of the current path between the second power supply terminal and the one of the output terminals for the second time interval, based on the second and third control signals.

In the level shift circuit according to the present invention, the first switch unit includes first and second switches that are inserted in the current paths between the second power supply terminal and the respective first and second output terminals, respectively, and are controlled to be commonly turned on or off, responsive to the first control signal. The second switch unit includes: a third switch that is inserted in the current path between the first output terminal and the second power supply terminal in parallel with the first switch, and is controlled to be turned on or off responsive to the second control signal; and a fourth switch that is inserted in the current path between the second output terminal and the second power supply terminal in parallel with the second switch, and is controlled to be turned on or off responsive to the third control signal.

In the level shift circuit according to the present invention, the latch unit, for the first time interval, may stops receiving the voltage at each of the first and second output terminals, based on the first control signal, and may output signals obtained by latching voltage levels at the first and second output terminals at a time of a start of the first time interval as the second and third control signals, respectively, and for the second time interval, may operate in a through mode, thereby outputting signals based on the voltage levels at the first and second output terminals as the second and third control signals, respectively.

In the level shift circuit according to the present invention, the second level shifter may include: first and second transistors with first terminals thereof connected to the first and second output terminals, respectively, the first and second transistors performing a level shift operation to the second voltage level. The first and third switches may be connected between a second terminal of the first transistor and the second power supply terminal in parallel with each other. The second and fourth switches may be connected between a second terminal of the second transistor and the second power supply terminal in parallel with each other.

In the level shift circuit according to the present invention, the second level shifter may include first and second transistors with first terminals thereof connected to the second power supply terminal, the first and second transistors performing a level shift operation to the second voltage level;

the first and third switches may be connected between a second terminal of the first transistor and the first output terminal in parallel; and the second and fourth switches may be connected between a second terminal of the second transistor and the second output terminal in parallel.

In the level shift circuit according to the present invention, a control terminal of the first transistor is connected to the second output terminal; and a control terminal of the second transistor is connected to the first output terminal.

In the level shift circuit according to the present invention, the latch unit includes fifth and sixth switches with one ends thereof respectively connected to the first and second output terminals, and the other ends thereof respectively connected to control terminals of the third and fourth switches, the fifth and sixth switches being controlled to be turned on or off based on the first control signal and holding voltages sampled by capacitors connected to the other ends, respectively.

In the level shift circuit according to the present invention, the first level shifter includes third and fourth transistors connected between the first power supply terminal and the first and second output terminals, control terminals of the third and fourth transistors being connected to the first and second input terminals, respectively.

In the level shift circuit according to the present invention, the first level shifter includes:

a current source with one end thereof connected to the first power supply terminal; and third and fourth transistors with commonly connected first terminals thereof connected to the other end of the current source, with second terminals thereof connected to the first and second output terminals, respectively, and with control terminals thereof connected to the first and second input terminals, respectively.

In the level shift circuit according to the present invention, the latch unit may include:

fifth and sixth switches with one ends thereof connected to the first and second output terminals, respectively, and controlled to be turned on or off, responsive to the first control signal;

first and second inverters with input ends thereof connected to the other ends of the fifth and sixth switches, respectively; and third and fourth inverters with input ends thereof connected to output ends of the first and second inverters, respectively, output ends of the third and fourth inverters being connected to inputs of the first and second inverters via seventh and eighth switches controlled to be turned on or off based on a complementary signal of the first control signal. The output ends of the first and second inverters may be connected to control terminals of the fourth and third switches, respectively.

The level shift circuit according to the present invention includes:

first and second latch circuits that receive respective voltages at the first and second output terminals, and for the first time interval based on the first control signal, output signals obtained by latching voltage levels at the first and second output terminals at a time of a start of the first time interval as second and third control signals, respectively, and for the second time interval, operate in a through mode, thereby outputting signals based on the voltage levels at the first and second output terminals as the second and third control signals, respectively;

a first logic circuit that receives an output of the first latch circuit, and outputs the output of the first latch circuit as the second control signal for the first time interval, based on the first control signal; and a second logic circuit that receives an output of the second latch circuit, and outputs the output of the second latch circuit as the third control signal for the first time interval, based on the first control signal.

For the second time interval, the first and second logic circuits output signals that cancel disconnection of the current path between the first or second output terminal and the second power supply terminal in the second level shifter, as the second and third signals.

A level shift circuit according to the present invention includes:

first and second transistors that are connected between a first power supply terminal and respective first and second output terminals and receive input signals of a relatively low amplitude that are mutually complementary at control terminals thereof;

third and fourth transistors that are connected between a second power supply terminal and the respective first and second output terminals and with control terminals thereof connected to the second and first output terminals, respectively;

a latch unit that receives output signals of a relatively high amplitude that are mutually complementary, output from the first and second output terminals, and outputs second and third complementary control signals at a timing corresponding to a first control signal;

first and second switches connected between the second power supply terminal and the respective first and second output terminals in series with the third and fourth transistors, respectively, the first and second switches being commonly controlled to be turned on or off responsive to the first control signal; and third and fourth switches connected between the second power supply terminal and the respective first and second output terminals in series with the third and fourth transistors, respectively, and in parallel with the first and second switches, respectively, the third and fourth switches being controlled to be complementarily turned on or off responsive to the second and third control signals, respectively.

According to the present invention, there is provided a scan driver including:

level shift circuits each of which receives a signal of a low-amplitude signal from a corresponding stage of a shift register that transfers a transfer signal and level shifts the signal to produce a signal of a high amplitude; and buffers each of which receives an output of a corresponding one of the level shift circuits and drives a scan line of a display panel. As each of the level shift circuits, the level shift circuit according to the present invention is included.

According to the present invention, there is provided a data driver including:

level shift circuits each of which receives a signal of a low amplitude from a data latch circuit that latches digital data and level shifts the signal to produce a signal of a high amplitude;

digital-to-analog converters each of which receives a digital signal from a corresponding one of the level shift circuits and converts the received digital signal to an analog signal; and buffers each of which receives an output of a corresponding one of the digital-to-analog converters and drives a data line of a display panel. The level shift circuit according to the present invention is included as each of the level shift circuits.

According to the present invention, a display system including the scan driver described above is provided. According to the present invention, a display system including the data driver described above is provided.

According to the present invention, a delay of an output signal with respect to an input signal is scarcely generated. A low-amplitude input signal can be thereby converted to a high-amplitude signal at high speed.

Further, according to the present invention, a high-speed operation, lower power dissipation, and area saving (low cost) are implemented in a multiple output driver that needs a lot of level shift circuits and a display system including the driver.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 20A, 20B, and 20C are diagrams each showing an example of a pixel shown in FIG. 19;

PREFERRED MODES OF THE INVENTION

In order to describe the present invention in further detail, a description will be given below with reference to appended drawings. According to one aspect of the present invention, a level shift circuit (refer to FIG. 1) includes:

a first level shift circuit (10) which is connected between a first power supply terminal (E1) that supplies a first voltage (VE1) and first and second output terminals (3, 4), receives first and second input signals (vi1, vi2) from first and second input terminals (1, 2), respectively, and sets one of the first and second output terminals (3, 4) to a first voltage level (VE1), based on the first and second input signals; and a second level shift circuit (20) which is connected between a second power supply terminal (E2) that supplies a second voltage (VE2) and the first and second output terminals (3, 4) and sets the other of the first and second terminals (3, 4) to a second voltage level (VE2), relative to the one output terminal set to the first voltage level (VE1).

Then, the following control is performed, based on a first control signal (S0). That is, the control is performed which disconnects a current path in the second level shift circuit (20), between the second power supply terminal (E2) and one of the first and second output terminals (3, 4) that is set to the second voltage level (VE2) at a time point when the first and second input signals (vi1, vi2) are supplied to the first and second input terminals (1, 2), for a first time interval (T1). The first time interval (T1) includes the time point when the first and second input signals are supplied to the first and second input terminals. Then, the control is performed to cancel the disconnection of the current path between the one of the output terminals and the second power supply terminal, for a second time interval (T2) after the first time interval. Output amplitudes (VE1, VE2) at the first and second output terminals (3, 4) are set to be larger than amplitudes of the first and second input signals (VE3, VE4). According to the present invention, delay of an output signal as from an input signal is scarcely generated, and conversion to a signal with an amplitude that is several or more times higher than the amplitude of the input signal can also be performed. According to the present invention, in addition to the exemplary embodiment described above, some embodiments may be developed. A description will be given below in connection with exemplary embodiments.

Exemplary Embodiment 1

Figure 1:
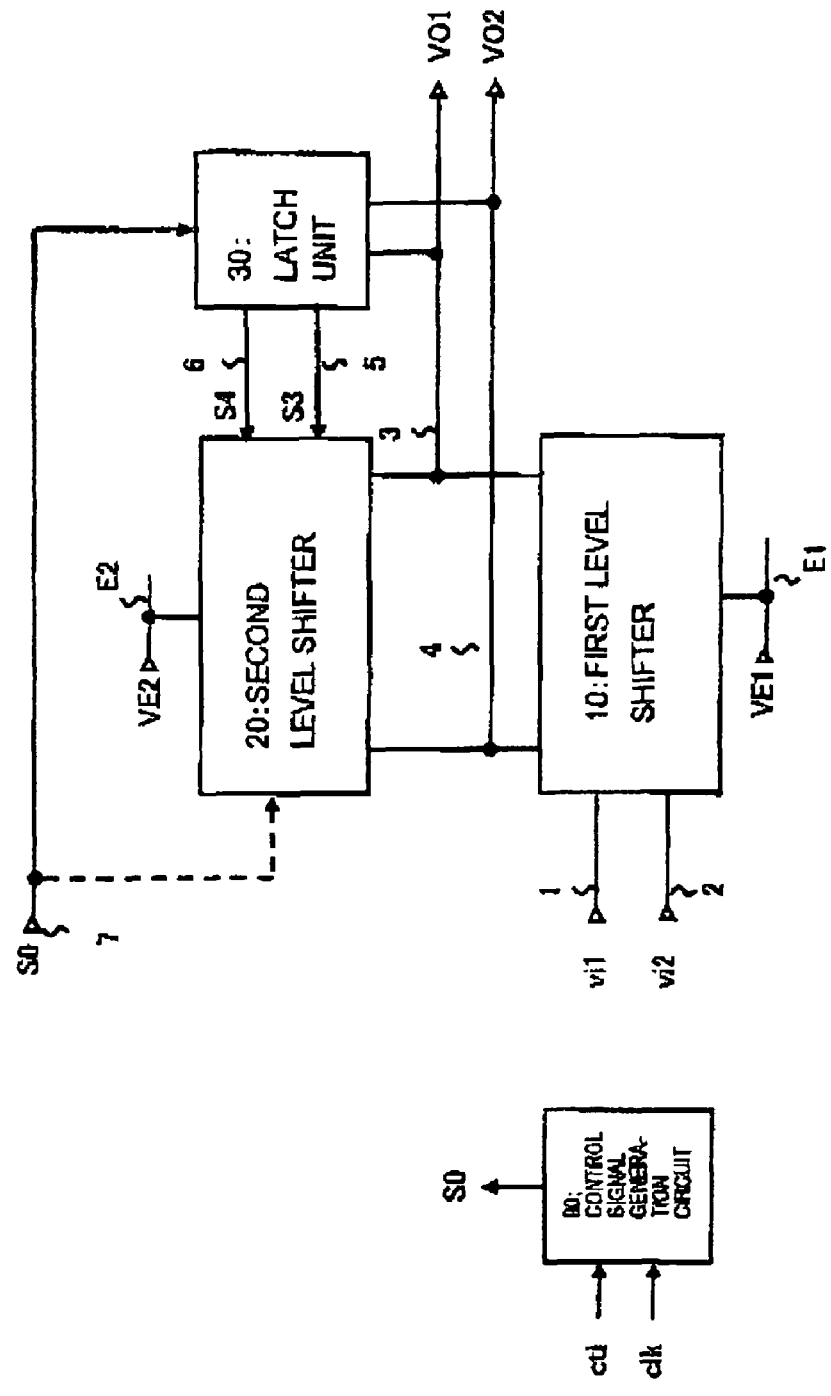
FIG. 1 is a diagram showing a configuration of an exemplary embodiment 1 of the present invention.

FIG. 1 is a diagram showing a configuration of an embodiment of a level shift circuit of the present invention. Referring to FIG. 1, this level shift circuit includes a first level shifter 10, a second level shifter 20, and a latch unit 30 (also referred to as a "feedback control unit"). Referring to FIG. 1, reference characters vi1 and vi2 indicate low-amplitude input signals, reference characters VO1 and VO2 indicate complementary high-amplitude output signals, reference characters VE1 and VE2 indicate a first voltage level of a low potential and a second voltage level of a high potential, respectively, reference character clk indicates a reference digital signal (clock) of a low amplitude, reference character ctl indicates a timing control signal of a low amplitude, and reference characters S0, S3, and S4 indicate control signals of high amplitudes, respectively.

The first level shifter 10 is connected between a first power supply terminal (E1) that supplies the first voltage level (VE1) and a first output terminal 3 and a second output terminal 4. The first level shifter 10 receives input signals (vi1 or vi2, or both of vi1 and vi2). The input signals vi1 and vi2 have amplitudes of a third voltage level VE3 and a fourth voltage level VE4. Responsive to a change in the voltage levels of the input signals, the first level shifter 10 drives one of the first output terminal 3 and the second output terminal 4 to the first voltage level (VE1). The second level shifter 20 is connected between a second power supply terminal (E2) that supplies the second voltage level (VE2) and the first output terminal 3 and the second output terminal 4. In response to the operation of the first level shifter 10, the second level shifter 20 drives the other of the first output terminal 3 and the second output terminal 4 to the second voltage level (VE2).

A control signal generation circuit 90 receives the reference digital signal (clock signal) and a timing control signal (ctl) each of which is a binary signal of the low amplitude. In order to control a first time interval (T1) (also referred to as a "first control period") including a first time that is a timing where the voltage levels of the input signals (vi1, vi2) change and a second time interval (T2) (also referred to as a "second control period") including a second time when the voltage levels of the input signals (vi1, vi2) are in a stable state, the control signal generation circuit 90 generates and outputs the first control signal S0. The first control signal S0 has high-amplitude first and second voltage levels (VE1 and VE2).

Though no particular limitation is imposed, the clock signal clk defines a cycle (data cycle) of the input signals (data signals) to be supplied to terminals 1 and 2. Though no particular limitation is imposed on the present invention, the control signal generation circuit 90 generates a one-shot pulse that goes High at a timing earlier than a rising edge of the clock signal clk that defines a start timing of a data cycle by a predetermined time, and goes Low after a change point (a change timing) of the input signals (vi1, vi2), for example. Then, the control signal generation circuit 90 outputs this pulse as the first control signal S0. That is, the pulse of the first control signal S0 rises earlier than a start time point of the data cycle (time point when the input signals (vi1, vi2) are therefore supplied to the terminals 1 and 2) by the predetermined time.

The rise time point and the fall time point of the High pulse of the high-amplitude first control signal S0 from the control signal generation circuit 90 define the first time interval (T1).

The second time interval T2 is set from a completion time point of the first time interval T1 to the start of the subsequent first time interval. A period where the first control signal S0 is Low defines the second time interval T2.

The control signal generation circuit 90 may define a start timing (strobe position) and the width of the pulse of the first control signal S0, based on the timing control signal ctl to be received. Timing control over the first control signal S0 in the control signal generation circuit 90 is implemented by arbitrary delay control and an arbitrary pulse generation technique.

The third and fourth voltage levels (VE3 and VE4) that define the lower and upper limits of the amplitudes of the low-amplitude input signals (vi1, vi2) are set between the first and second voltage levels. Then, a difference potential between the third and fourth voltage levels (VE3 and VE4) is set to be smaller than a difference potential of the first and second voltage levels (VE1 and VE2).

In the first time interval (T1), the second level shifter 20 disconnects a current path between one of the first output terminal 3 and the second output terminal 4 which is at the second voltage level (VE2) at a start timing of the first time interval (T1) and the second power supply terminal (E2), according to values of the first control signal (S0) output from the control signal generation circuit 90 and the high-amplitude second control signal S3 and the high-amplitude control signal S4 from the latch unit 30.

In the second time interval (T2) that follows the first time interval (T1), the second level shifter 20 brings the current path between the one of the first output terminal 3 and the second output terminal 4 and the second power supply terminal (E2) that has been disconnected in the first time interval (T1) back to a conductable state, in accordance with values of the first control signal (S0) output from the control signal generation circuit 90 and the second control signal S3 and the control signal S4 from the latch unit 30.

The latch unit 30 (feedback control unit) controls the second level shifter 20 in accordance with the value of the first control signal (S0) output from the control signal generation circuit 90. More specifically, the latch unit 30 receives the first and second output signals (VO1, VO2) output from the first output terminal 3 and the second output terminal 4, respectively, and the first control signal (S0) output from the control signal generation circuit 90. Then, in the first time interval (T1), the latch circuit 30 supplies to the second level shifter (20) the high-amplitude output signals (VO1, VO2) latched at the start time of the first time interval (T1) as the second and third control signals (S3, S4), respectively, based on the value of the first control signal (S0). Based on the high-amplitude second and third control signals (S3, S4) from the latch unit 30, the second level shifter 20 disconnects the current path between the second power supply terminal (E2) and the one of the output terminals 3 and 4 that is at the second voltage level (VE2) at the start of the first time interval (T1).

In the second time interval (T2), the latch operation of the latch unit (30) is canceled (to output the input signal in a through mode). The level shifter 20 brings the output terminal for which the current path with the second power supply terminal (E2) has been disconnected in the first time interval (T1) back to the conductable state.

In this embodiment, cancellation of the disconnection of the current path between the output terminal and the second power supply terminal (E2) in the first time interval (T1) is performed by the second level shifter 20, based on the first control signal (S0) and the second and third control signals (S3, S4) output from the latch unit 30. The present invention, however, is not limited to such a configuration. The second level shifter 20 may control the disconnection and cancellation of the disconnection based on the first control signal (S0) without using the second and third control signals (S3 and S4) from the latch unit (30), for example. Alternatively, as will be described later as another embodiment, the second level shifter 20 may control the disconnection and cancellation of the disconnection of the current path between the second power supply terminal (E2) and the first output terminal 3 or the second output terminal 4, using the second and third control signals (S3, S4) from the latch unit (30) without using the first control signal (S0).

In this embodiment shown in FIG. 1 as well, when the amplitudes of the input signals (vi1, vi2) are reduced, current driving capability (capability of discharging the output terminal) of the first level shifter (10) that drives one of the first output terminal 3 and the second output terminal 4 to the first voltage level (VE1) is weakened, as in the related art (in FIG. 21) described above.

However, in this embodiment, the second level shifter 20 disconnects the current path between the one of the first output terminal 3 and the second terminal 4 that is at the second voltage level (VE2) and the second power supply terminal (E2) in the first time interval (T1). For this reason, the first level shifter 10 can quickly change the one of the first output terminal 3 and the second terminal 4 that is at the second voltage level (VE2) to the first voltage level (VE1). In this case, the other of the first output terminal 3 and the second terminal 4 is driven and charged by the second level shifter 20, and is changed from the first voltage level (VE1) to the second voltage level (VE2). An operation (charge driving capability) of the second level shifter 20 is stronger than an operation (discharge driving capability) of the first level shifter 10. Thus, the change from the first voltage level (VE1) to the second voltage level (VE2) is readily made. That is, as described above, the maximum absolute value of the source-to-gate voltage of each charging element (P-channel MOS transistor) (not shown) that constitutes the second level shifter 20 is set to |VE1−VE2|. This absolute value is set to be larger than the maximum value VE4−VE3 of the source-to-gate voltage of each discharging element (N-channel MOS transistor) (not shown) that constitutes the first level shifter 10. Thus, the charging capability of the charging element of the second level shifter 20 is larger than the discharging capability of the discharging element of the first level shifter 10.

When one of the first output terminal 3 and the second terminal 4 is driven to the first voltage level (VE1) in this embodiment, the current path between the one of the output terminals and the second power supply terminal (E2) is disconnected. Then, the other of the output terminals is driven to the second voltage level (VE2), and a current path between the other of the output terminals and the first power supply terminal (E1) is disconnected. Thus, no short circuit current flows between the first power supply terminal (E1) and the second power supply terminal (E2). For this reason, lower power dissipation can be achieved.

Further, in this embodiment, a high-speed operation where a change in voltage levels of the output signal VO1 of the first output terminal 3 and the output signal VO2 of the second output terminal 4 is scarcely delayed from the change of the voltage levels of the input signals vi1 and vi2 can be implemented.

The reason for this is as follows. In this embodiment, the current path between the second power supply terminal (E2) and the one of the first output terminal 3 and the second output terminal 4 that is at the second voltage level (VE2) is disconnected before the time point of the change in the voltage levels of the input signals vi1 and vi2 by a predetermined time. Then, in response to the change in the voltage levels of the input signals vi1 and vi2, the output terminal for which the current path connected to the second power supply terminal (E2) is disconnected should be changed from the second voltage level (VE2) to the first voltage level (VE1).

On the other hand, assume that the current path between the second power supply terminal (E2) and the output terminal that is at the second voltage level (VE2) immediately before the change in the voltage levels of the input signals vi1 and vi2 is disconnected at the timing of the change and then the output terminal is driven to the first voltage level (VE1). Then, a propagation delay time from transition of the input signals to transition of the output signals will increase more than in this embodiment.

In this embodiment, the respective driving capabilities of the first level shifter 10 and the second level shifter 20 are not subject to constraint with each other (driving capability of one of the level shifters does not impose constraint upon driving capability of the other of the level shifters). For this reason, in this embodiment, the size of each device that constitutes each of the level shifters can be reduced to be comparatively small. Area saving can also be performed.

The input signals vi1 and vi2 that are respectively supplied to the first level shifter 10 through the terminals 1 and 2 may be supplied as two input signals having phases that are opposite to each other.

Further, in the first level shifter 10, the current path between the first power supply terminal (E1) and one of the first output terminal 3 and the second output terminal 4 that is at the first voltage level (VE1) may be disconnected according to a potential difference between the input signal vi1 at the terminal 1 and the input signal vi2 at the terminal 2. In this case, the potential difference between the input signal vi1 at the terminal 1 and the input signal vi2 at the terminal 2 is detected. Then, when the potential of the input signal vi1 at the terminal 1 is larger than the potential of the input signal vi2 at the terminal 2, and the potential difference is equal to or higher than a predetermined value, the current path between the first output terminal 3 and the first power supply terminal (E1) is disconnected. Then, the first output terminal 3 is driven and charged to the second voltage level (VE2) through the second level shifter 20. When the potential of the input signal Vi2 through the terminal 2 is larger than the potential of the input signal vi1 through the terminal 1, and the potential difference is equal to or higher than a predetermined value, the current path between the second output terminal 4 and the first power supply terminal (E1) is disconnected. Then, the second output terminal 4 is driven and charged to the second voltage level (VE2) through the second level shifter 20. One of the first output terminal 3 and the second output terminal 4 that is at the first voltage level (VE1) before the change of the input signals is more quickly changed to the second voltage level (VE2) by the charging operation of the second level sifter 20.

When the input signal is a signal that is supplied in a predetermined cycle like the data signal, it is preferable that the first time interval (T1) be set to a short period before and after the change in the voltage levels of the input signal, and set in the same cycle as that of the data signal. This setting is performed for the following reason.

Assume that, when data of the same value is continuously supplied for a long period over a plurality of data cycles, the first time interval (T1) is set to a length (period of the plurality of data cycles) including a period when data of the same value is continuously supplied. Then, the current path between the second power supply terminal (E2) that supplies the second voltage level (VE2) and the first output terminal 3 may be disconnected for the long period (period of the plurality of data cycles) though the first output terminal 3 should be held at the second voltage level (VE2), for example. In this case, the voltage level of the first output terminal 3 disconnected from the second power supply terminal (E2) (which should be held at the second voltage level and therefore is disconnected from the first power supply terminal (E1)) may vary under the influence of noise or an ambient signal, and may malfunction.

Accordingly, the first time interval (T1) is set to the short period before and after the change in the voltage levels of the input signals. Further, preferably, the first time interval (T1) is set at the same period as that of the data signals (namely, for each data cycle).

In this embodiment, the first time interval (T1) is set to include at the beginning of a data period (period of each data signal). Then, in the second time interval (T2) that follows the first time interval (T1), the disconnection of the current path in the second level shifter 20 between the output terminal and the second power supply terminal (E2) is canceled, and the output terminal disconnected from the second power supply terminal (E2) is brought into a conduction state or the conductable state.

With this arrangement, even when the data of the same value is continuously supplied over the plurality of data cycles, each output terminal can be connected to the power supply that supplies the same voltage level as the voltage level held at the first output terminal 3 or the second output terminal 4 in the second time interval T2. Thus, the output terminal can stably hold the voltage level that should be originally held. As a result, reliability of a circuit operation can be secured.

In the embodiment shown in FIG. 1, it may be so arranged that the second level shifter 20 does not receive the first control signal S0 and controls disconnection and cancellation of the disconnection of the current path between the output terminal and the second power supply terminal E2 based on the second control signal S3 and the third controls signal S4 from the latch unit 30 (which will be described later with reference to FIG. 14). In view of such a variation, FIG. 1 shows the first control signal S0 between a terminal 7 and the second level shifter 20 by a broken line. However, even in a configuration where the first control signal S0 is not supplied to the second level shifter 20, the latch unit 30 controls the second control signal S3 and the third control signal S4, based on the first control signal S0. Then, the latch unit 30 controls the disconnection and cancellation of the disconnection of the current path between the output terminal and the second power supply terminal E2, based on the first control signal S0.

Figure 2:
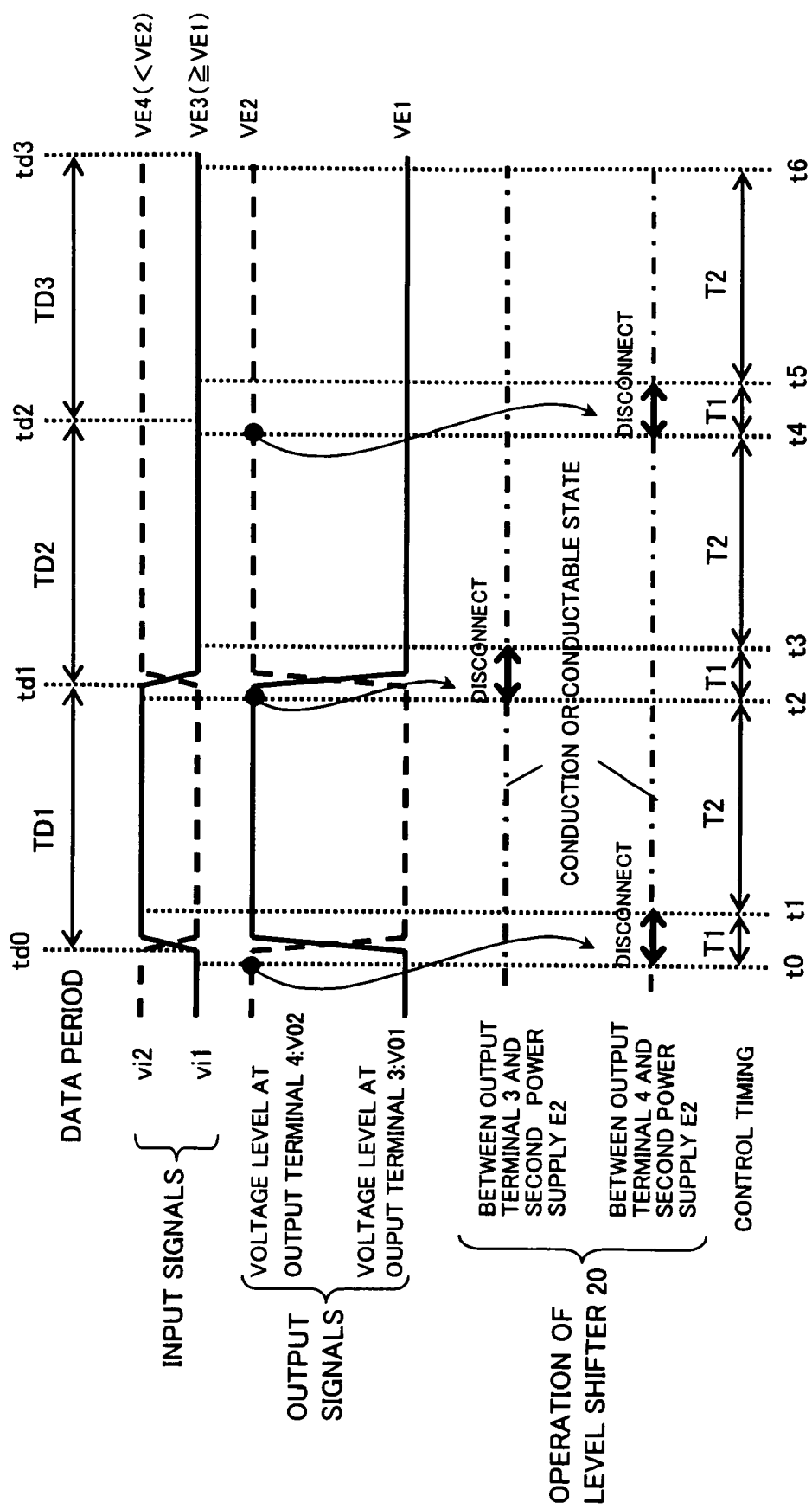
FIG. 2 is a diagram showing a timing operation example of an exemplary embodiment 1 of the present invention.

FIG. 2 is a timing waveform diagram showing an operation example of the level shift circuit in this embodiment shown in FIG. 1. FIG. 2 shows the example where the input signals are supplied at the period of the data signal. FIG. 2 schematically illustrates voltage waveforms of a voltage vi1 (indicated by a solid line) at the terminal 1, a voltage vi2 (indicated by a broken line) at the terminal 2, a voltage VO1 (indicated by a solid line) at the first output terminal 3, and a voltage VO2 (indicated by a broken line) at the second output terminal 4, presence or absence of the disconnection between the output terminal 3 and the second power supply terminal (E2) and the disconnection between the output terminal 4 and the second power supply terminal (E2), control timings in the first time intervals (T1) and the second time intervals (T2), and timing relationships in the data periods, shown in FIG. 1. A voltage level relationship is set to VE2>VE4>VE3≧VE1, in which the voltage level VE2 is a high potential and the voltage level VE1 is a low potential. The amplitudes of the input signals vi1 and vi2 are defined by the voltage levels VE3 and VE4. Amplitudes of the output signals VO1 and VO2 are defined by the voltage levels VE2 and VE1.

Referring to FIG. 2, in successive three data periods TD1, TD2, and TD3, the input signal vi1 is set to be at a High level (VE4) in the period TD1, and is set to be at a Low level (VE3) in the periods TD2 and TD3.

The input signal vi2 is set to be the inverted (reverse) phase signal of the input signal vi1. Timings in the two periods T1 and T2 controlled by the first control signal S0, second control signal S3, and third control signal S4 are shown as the control timings.

The first time interval T1 is set to a period from t0 to t1 including a start time td0 of the data period TD1 of the input signals, a period from t2 to t3 including a start time td1 of the data period TD2, and a period from t4 to t5 including a start time td2 of the data period TD3.

The second time interval T2 is set to a period from t1 to t2, a period from t3 to t4, and a period from the t5 to t6, in which each of the voltage levels of the input signals is maintained constant at a Low level or the High level.

When the first time interval T1 and the second time interval T2 that follows the first time interval T1 are set to one cycle, the one cycle (=T1+T2) of the control timings is set to be the same period of the data period.

At a time t0 in an initial state, the input signals vi1 and vi2 are respectively set to a Low level (VE3) of a low amplitude and the High level (VE4) of the low amplitude. Then, the output signal VO1 of the first output terminal 3 and the output signal VO2 of the second output terminal 4 are respectively set to be at a Low level (VE1) of a high amplitude and the High level (VE2) of the high amplitude. At this point, the latch unit 30 detects the second output terminal 4 at the High level (VE2) at the start time t0 of the first time interval T1, and disconnects the current path in the second level shifter 20 between the second output terminal 4 and the second power supply terminal E2, according to the second control signal S3 and the third control signal S4, in the first time interval T1 (period from t0 to t1).

When the input signals vi1 and vi2 are respectively changed to High and Low at the subsequent time td0, the first level shifter 10 changes (discharges) the voltage level at the second output terminal 4 from the High level (VE2) to a Low level (VE1). In response to the operation of the first level shifter 10, the second level shifter 20 changes (charges) the voltage level at the first output terminal 3 from a Low level (VE1) to a High level (VE2).

Even when the amplitudes of the input signal vi1 and vi2 are small and the discharging capability of the first level shifter 10 is comparatively small, the second output terminal 4 and the second power supply terminal E2 are disconnected in the first time interval T1. Thus, compared with a case where the second output terminal 4 is driven and discharged with the second output terminal 4 connected to the second power supply terminal E2, the first level shifter 10 can drive the second output terminal 4 to a Low level (VE1) more quickly.

Next, at the time t1, the first time interval T1 is finished. Then, the disconnection of the current path between the second output terminal 4 and the second power supply terminal E2 in the second level shifter 20 is cancelled.

In the second time interval T2 (period from t1 to t2), the first output terminal 3 and the second output terminal 4 are stably held at the High level (VE2) of the high amplitude and a Low level (VE1) of the high amplitude, respectively.

Next, at the time t2, the latch unit 30 detects the first output terminal 3 at the High level (VE2), and disconnects the current path between the first output terminal 3 and the second power supply terminal E2 in the second level shifter 20, according to the high-amplitude second control signal S3 and the high-amplitude third control signal S4, in the first time interval T1 (period from t2 to t3).

When the input signals vi1 and vi2 are respectively changed to a Low level (VE3) of the low amplitude and the High level (VE4) of the low amplitude at the subsequent time td1, the first level shifter 10 changes (discharges) the voltage level at the first output terminal 3 from the High level (VE2) of the high amplitude to a Low level (VE1) of the high amplitude. In response to the operation of the first level shifter 10, the second level shifter 20 changes (charges) the voltage level at the second output terminal 4 from a Low level (VE1) of the high amplitude to a High level (VE2) of the high amplitude.

Even when the discharging capability of the first level shifter 10 is comparatively small, the current path between the first output terminal 3 and the second power supply terminal (E2) is disconnected in the first time interval T1 from t2 to t3. Thus, the first level shifter 10 can quickly drive the first output terminal 3 to a Low level (VE1).

At the time t3, the first time interval T1 is finished. Then, the disconnection of the current path between the first output terminal 3 and the second power supply terminal E2 in the second level shifter 20 is cancelled.

In the second time interval T2 (period from t3 to t4), the first output terminal 3 and the second output terminal 4 are stably held at a Low level (VE1) of the high amplitude and the High level (VE2) of the high amplitude, respectively.

Next, at the time t4, the latch unit 30 detects the second output terminal 4 at the High level (VE2) of the high amplitude, and disconnects the current path between the second output terminal 4 and the second power supply terminal E2 in the second level shifter 20, according to the second control signal S3 and the third control signal S4, in the first time interval T1 (period from t4 to t5).

When the input signals vi1 and vi2 are respectively kept at a Low level (VE3) of the low amplitude and the High level (VE4) of the low amplitude at the subsequent time td2, the first level shifter 10 drives the first output terminal 3 at a Low level (VE1). In this period (from t4 to t5), the current path between the second output terminal 4 and the second power supply terminal E2 in the second level shifter 20 is disconnected. The charging operation is not performed on the second output terminal 4, so that the second output terminal 4 is maintained at the High level (VE2) of the high amplitude by a parasitic capacitance.

At the time t5, the first time interval T1 is finished. Then, the disconnection between the second output terminal 4 and the power supply terminal E2 in the second level shifter 20 is cancelled.

In the second time interval T2 (period from t5 to t6), the first output terminal 3 and the second output terminal 4 are stably held at a Low level (VE1) of the high amplitude and the High level (VE2) of the high amplitude, respectively.

When data of the same value is continuously supplied over a plurality of cycles, the second output terminal 4 at the High level (VE2) of the high amplitude is held by the parasitic capacitance in the first time interval T1 (period from t4 to t5). However, in this embodiment, the first time interval T1 is short, so that there is scarcely a possibility that the logic level of the second output terminal 4 varies and the second output terminal malfunctions due to the influence of noise or the like.

Exemplary Embodiment 1-1

Figure 3:
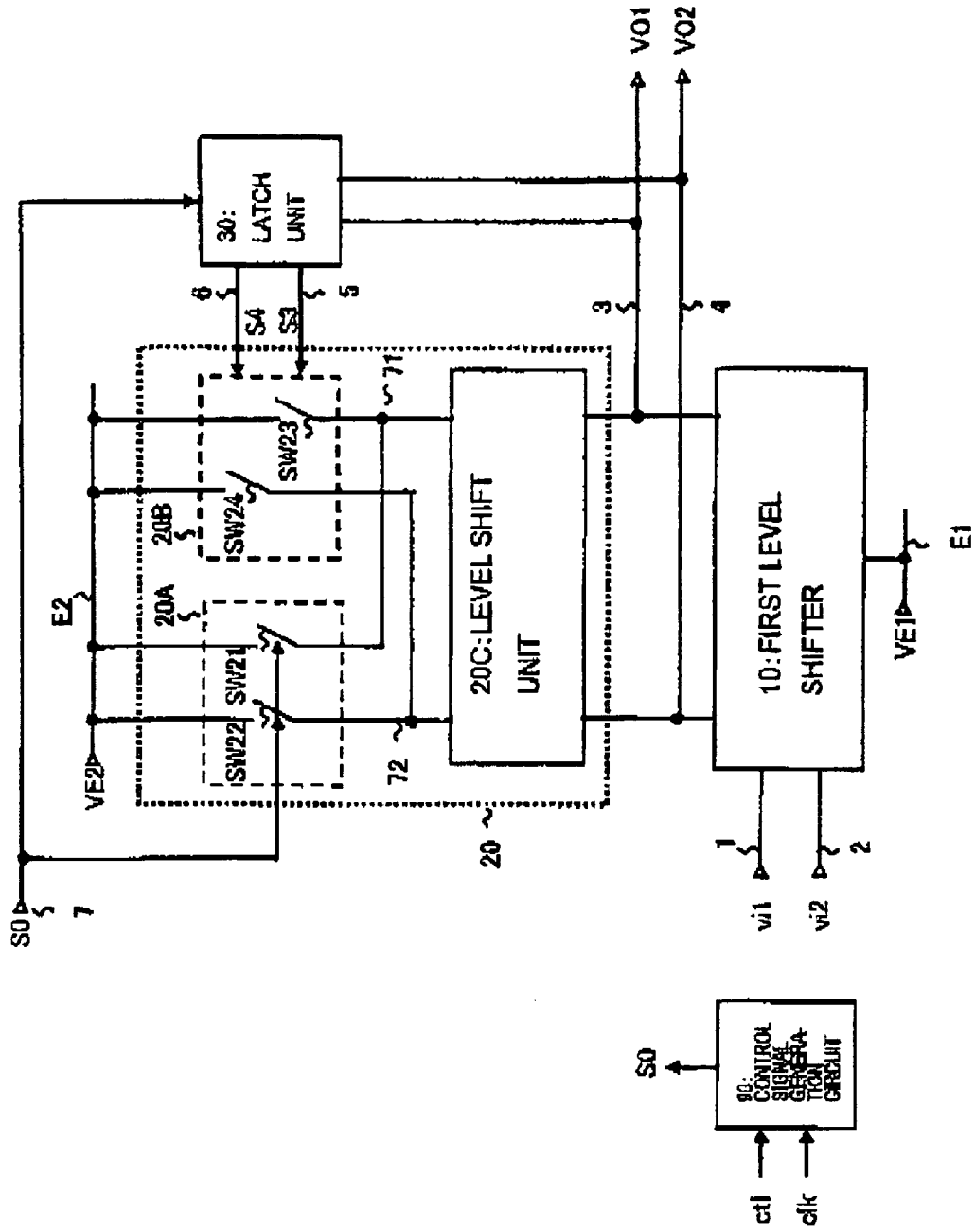
FIG. 3 is a diagram showing a configuration of an exemplary embodiment 1-1 of the present invention.

FIG. 3 is a diagram showing an example of a configuration of the level shifter 20 in FIG. 1. Referring to FIG. 3, a second level shifter 20 in this embodiment includes a first switch unit 20A (including switches SW21 and SW22), a second switch unit 20B (including switches SW23 and SW24), and a level shift unit 20C. Though no particular limitation is imposed, this level shift unit 20C may be formed of two P-channel MOS transistors with gates thereof and drains thereof cross-connected (refer to switches P1 and P2 in FIG. 21, for example).

The first switch unit 20A (including the switches SW21 and SW22) is connected between a second power supply terminal E2 and a first output terminal 3 and a second output terminal 4, being in series with the level shift unit 20C. The second switch unit 20B (including the switches SW23 and SW24) is connected between the second power supply terminal E2 and the first output terminal 3 and the second output terminal 4, being in series with the level shift unit 20C. The first switch unit 20A (including the switches SW21 and SW22) and the second switch unit 20B (including the switches SW23 and SW24) are mutually arranged in parallel between the second power supply terminal E2 and the level shift unit 20C.

More specifically, the switch SW21 in the first switch unit 20A is connected between the second power supply terminal E2 and a terminal 71 (terminal on the side of the first output terminal 3), the switch SW22 in the first switch unit 20A is connected between the second power supply terminal E2 and a terminal 72 (terminal on the side of the second output terminal 4), the switch SW23 in the second switch unit 20B is connected between the second power supply terminal E2 and the terminal 71 (terminal on the side of the first output terminal 3), and the switch SW24 in the second switch unit 20B is connected between the second power supply terminal E2 and the terminal 72 (terminal on the side of the second output terminal 4). The level shift unit 20C is provided between the terminals 71 and 72 and the terminals 3 and 4. The switches SW21 and SW22 are commonly controlled to be turned on or off, responsive to a first control signal S0 from a control signal generation circuit 90. The switches SW23 and SW24 are controlled to be turned on or off, responsive to a second control signal S3 and a third control signal S4 from a latch unit 30, respectively.

Exemplary Embodiment 1-2

Figure 4:
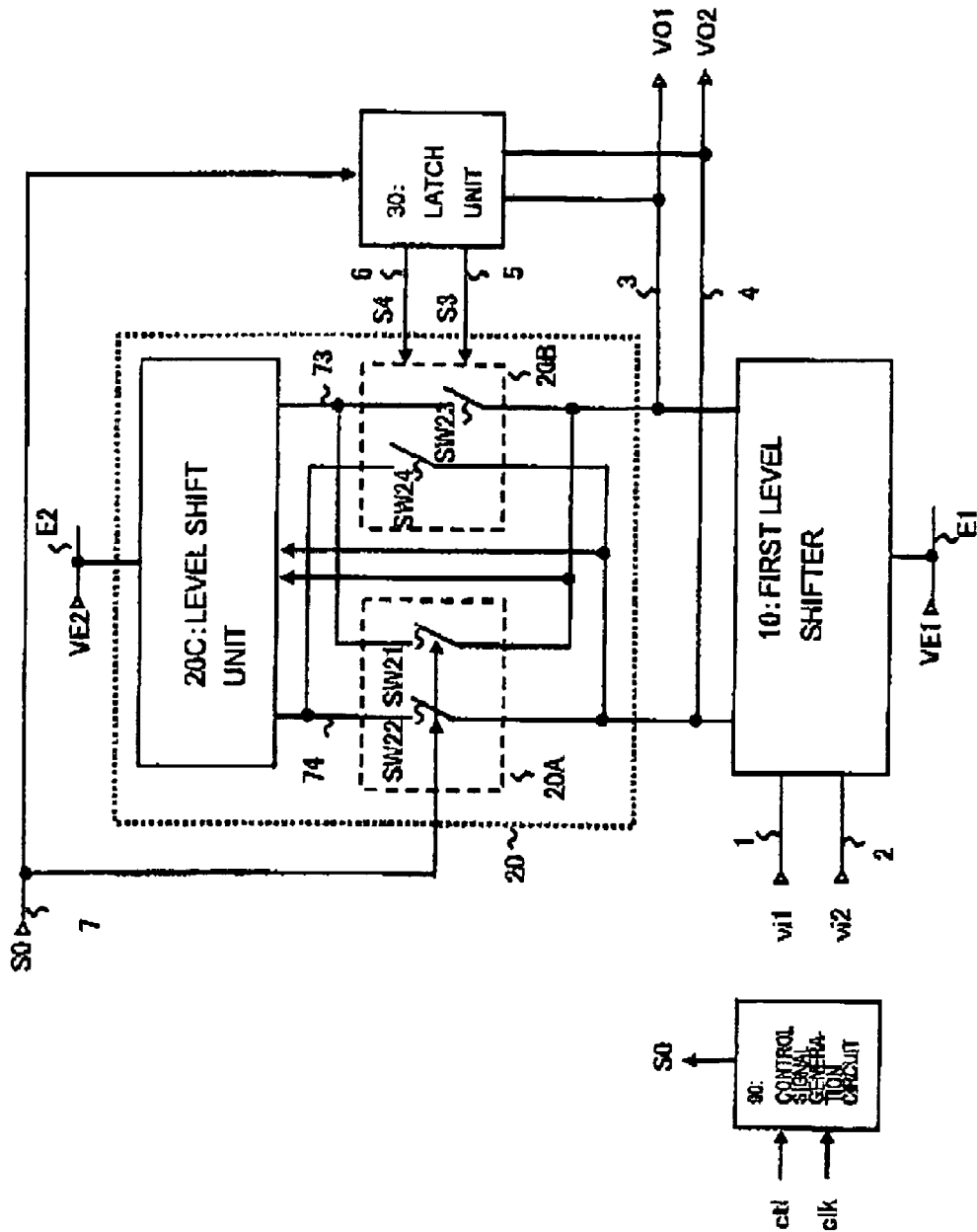
FIG. 4 is a diagram showing a configuration of an exemplary embodiment 1-2 of the present invention.

FIG. 4 is a diagram showing another configuration example of the level shifter 20 in FIG. 1. Referring to FIG. 4, a second level shifter 20 includes a first switch unit 20A (including switches SW21 and SW22), a second switch unit 20B (including switches SW23 and SW24), and a level shift unit 20C. Though no particular limitation is imposed, this level shift unit 20C may be formed of two P-channel MOS transistors with gates thereof and drain thereof cross-connected (refer to switches P1 and P2 in FIG. 21, for example).

The first switch unit 20A (including the switches SW21 and SW22) is connected between a second power supply terminal E2 and a first output terminal 3 and a second output terminal 4, being in series with the level shift unit 20C. The second switch unit 20B (including the switches SW23 and SW24) is connected between the second power supply terminal E2 and the first output terminal 3 and the second output terminal 4, being in series with the level shift unit 20C. The first switch unit 20A (including the switches SW21 and SW22) and the second switch unit 20B (including the switches SW23 and SW24) are juxtaposed between the second power supply terminal E2 and the first output terminal 3 and the second output terminal 4.

More specifically, the level shift unit 20C is provided between the second power supply terminal E2 and terminals 73 and 74, the switch SW21 in the first switch unit 20A is connected between the output supply terminal 3 and the terminal 73, the switch SW22 in the first switch unit 20A is connected between the second output terminal 4 and the terminal 74, the switch SW23 in the second switch unit 20B is connected between the first output terminal 3 and the terminal 73, and the switch SW24 in the second switch unit 20B is connected between the second output terminal 4 and the terminal 74. The switches SW21 and SW22 are commonly controlled to be turned on or off according to a first control signal S0 of a high amplitude from a control signal generation circuit 90. The switches SW23 and SW24 are controlled to be turned on or off according to a second control signal S3 and a third control signal S4 of high amplitudes from a latch unit 30, respectively.

Figure 21:
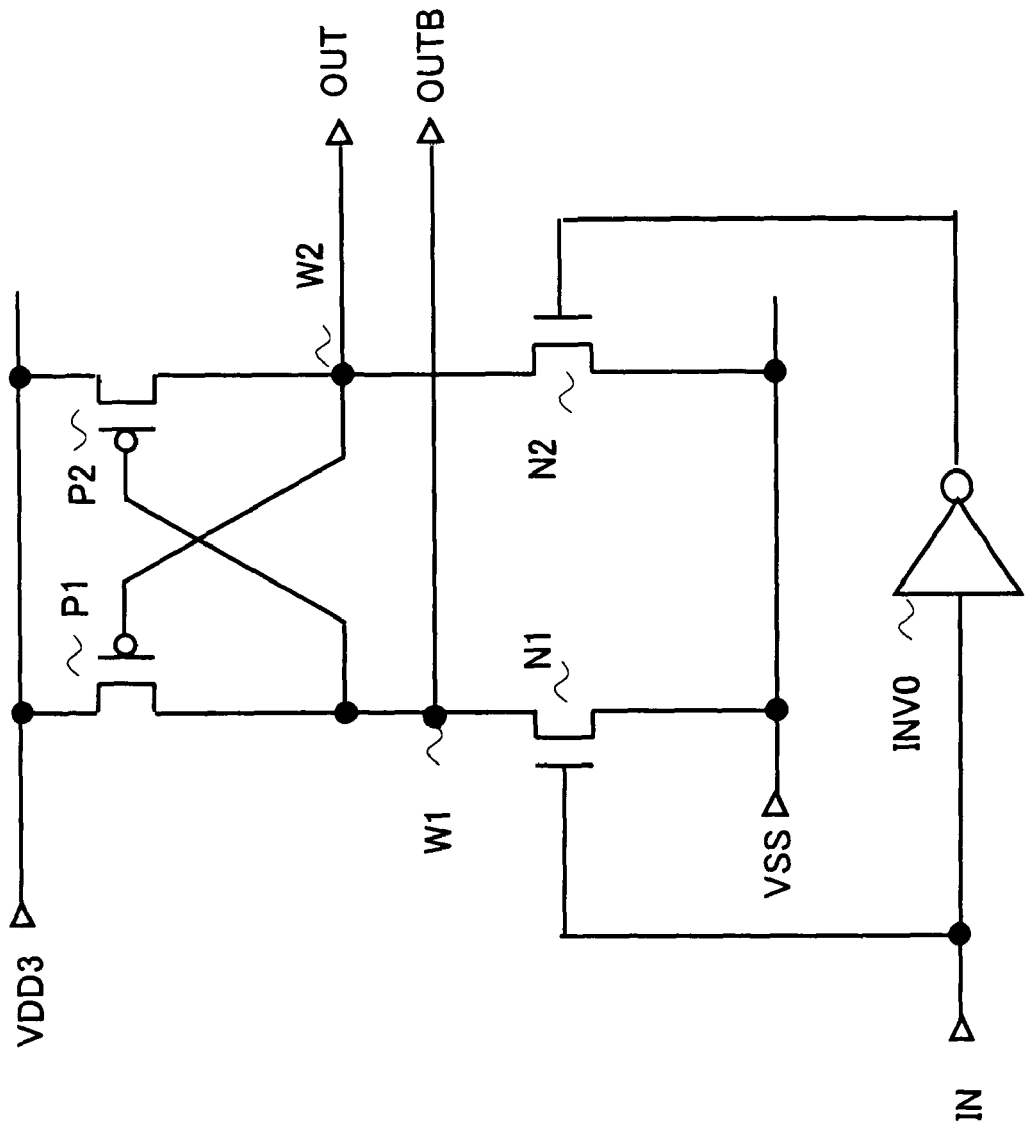
FIG. 21 is a diagram showing a configuration of a level shift circuit disclosed in Patent Document 1.
Figure 22:
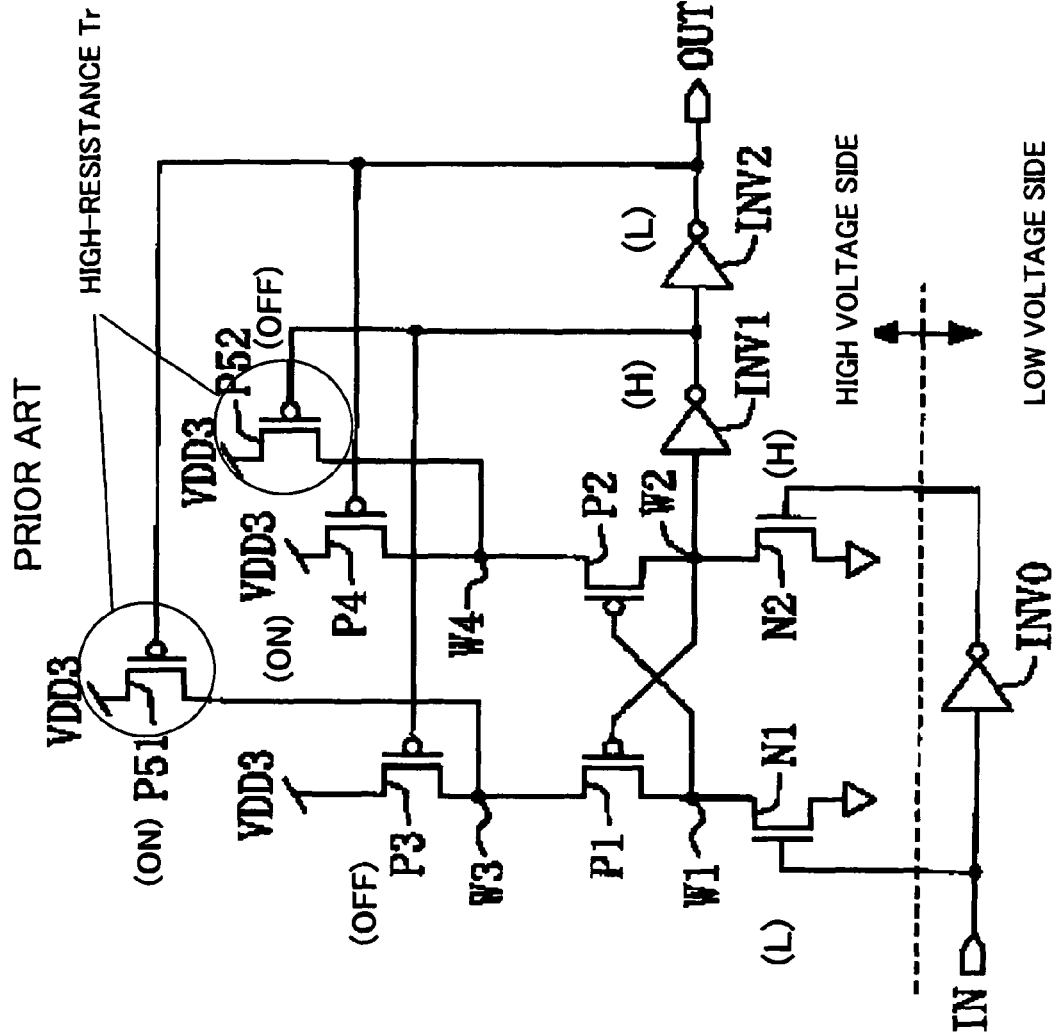
FIG. 22 is a diagram showing a configuration of a level shift circuit disclosed in Patent Document 1.

Referring to FIG. 4, the first output terminal 3 and the second output terminal 4 are received at the level shift unit 20C. This corresponds to a cross-connected configuration in which a gate of the P-channel MOS transistor P1 in FIG. 21 is connected to the first output terminal 3 and a drain of the P-channel MOS transistor P1 is connected to the second output terminal 4 via the switch SW22 and SW24, and a gate of the P-channel MOS transistor P2 in FIG. 21 is connected to the second output terminal 4 and a drain of the P-channel MOS transistor P2 is connected to the first output terminal 3 via the switch SW21 and SW23.

In the embodiments shown in FIGS. 3 and 4, control over disconnection of a current path between the second power supply terminal E2 and one of the first output terminal 3 and the second output terminal 4 in a first time interval T1 and cancellation of (or recovery from) the disconnection of the current path between the second power supply terminal E2 and the one of the first output terminal 3 and the second output terminal 4 in a second time interval T2 is performed by the first switch unit 20A and the second switch unit 20B.

That is, in the first time interval T1, the switches SW21 and SW22 in the first switch unit 20A are commonly set to be turned off responsive to the first control signal S0. Further, in the first time interval T1, the latch unit 30 latches voltage levels at the first output terminal 3 and the second output terminal 4 at a time of (or immediately before) of a start of the first time interval T1 and outputs the detected voltage levels as the second control signal S3 and the third control signal S4, respectively, based on the first control signal S0. In the switches SW23 and SW24 of the second switch unit 20B, the switch 23 or the switch 24 that corresponds to one of the control signals S3 and S4 which is at a High level is turned off based on the control signals S3 and S4 from the latch unit 30. With such switch control, the current path between the second power supply terminal E2 and the one of the first output terminal 3 and the second output terminal 4 is disconnected in the first time interval T1.

In the second time interval T2, the switches SW21 and SW22 in the first switch unit 20A are commonly set to be turned on responsive to the control signal S0. Further, in the second time interval T2, the latch operation of the latch unit 30 is cancelled according to the first control signal S0, and voltage levels at the first output terminal 3 and the second output terminal 4 are output in a through mode as the second control signal S3 and the third control signal S4, respectively. One of the switches SW23 and SW24 in the second switch unit 20B is turned on, and the other of the switches SW23 and SW24 is turned off responsive to the voltage levels at the first output terminal 3 and the second output terminal 4. With such switch control, in the second time interval T2, the disconnection of the current path between the second power supply terminal E2 and the one of the first output terminal 3 and the second output terminal 4 is cancelled (or connection of the current path is recovered). The first output terminal 3 and the second power supply terminal E2, and the second output terminal 4 and the second power supply terminal E2 are respectively brought into a conduction state or a conductable state.

Figure 5:
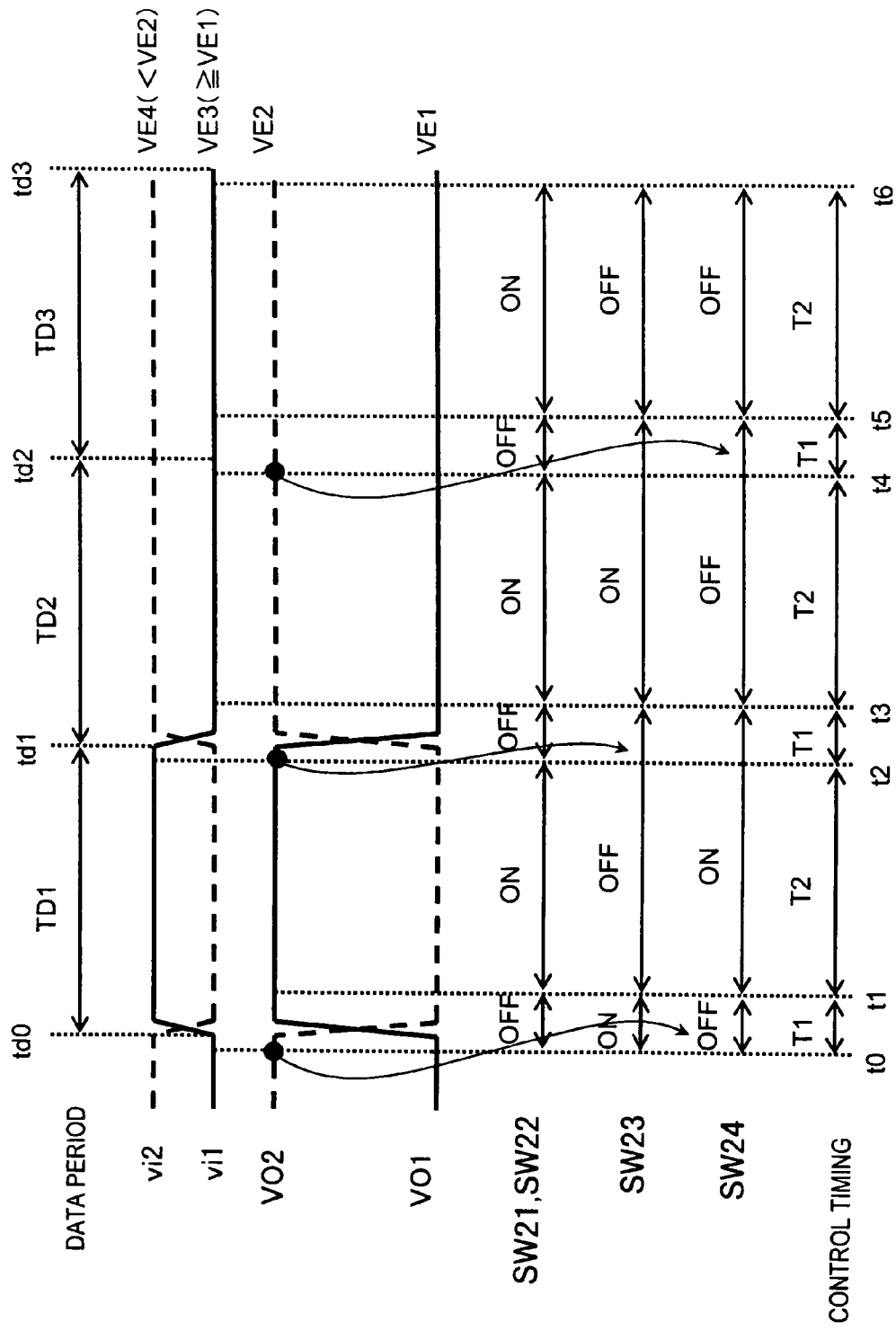
FIG. 5 is a diagram showing a timing operation example of exemplary embodiments 1-1 and 1-2 of the present invention.

FIG. 5 is a timing waveform diagram showing an operation example of each of the level shift circuits in FIGS. 3 and 4. FIG. 5 illustrates an example where input signals are supplied in a predetermined cycle of a data signal or the like. FIG. 5 illustrates voltage waveforms of a voltage vi1 (indicated by a solid line) at the terminal 1, a voltage vi2 (indicated by a broken line) at the terminal 2, a voltage VO1 (indicated by a solid line) at the output terminal 3, and a voltage VO2 (indicated by a broken line) at the output terminal 4, turning on/off of the switches SW21 and SW22 of the first switch unit 20A (which are commonly turned on or off), turning on/off of the switches 23 and SW24 in the second switch unit 20B, control timings in the first time intervals (T1) and the second time intervals (T2), and timing relationships in the data periods, shown in FIGS. 3 and 4. As in FIG. 2, a voltage level relationship is also set to VE2>VE4>VE3≧VE1, in which the voltage level VE2 is set to be at a high potential and the voltage level VE1 is set to be at a low potential. An amplitude of an input signal vi1 defined by the voltage levels VE3 and VE4 is set to be at a High level (VE4) in a data period TD1 and at a Low level (VE3) in data periods TD2 and TD3. An input signal vi2 is set to be the inverted-phase signal of the input signal vi1.

As on/off control over the switches SW21 and SW22 of the first switch unit 20A in the level shifter 20 in each of the configurations in FIGS. 3 and 4 according to the first control signal S0, the switches SW21 and SW22 are both controlled to be disconnected (turned off) in the first time interval T1, and are both controlled to conduct (be turned on) in the second time interval T2.

With respect to on/off control over the switches SW23 and SW24 of the second switch unit 20B by the second control signal S3 and the third control signal S4 from the latch unit 30, the switches SW23 and SW24 are controlled in the first time interval T1 based on the voltage levels at the first output terminal 3 and the second output terminal 4 at the time of (or immediately before) of the start of the first time interval T1, latched by the latch unit 30. In the second time interval T2, the switches SW23 and SW24 are controlled base on the voltage levels at the first output terminal 3 and the second output terminal 4 output in a through mode by the latch unit 30.

In the first time interval T1, when the voltages (VO1, VO2) of output signals of high amplitudes of the first output terminal 3 and the second output terminal 4 at the start time of the first time interval T1 are respectively (Low, High), the switch SW23 is turned on, and the switch SW24 is turned off. When the voltages (VO1, VO2) are respectively (High, Low), the switch SW23 is turned off and the switch SW24 is turned on.

When the voltages (VO1, VO2) of the output signals of high amplitudes of the first output terminal 3 and the second output terminal 4 in the second time interval T2 are respectively (Low, High), the switch SW23 is turned on, and the switch SW24 is turned off. When the voltages (VO1, VO2) are respectively (High, Low), the switch SW23 is turned off and the switch SW24 is turned on.

Referring to FIG. 5, at a time t0 (start point of the first time interval T1) in an initial state, the input signals vi1 and vi2 are respectively set to a Low level (VE3) of a low amplitude and the High level (VE4) of the low amplitude. Then, the output voltage VO1 of the first output terminal 3 and the output voltage VO2 of the second output terminal 4 are respectively set to a Low level (VE1) of a high amplitude and the High level (VE2) of the high amplitude. At this point, the latch unit 30 detects the second output terminal 4 at the High level (VE2) at the start time t0 of the first time interval T1, and disconnects the switch SW24 between the second output terminal 4 and the second power supply terminal E2, according to the second control signal S3 and the third control signal S4, in the first time interval T1 (period from t0 to t1). In the first time interval T1, the switches SW21 and SW22 are also turned off responsive to the first control signal S0. The switch SW23 is turned on responsive to the second control signal S3 and the third control signal S4 from the latch unit 30

When the input signals vi1 and vi2 are respectively changed to a High level of the low amplitude and a Low level of the low amplitude at a subsequent time td0, the first level shifter 10 changes (discharges) the voltage level VO2 at the second output terminal 4 from the High level (VE2) of the high amplitude to a Low level (VE1) of the high amplitude. In response to the operation of the first level shifter 10, the level shift unit 20C changes (charges) the voltage level VO1 at the first output terminal 3 from a Low level (VE1) of the high amplitude to a High level (VE2) of the high amplitude. Even when the amplitudes of the input signals are small and discharging capability of the first level shifter 10 is comparatively small, the current path between the second output terminal 4 and the second power supply terminal E2 is disconnected. Thus, the first level shifter 10 can quickly drive the second output terminal 4 to a Low level (VE1).

At the time t1, the first time interval T1 is finished. Then, according to the first control signal S0, the switches SW21 and SW22 are set to be turned on, and the disconnection of the current path between the second output terminal 4 and the second power supply terminal E2 is cancelled. The second power supply terminal E2 and each of the first output terminal 3 and the second output terminal 4 are brought into the conduction state or the conductable state. At this point, the switch SW24 is set to be turned on based on the control signal S4 from the latch unit 30, as a result of fall of the voltage level at the second output terminal 4 from the High level to a Low level of the high amplitude. The switch SW23 is set to be turned off based on the second control signal S3 from the latch unit 30, as a result of rise of the voltage level at the first output terminal 3 from a Low level to High level of the high amplitude.

In the second time interval T2 (period from t1 to t2), the voltage levels at the first output terminal 3 and the second output terminal 4 are stably held at the High level (VE2) of the high amplitude and a Low level (VE1) of the high amplitude, respectively.

Next, at the time t2 (start point of the subsequent first time interval T1), the latch unit 30 detects the voltage level (VO1) of the first output terminal 3 at the High level (VE2), and disconnects the switch SW23 between the first output terminal 3 and the second power supply terminal E2 in the first time interval T1 (period from t2 to t3), according to the second control signal S3 and the third control signal S4. In the first time interval T1 (period from t2 to t3), the switches SW21 and SW22 are also turned off, based on the first control signal S0, as described above.

When the input signals vi1 and vi2 are respectively changed to a Low level of the low amplitude and the High level of the low amplitude at a subsequent time td1, the first level shifter 10 changes (discharges) the voltage (VO1) at the first output terminal 3 from the High level (VE2) of the high amplitude to a Low level (VE1) of the high amplitude. In response to the operation of the first level shifter 10, the level shift unit 20C changes (charges) the voltage (VO2) at the second output terminal 4 from a Low level (VE1) of the high amplitude to a High level (VE2) of the high amplitude. Even when the discharging capability of the first level shifter 10 is comparatively small, a current path between the first output terminal 3 and the second power supply E terminal (E2) is disconnected. Thus, the first level shifter 10 can quickly drive the first output terminal 3 to a Low level (VE1).

At the time t3, the first time interval T1 is finished. Then, the switches SW21 and SW22 are set to be turned on, and the disconnection of the current path between the first output terminal 3 and the second power supply terminal E2 is cancelled, according to the first control signal S0. The second power supply terminal E2 and each of the first output terminal 3 and the second output terminal 4 are brought into the conduction state or the conductable state.

In the second time interval T2 (period from t3 to t4), the voltage VO1 at the first output terminal 3 and the voltage VO2 at the second output terminal 4 are stably held at a Low level (VE1) of the high amplitude and the High level (VE2) of the high amplitude, respectively.

Next, at the time t4 (which is the start point of the further subsequent first time interval T1), the latch unit 30 detects the voltage level (VO2) at the second output terminal 4 at the High level (VE2) of the high amplitude, and turns off the switch SW24 between the second output terminal 4 and the second power supply terminal E2, according to the second control signal S3 and the third control signal S4, in the first time interval T1 (period from t4 to t5). In the first time interval T1 (period from t4 to t5), the switches SW21 and SW22 are also turned off, responsive to the first control signal S0, as described above. The switch SW23 is turned on.

When the input signals vi1 and vi2 are respectively kept at a Low level of the low amplitude and the High level of the low amplitude at a subsequent time td2, the first level shifter 10 drives the first output terminal 3 at a Low level (VE1) of the high amplitude. At this point, the second output terminal 4 and the second power supply terminal E2 are disconnected. The charging operation on the second output terminal 4 is not therefore performed by the level shift unit 20C, so that the second output terminal 4 is maintained at the High level (VE2) of the high amplitude by a parasitic capacitance.

At the time t5, the first time interval T1 is finished. Then, the disconnection of the current path between the second output terminal 4 and the power supply terminal E2 is cancelled. The second power supply terminal E2 and each of the first output terminal 3 and the second output terminal 4 are brought into the conduction state or the conductable state.

In the second time interval T2 (period from t5 to t6), the first output terminal 3 and the second output terminal 4 are stably held at a Low level (VE1) of the high amplitude and the High level (VE2) of the high amplitude, respectively.

In the first time interval T1 (period from t4 to t5) where data of the same value is continuous with data in the immediately preceding data period in this embodiment, the second output terminal 4 at the High level (VE2) is held due to parasitic capacitance. However, the first time interval T1 is short, so that there is scarcely a possibility that the level at the second output terminal 4 varies and the second output terminal malfunctions due to the influence of noise or the like.

Exemplary Embodiment 1-3

Figure 6:
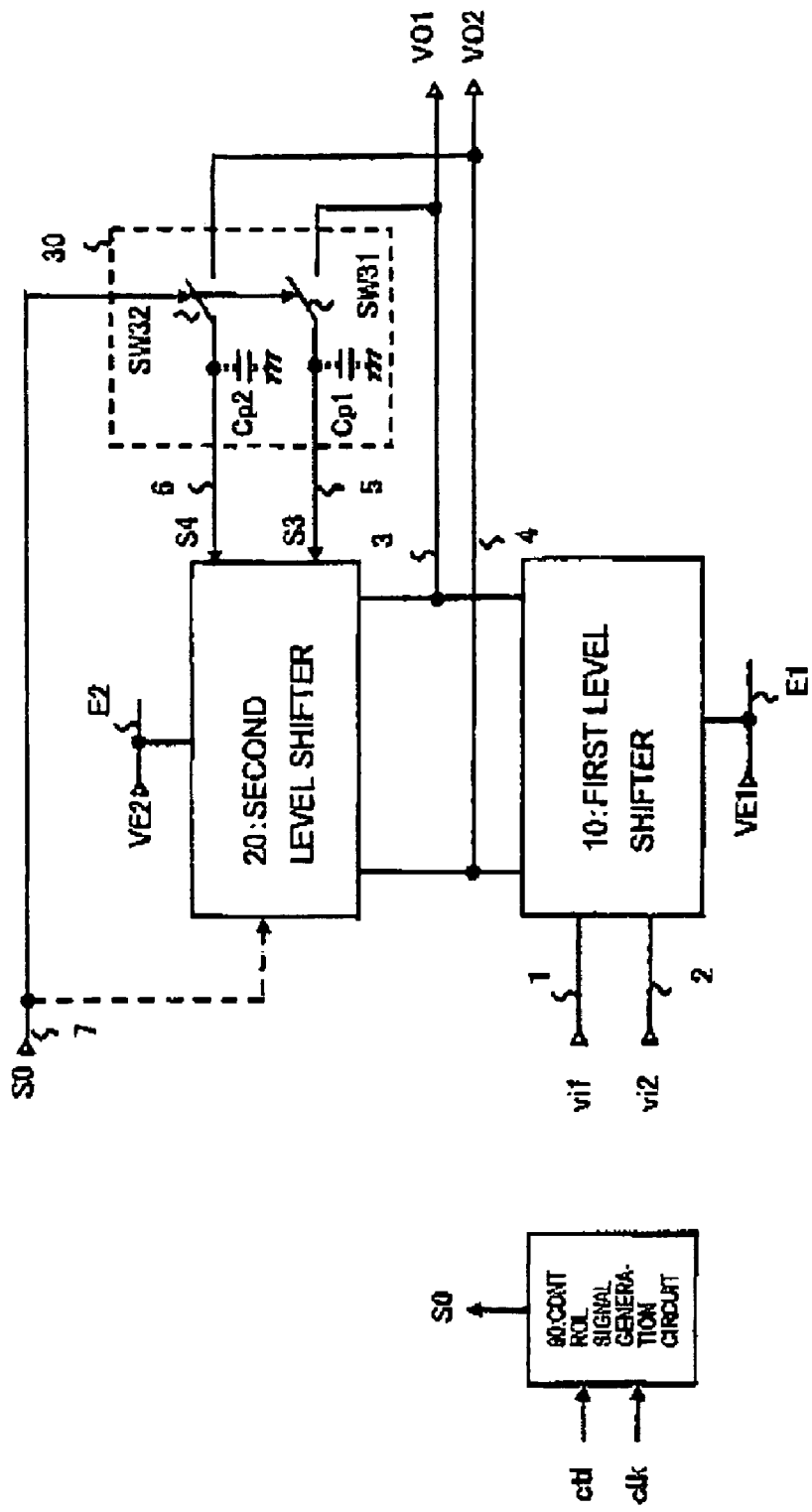
FIG. 6 is a diagram showing a configuration of an exemplary embodiment 1-3 of the present invention.

FIG. 6 is a diagram showing a configuration example of the latch unit 30 in FIG. 1. Referring to FIG. 6, the latch unit 30 includes a sample and hold circuit including a capacitance and a switch. That is, the latch unit 30 includes a switch SW31 between a first output terminal 3 and a terminal 5 and a switch SW32 between a second output terminal 4 and a terminal 6. The switches SW31 and SW32 are commonly controlled to be turned on or off. The switches SW31 and SW32 are turned off in a first time interval T1 and turned on in a second time interval T2.

In the second time interval T2 where the switches SW31 and SW32 are in an on state, the latch unit 30 outputs voltage levels at the first output terminal 3 and the second output terminal 4 to the terminals 5 and 6 in a through mode, respectively. In the first time interval T1 where the switches SW31 and SW32 are in an off state, sample values of voltages at the first output terminal 3 and the second output terminal 4 immediately before (at a start time of the first time interval T1) the switches SW31 and SW32 are turned off are output to the terminals 5 and 6, respectively. That is, at a timing when the first time interval T1 is started, an output signal voltage VO1 at the first output terminal 3 and an output signal voltage VO2 at the second output terminal 4 are respectively latched (sampled by capacitors Cp1 and Cp2, respectively), and are output to the second level shifter 20 as a high-amplitude second control signal S3 and a high-amplitude third control signal S4, respectively.

In the second time interval T2, the output signal voltage VO1 at the first output terminal 3 and the output signal voltage VO2 at the second output terminal 4 are output to the second level shifter 20 as the second control signal S3 and the third control signal S4, respectively.

Voltage levels at the terminals 5 and 6 in the first time interval T1 where the switches SW31 and SW32 are in an off state are maintained (held) by the parasitic capacitances Cp1 and Cp2, respectively.

Exemplary Embodiment 1-4

Figure 7:
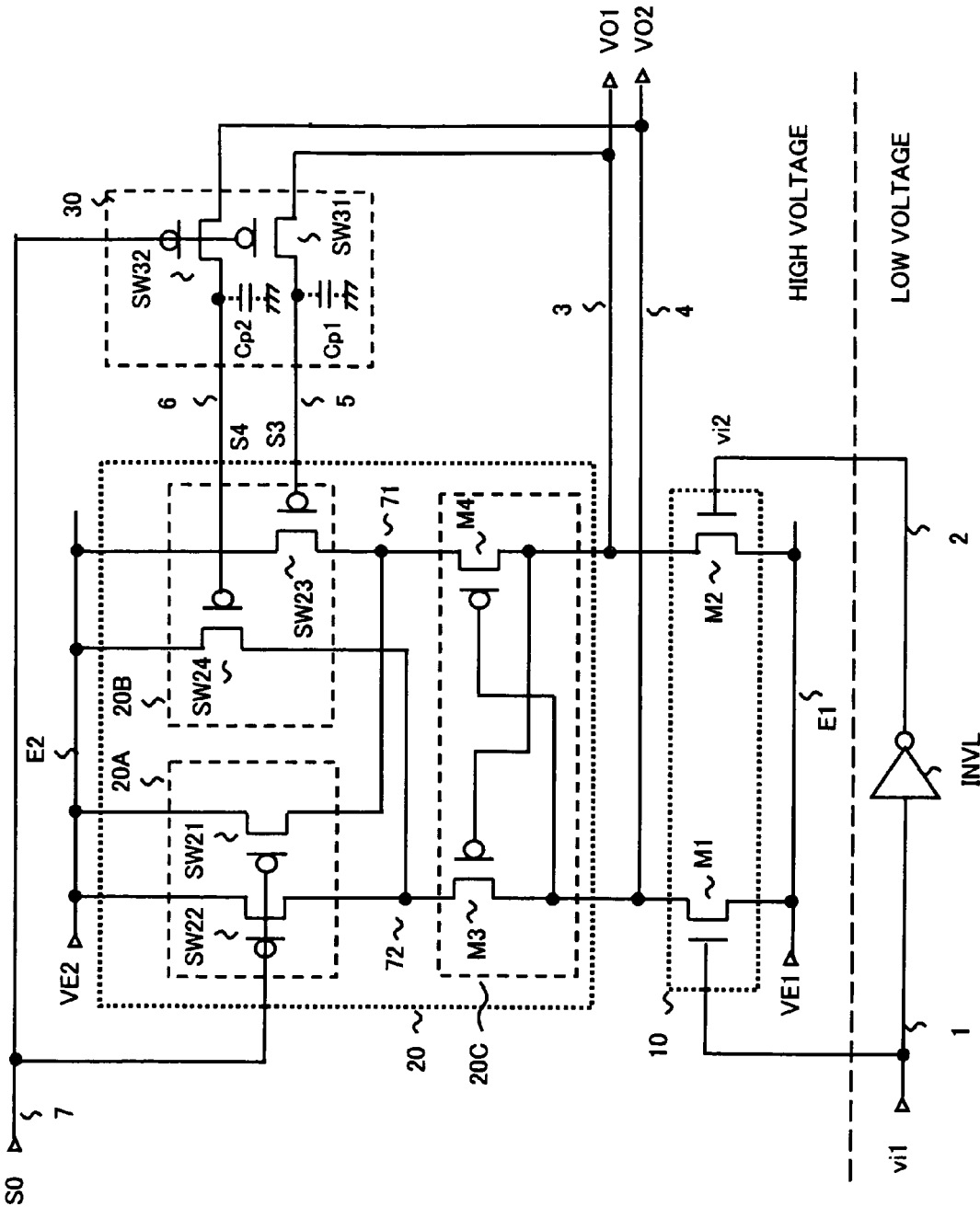
FIG. 7 is a diagram showing a configuration of an exemplary embodiment 1-4 (a specific example of FIG. 3) of the present invention.

FIG. 7 is a diagram showing a specific example of a level shifter circuit to which configurations of the level shifter 20 in FIG. 3 and the latch unit 30 in FIG. 6 have been applied. Referring to FIG. 7, a first level shifter 10 includes N-channel MOS transistors M1 and M2 with sources thereof commonly connected to a first power supply terminal E1, drains thereof connected to a second output terminal 4 and a first output terminal 3, respectively, and gates thereof connected to terminals 1 and 2, respectively. A low-amplitude input signal vi1 is applied to the terminal 1, and a signal vi2 obtained by inverting the voltage of the signal supplied to the terminal 1 by an inverter INVL is supplied to the terminal 2. The inverter INVL operates at a low voltage (between power supply voltages VE4 and VE3).

A level shift unit 20C includes P-channel MOS transistors M3 and M4 with sources thereof connected to terminals 72 and 71, respectively, drains thereof connected to the second output terminal 4 and the first output terminal 3, respectively, and each gate thereof cross-connected to a drain (output terminal 3 or 4) of the other transistor.

Switches SW21 and SW22 of a first switch unit 20A include P-channel MOS transistors with sources thereof commonly connected to a second power supply terminal E2, and drains thereof connected to the terminals 71 and 72, respectively. A first control signal S0 is commonly supplied to gates of the P-channel MOS transistors. Switches SW23 and SW24 of a second switch 20B include P-channel MOS transistors with sources thereof commonly connected to the second power supply terminal E2, and drains thereof connected to the terminals 71 and 72, respectively. A second control signal S3 and a third control signal S4 from a latch unit 30 are supplied to gates of the P-channel MOS transistors, respectively.

A switch SW31 of the latch unit 30 includes a P-channel MOS transistor connected between the terminal 3 and a terminal 5. A gate of the P-channel MOS transistor receives the first control signal S0. A switch SW32 of the latch unit 30 includes a P-channel MOS transistor connected between the terminal 4 and a terminal 6. A gate of the P-channel MOS transistor receives the first control signal S0.

Exemplary Embodiment 1-5

Figure 8:
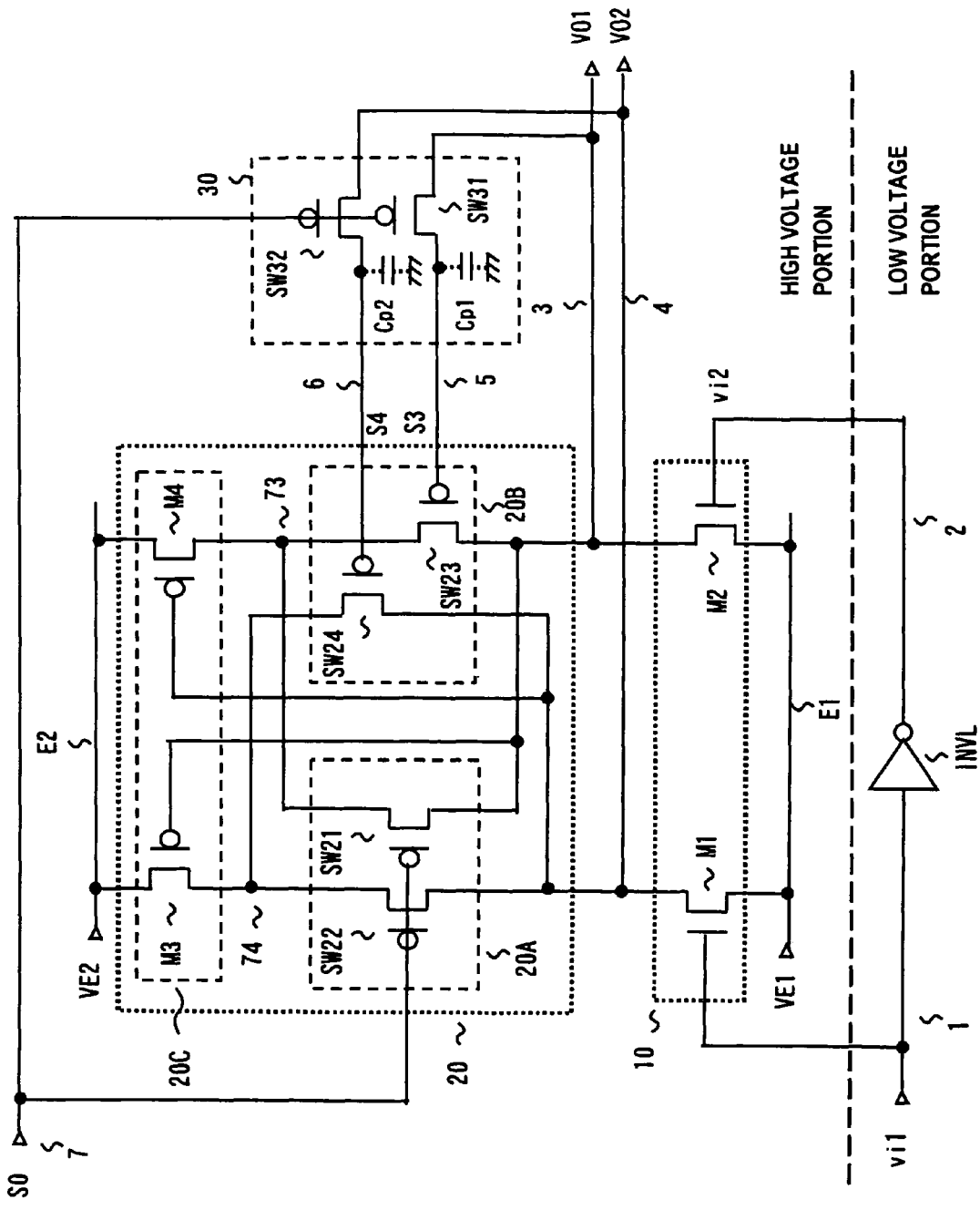
FIG. 8 is a diagram showing a configuration of an exemplary embodiment 1-5 (a specific example of FIG. 4) of the present invention.

FIG. 8 is a diagram showing a specific example of a level shifter circuit to which configurations of the level shifter 20 in FIG. 4 and the latch unit 30 in FIG. 6 have been applied. Referring to FIG. 8, a first level shifter 10 includes N-channel MOS transistors M1 and M2 with sources thereof commonly connected to a first power supply terminal E1, drains thereof connected to a second output terminal 4 and a first output terminal 3, respectively, and gates thereof connected to terminals 1 and 2, respectively. A low-amplitude input signal vi1 is applied to the terminal 1, and a signal vi2 obtained by inverting the voltage of the signal supplied to the terminal 1 by an inverter INVL is supplied to the terminal 2. The inverter INVL operates at a low voltage (between power supply voltages VE4 and VE3).

A level shift unit 20C includes P-channel MOS transistors M4 and M3 with sources thereof connected to a power supply terminal E2, drains thereof connected to terminals 73 and 74, respectively, and each gate thereof cross-connected to a drain (second output terminal 4 or first output terminal 3) of the other transistor.

Switches SW21 and SW22 of a first switch unit 20A include P-channel MOS transistors with sources thereof commonly connected to the terminals 73 and 74, respectively, and drains thereof connected to the terminals 3 and 4, respectively. A first control signal S0 is commonly supplied to gates of the P-channel MOS transistors. Switches SW23 and SW24 of a second switch unit 20B includes P-channel MOS transistors with sources thereof connected to the terminals 73 and 74, respectively, and drains thereof connected to the first output terminal 3 and the second output terminal 4, respectively. A second control signal S3 and a third control signal S4 from the latch unit 30 are supplied to gates of the P-channel MOS transistors, respectively.

A switch SW31 of the latch unit 30 includes a P-channel MOS transistor connected between the terminal 3 and a terminal 5. A gate of the P-channel MOS transistor receives the first control signal S0. A switch SW32 of the latch unit 30 includes a P-channel MOS transistor connected between the terminal 4 and a terminal 6. A gate of the switch S32 receives the first control signal S0.

Figure 9:
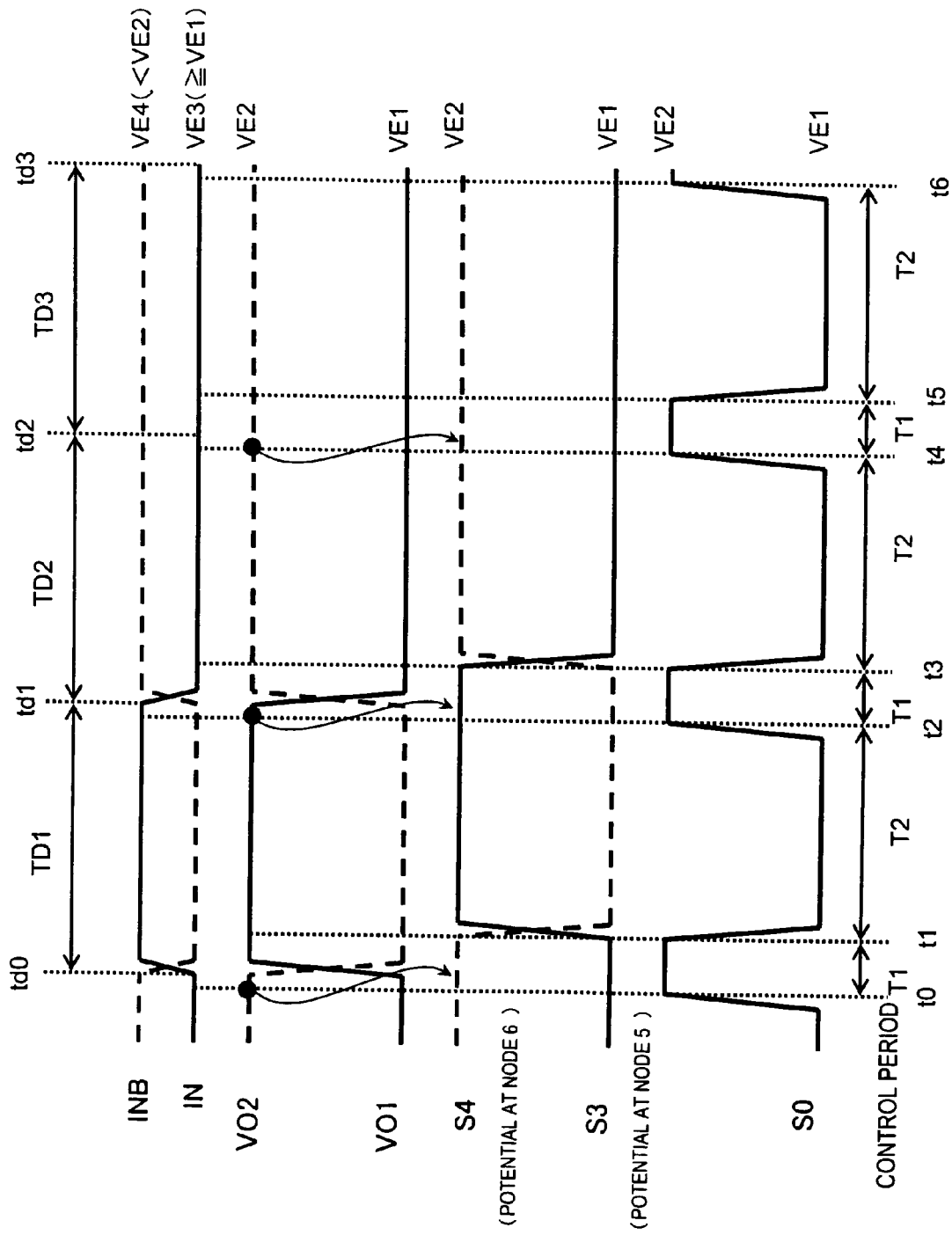
FIG. 9 is a diagram showing a timing operation example of exemplary embodiments 1-4 and 1-5 of the present invention.

FIG. 9 is a timing waveform diagram showing an operation example of each of the level shift circuits in FIGS. 7 and 8. Referring to FIG. 9, waveforms vi1 (indicated by a solid line) and vi2 (indicated by a broken line) respectively indicate voltage waveforms of the input signals to the terminals 1 and 2, waveforms VO1 (indicated by a solid line) and VO2 (indicated by a broken line) are respectively voltage waveforms at the first output terminal 3 and the second output terminal 4, and waveforms S3 (indicated by a solid line), S4 (indicated by a broken line), and S0 are voltage waveforms of the control signals. As in FIG. 2, a voltage level relationship is also set to VE2>VE4>VE3≧VE1, in which a voltage level VE2 is set to be at a high potential and a voltage level VE1 is set to be at a low potential. The input signal vi1 with an amplitude thereof defined by voltage levels VE3 and VE4 is set to be at a high level (VE4) in a period TD1 of three data periods TD1, TD2, and TD3, and is set to be at a Low level (VE3) in the periods TD2 and TD3. The input signal vi2 is set to be the inverted-phase signal of the signal vi1.

The first control signal S0 of a high amplitude from the control signal generation circuit 90 is the signal in which from a start point to an end point of a pulse defines a first time interval T1, and from the end point of the pulse to the start point of the next pulse defines a second time interval T2. Timing setting is performed so that timings at which the low-amplitude input signals (vi1, vi2) are respectively applied to the terminals 1 and 2 are within a period where the pulse of the first control signal S0 is High.

Referring to FIG. 9, at a time t0 in an initial state, the input signals IN and INB (vi1 and vi2) are respectively set to a Low level (VE3≧VE1) of a low amplitude and the High level (VE4<VE2) of the low amplitude. Then, the output signal voltage VO1 of the first output terminal 3 and the output signal voltage VO2 of the second output terminal 4 are respectively set to be at a Low level (VE1) of a high amplitude and to be at the High level (VE2) of the high amplitude.

The latch unit 30 detects the voltage VO2 (voltage at the second output terminal 4) at the High level of the high amplitude at the start time t0 of the first time interval T1, and causes the control signal S4 to be at the High level (VE2) of the high amplitude. Then, in the first time interval T1 (period from t0 to t1), the latch unit 30 causes the switch SW24 between the second output terminal 4 and the second power supply terminal E2 to turn off. As described above, the switches SW21 and SW22 are also turned off in the first time interval T1.

When the input signals vi1 and vi2 are respectively changed to a High level (VE4) of the low amplitude and a Low level (VE3) of the low amplitude at a subsequent time td0, the N-channel MOS transistor M1 in the first level shifter 10 is turned on, thereby changing (discharging) the voltage VO2 at the second output terminal 4 from the High level (VE2) of the high amplitude to a Low level (VE1) of the high amplitude.

In response to the operation of the first level shifter 10 (in response to the change of the drain of the N-channel MOS transistor M1 from the High level of the high amplitude to a Low level of the high amplitude), the P-channel MOS transistor M4 in the second level shifter 20 is turned on, thereby changing (charging) the voltage VO1 at the first output terminal 3 from a Low level (VE1) of the high amplitude to a High level (VE2) of the low-amplitude high amplitude via the switch SW23 in an on state. Even when the amplitudes of the input signals (IN, INB) are small and discharging capabilities of the N-channel MOS transistors M1 and M2 in the first level shifter 10 are comparatively small, the second output terminal 4 and the second power supply terminal E2 are disconnected by the switch 24 in an off state. Thus, the N-channel MOS transistor M1 in the first level shifter 10 can quickly drive the second output terminal 4 to a Low level (VE1).

At the time t1, the first time interval T1 is finished. Then, the first control signal S0 is changed from the High level (VE2) of the high amplitude to a Low level (VE1) of the high amplitude, the switches SW21 and SW22 are turned on, and the disconnection of a current path between the second output terminal 4 and the second power supply terminal E2 is cancelled. The second power supply terminal E2 and each of the first output terminal 3 and the second output terminal 4 are thereby brought into a conduction state or a conductable state. Upon receipt of the first control signal S0 at a Low level, the switches SW31 and SW32 in the latch unit 30 are turned on, and the voltage level VO1 at the first output terminal 3 and the voltage level VO2 at the second output terminal 4 are output to the terminals 5 and 6 in a through mode, respectively. In response to a High level of the voltage VO1 of the high amplitude and a Low level of the voltage VO2 of the high amplitude, or the High level of the second control signal S3 of the high amplitude and a Low level of the third control signal S4 of the high amplitude, the switch SW24 is turned on, and the switch SW23 is turned off. The P-channel MOS transistor M3 that has received the High level (VE2) of the high amplitude at the first output terminal 3 is turned off, and the second output terminal 4 is kept at a Low level (VE1) of the high amplitude even if the switches SW22 and SW24 have been turned on. The P-channel MOS transistor M4 that has received a Low level (VE1) of the high amplitude at the first output terminal 3 is turned on, and the voltage VO1 at the first output terminal 3 is maintained at the High level (VE2) of the high amplitude via the switch SW21 in an on state. That is, in the second time interval T2 (period from t1 to t2), the voltage VO1 at the first output terminal 3 and the voltage VO2 at the second output terminal 4 are stably maintained at the High level (VE2) of the high amplitude and a Low level (VE1) of the high amplitude, respectively.

Next, at the time t2, the latch unit 30 detects the voltage VO1 at the High level (VE2) of the high amplitude, and disconnects the switch SW23 between the first output terminal 3 and the second power supply terminal E2 in the first time interval T1 (period from t2 to t3), using the second control signal S3 at the High level of the high amplitude. At this point, the control signal S4 is driven to a Low level of the low amplitude, and the switch SW 24 is thereby turned on. In the first time interval T1 (period from t2 to t3), the switches SW21 and SW22 are both turned off, according to the first control signal S0 at the High level of the high amplitude, as described above.

When the input signals vi1 and vi2 are respectively changed to a Low level (VE3) of the low amplitude and the High level (VE4) of the low amplitude at a subsequent time td1, the N-channel MOS transistor M2 in the first level shifter 10 changes (discharges) the voltage VO1 at the first output terminal 3 from the High level (VE2) of the high amplitude to a Low level (VE1) of the high amplitude.

In response to the operation of the first level shifter 10, the P-channel MOS transistor M3 in the level shift unit 20C that has received the potential at the first output terminal 3 at the gate thereof is turned on, thereby changing (charging) the voltage VO2 at the second output terminal 4 from a Low level (VE1) of the high amplitude to a High level (VE2) of the high amplitude via the switch SW24. Even when the discharging capabilities of the N-channel MOS transistors M1 and M2 in the first level shifter 10 are comparatively small, the switch SW23 between the first output terminal 3 and the second power supply terminal (E2) is turned off. Thus, the N-channel MOS transistor M2 in the first level shifter 10 can quickly drive the first output terminal 3 to a Low level (VE1) of the high amplitude.

At the time t3, the first time interval T1 is finished. Then, the first control signal S0 assumes a Low level of the high amplitude, and the switches SW21 and SW22 are set to be turned on. Then, disconnection of a current path between the first output terminal 3 and the second power supply terminal E2 is cancelled. The second power supply terminal E2 and each of the first output terminal 3 and the second output terminal 4 are brought into the conduction state or the conductable state. The first control signal S0 assumes a Low level (VE1) of the high amplitude, so that the switches SW31 and SW32 are turned on. Then, the second control signal S3 at a Low level (corresponding to a Low level (VE1) of the high amplitude of the voltage VO1 at the first output terminal 3) is applied to the gate of the switch SW23, so that the switch SW23 is turned on. On the other hand, the third control signal S4 at the High level of the high amplitude (corresponding to a High level (VE2) of the high amplitude of the voltage VO2 at the second output terminal 4) is applied to the switch 24, so that the switch SW24 is turned off.

In the second time interval T2 (period from t3 to t4), the voltage VO1 at the first output terminal 3 and the voltage VO2 at the second output terminal 4 are stably held at a Low level (VE1) of the high amplitude and the High level (VE2) of the high amplitude, respectively.

Next, at the time t4, the latch unit 30 detects the voltage (VO2) at the second output terminal 4 at the High level (VE2) of the high amplitude, and causes the switch SW24 between the second output terminal 4 and the second power supply terminal E2 to turn off, using the control signal S4 at the High level of the high amplitude, in the first time interval T1 (period from t4 to t5). In this case, the switch SW23 is turned on responsive to the second control signal S3 at a Low level (VE1) of the high amplitude from the latch unit 30. Further, at the time t4, the first control signal S0 assumes the High level (VE2) of the high amplitude, so that the switches SW21 and SW22 are both turned off.

When the input signals vi1 and vi2 are respectively maintained at the Low (VE3) level of the low amplitude and the High level (VE4) of the low amplitude at a subsequent time td2, the N-channel MOS transistor M2 in the first level shifter 10 drives the first output terminal 3 at a Low level (VE1) of the high amplitude. At this point, the second output terminal 4 and the second power supply terminal E2 are disconnected. Thus, the charging operation on the second output terminal 4 is not performed by the level shift unit 20C, so that the second output terminal 4 is maintained at the High level (VE2) of the high amplitude by a parasitic capacitance.

At a time t5, the first time interval T1 is finished. Then, the first control signal S0 assumes a Low level (VE1) of the high amplitude. The switches SW21 and SW22 are turned on, and the disconnection of the current path between the second output terminal 4 and the power supply terminal E2 is cancelled. The second power supply terminal E2 and each of the first output terminal 3 and the second output terminal 4 are brought into the conduction or conductable state. In the second time interval T2 (period from t5 to t6), the voltage VO1 at the first output terminal 3 and the voltage VO2 at the second output terminal 4 are stably kept at a Low level (VE1) of the high amplitude and the High level (VE2) of the high amplitude, respectively.

In the embodiments described above, represented by FIGS. 7 and 8, each of the N-channel MOS transistors M2 and M1 in the first level shifter 10 should be equipped with capability of quickly discharging one of the first output terminal 3 and the second output terminal 4 disconnected from the second power supply terminal E2 in the first time interval T1, and may be therefore formed with a comparatively small element size. On the other hand, each of the P-channel MOS transistors M4 and M3 in the level shift unit 20C should be equipped with capability of quickly charging one of the first output terminal 3 and the second output terminal 4 connected to the N-channel MOS transistor M2 or M1 turned off by the input signal vi1 or vi2 in the first time interval T1, and may be formed with a comparatively small element size. Further, each of the switches SW21 and SW22 in the first switch unit 20A, each of the switches SW23 and SW24 in the second switch unit 20B, and each of the switches SW31 and SW32 in the latch unit 30 may be formed with a sufficiently small element size. For this reason, according to the embodiments described above, a higher-speed operation and area saving of the level shifter circuit can be achieved.

Voltage level changes in the output voltage VO1 of the first output terminal 3 and the output voltage VO2 of the second output terminal 4 in the embodiments described above are made quickly, responsive to changes in the voltage levels of the input signals vi1 and vi2 at the times td0 and td1 in the first time interval T1 where the first control signal S0 is at the High level (VE2) of the high amplitude. That is, the level shift circuit of the present invention can perform a high-speed level shift operation without depending on the speed (rise or fall time) of a voltage level change of the first control signal S0. For this reason, the first control signal S0 generated by the control signal generation circuit 90 does not always need to be a high-speed signal (with a fast rise or fall time), and a signal generated by an existing level shift circuit may be employed.

Exemplary Embodiment 1-6

Figure 10:
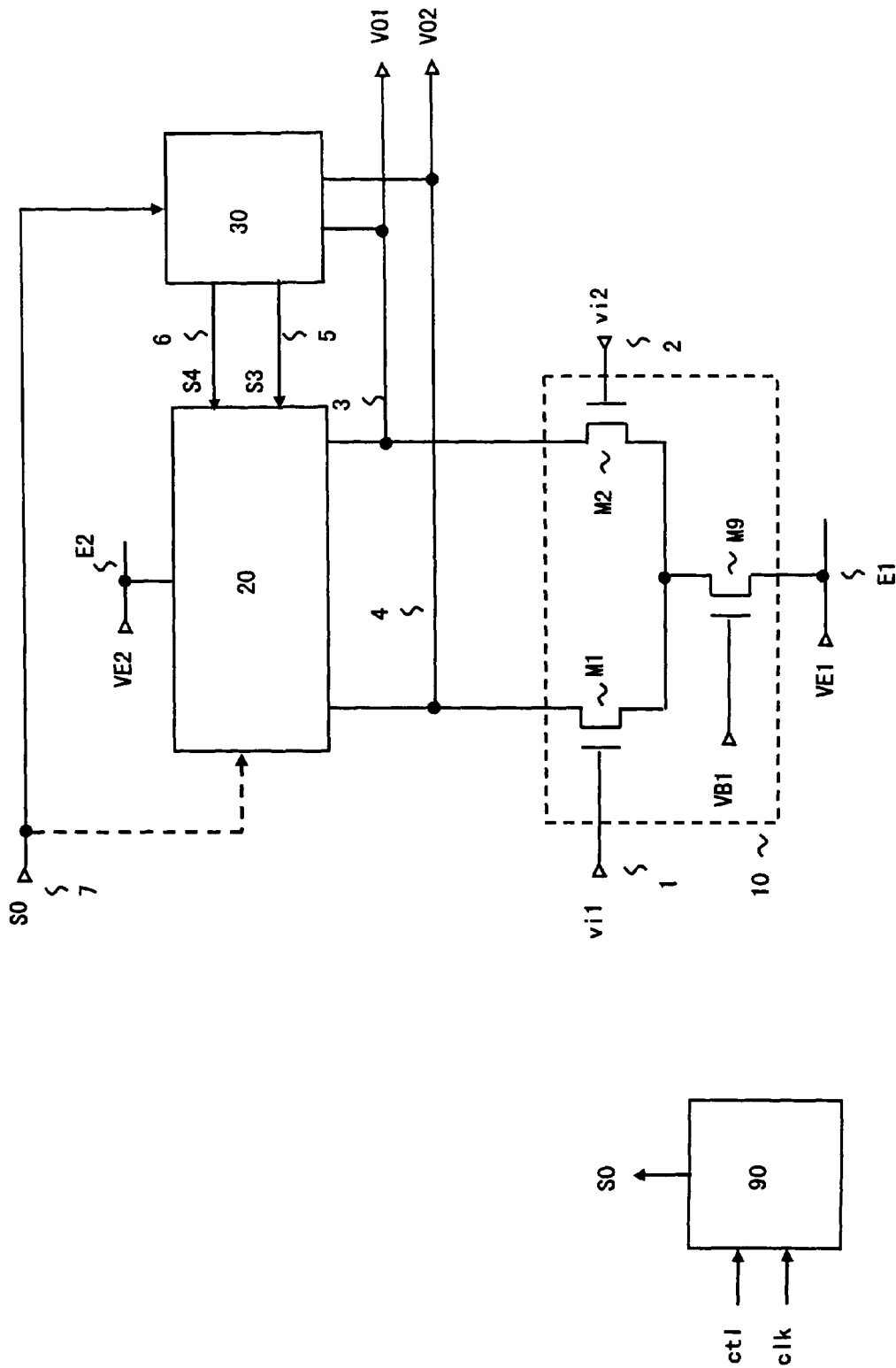
FIG. 10 is a diagram showing a configuration of an exemplary embodiment 1-6 of the present invention.

FIG. 10 is a diagram showing another configuration example of the first level shifter 10 in the embodiment shown in FIG. 1. Referring to FIG. 10, the level shifter 10 includes an N-channel MOS transistor M9 (current source) with a source thereof connected to a first power supply terminal E1, and a differential pair (formed of N-channel MOS transistors M1 and M2) with a common source thereof connected to a drain of the N-channel MOS transistor M9. A gate of the N-channel MOS transistor M9 receives a bias voltage VB1. Preferably, in this embodiment, amplitudes (of voltage levels VE3 and VE4) of low-amplitude input signals vi1 and vi2, which are respectively supplied to gates of the differential pair M1 and M2, are set so that when one of the differential pair transistors M1 and M2 is turned on, the other of the differential pair transistors M1 and M2 is turned off. Drains of the differential pair transistors M1 and M2 are connected to a second power supply terminal E2 via the level shifter 20. Since configurations other than the first level shift circuit 10 are the same as those in the embodiment described above, descriptions of the configurations other than the first level shift circuit 10 will be omitted.

Exemplary Embodiment 1-7

Figure 11:
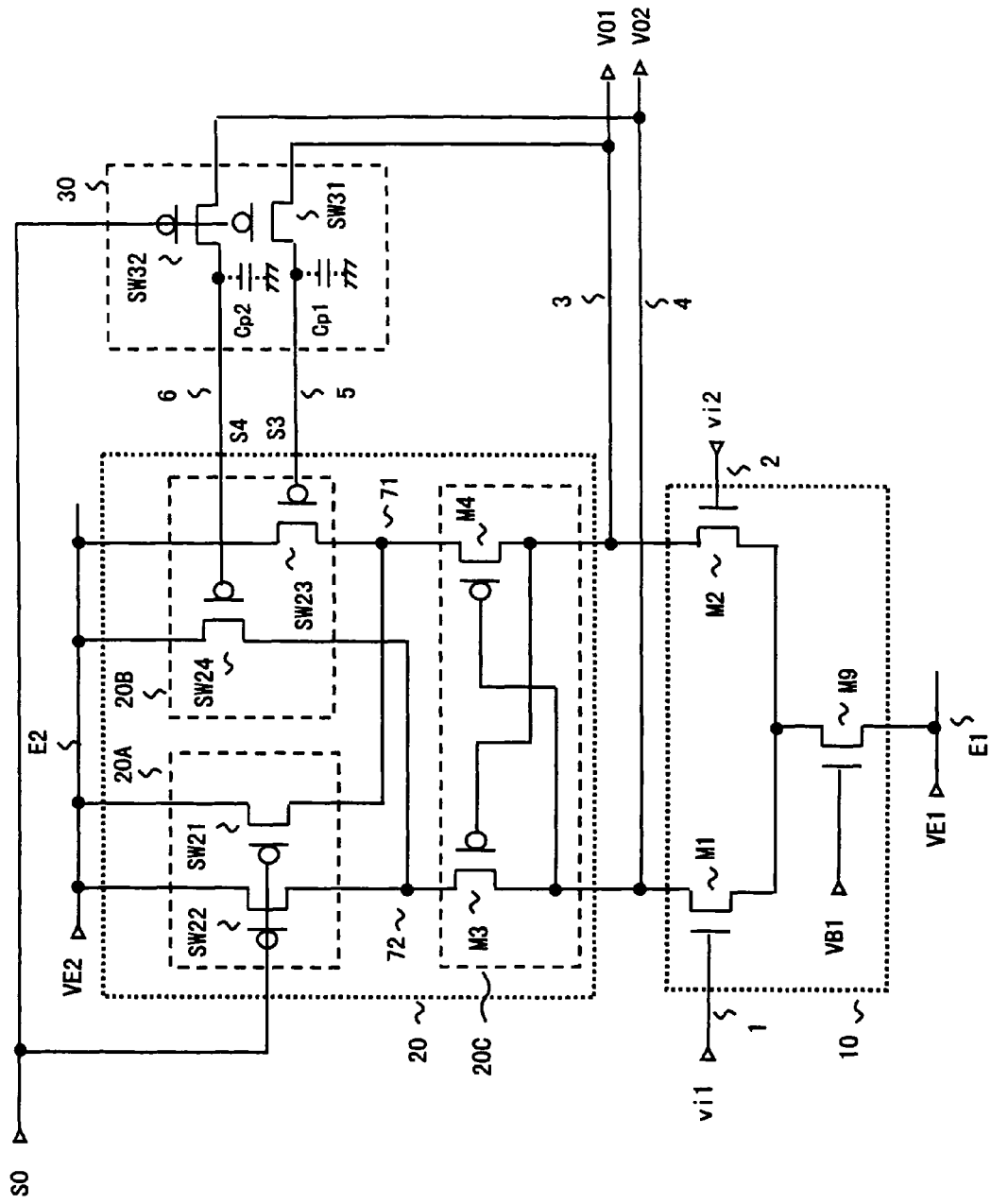
FIG. 11 is a diagram showing a configuration of an exemplary embodiment 1-7 (a specific example of FIG. 10) of the present invention.

FIG. 11 is a diagram showing a configuration of a specific example of a level shift circuit to which configurations of the second level shifter 20 in FIG. 7, the latch unit 30 in FIG. 7, and the first level shifter 10 in FIG. 10 have been applied. Since an operation of the circuit shown in FIG. 11 is similar to that shown in FIG. 9, a description of the operation of the circuit shown in FIG. 11 will be omitted.

Likewise, configurations of the second level shifter 20 in FIG. 8, the latch unit 30 in FIG. 8, and the first level shifter 10 in FIG. 10 may also be of course applied. In this case, the second level shifter 20 in FIG. 11 corresponds to the second level shifter 20 in FIG. 8.

Exemplary Embodiment 1-8

Figure 12:
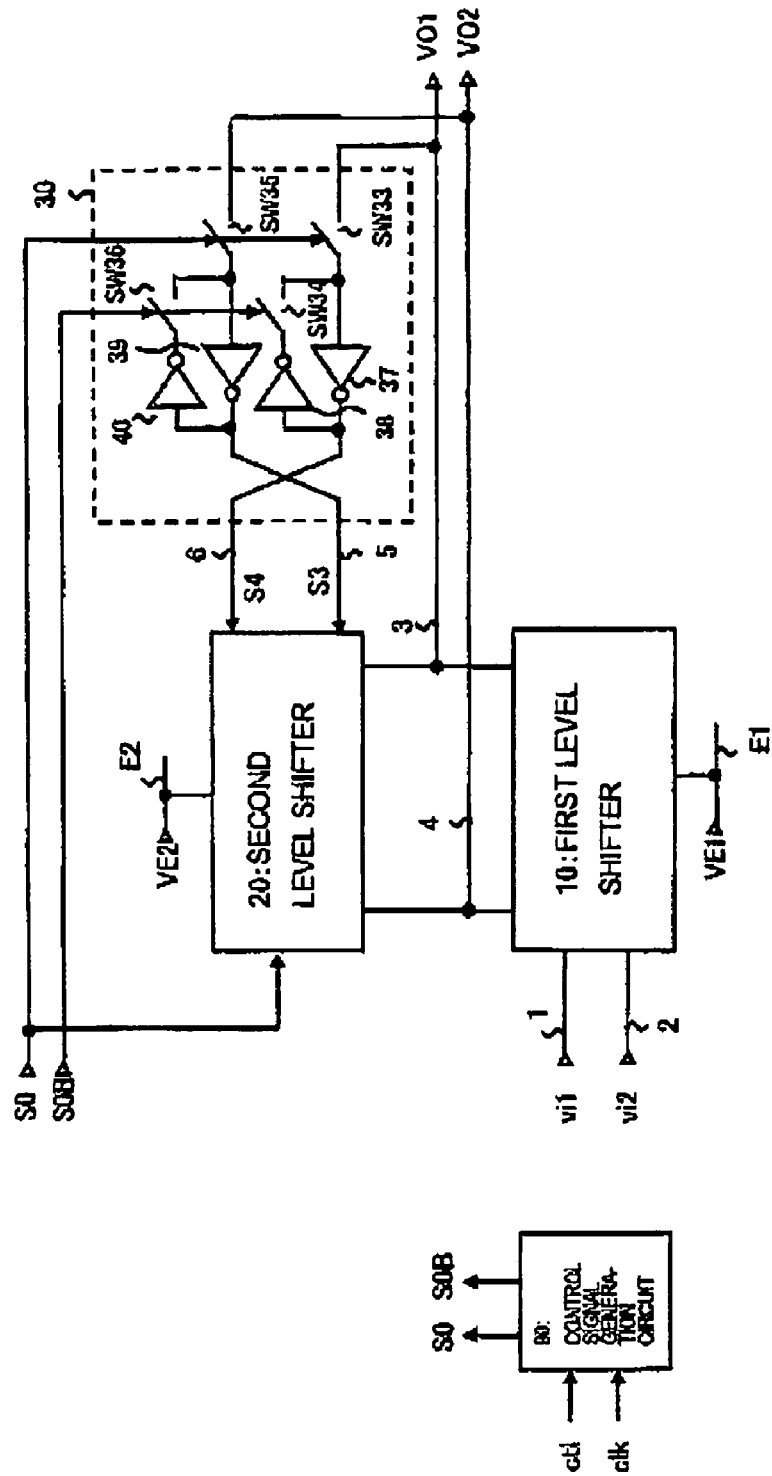
FIG. 12 is a diagram showing a configuration of an exemplary embodiment 1-8 of the present invention.

FIG. 12 is a diagram showing an example where the latch unit 30 in the embodiment described above shown in FIG. 1 has been made different from the configuration in FIG. 6. The respective circuit configurations of the first level shifter 10 and the second level shifter 20, described in each of the above-mentioned embodiments can be used. Thus, descriptions of the circuit configurations will be omitted.

In this embodiment, a control signal generation circuit 90 outputs a complementary signal S0B of a first control signal S0, in addition to the high-amplitude first control signal S0 (which is the same as the first control signal S0 in each of the above-mentioned embodiments).

The latch circuit 30 includes switches SW33 and SW35, inverters 37 and 38, a switch SW34, inverters 39 and 40, and a switch SW36. One end of the switch SW33 is connected to an output terminal 3, and the switch SW33 is controlled to be turned on or off responsive to the first control signal S0 from the control signal generation circuit 90. One end of the switch SW35 is connected to the output terminal 4, and the switch SW35 is controlled to be turned on or off responsive to the first control signal S0. An input to the inverter 37 is connected to the other end of the switch SW33. The inverter 38 receives an output of the inverter 37. The switch SW34 is connected between an output of the inverter 38 and the input to the inverter 37, and the switch SW34 is controlled to be turned on or off responsive to the control signal S0B (complementary signal of the first control signal S0). An input to the inverter 39 is connected to the other end of the switch SW35. The inverter 40 receives an output of the inverter 39. The switch SW36 is connected between an output of the inverter 40 and the input to the inverter 39 and is controlled to be turned on or off responsive to the control signal S0B (complementary signal of the first control signal S0). The outputs of the inverters 37 and 39 are respectively connected to terminals 6 and 5 and are supplied to the level shifter 20 as a second control signal S4 and a third control signal S3, respectively.

Power supply voltages of the inverters 37, 38, 39, and 40 are set to voltages VE2 and VE1, and the inverters 37, 38, 39, and 40 receive and output high-amplitude signals.

The switches SW33 and SW35 are turned off in a first time interval T1 (where the first control signal S0 is at a High level of a high amplitude), and are turned on in a second time interval T2 (where the first control signal S0 is at a Low level of the high amplitude).

The switches SW34 and SW36 are turned on in the first time interval T1 (where the first control signal S0B is at a Low level of the high amplitude), and are turned off in the second time interval T2 (where the first control signal S0B is at the High level of the high amplitude).

The inverters 37 and 38 constitute a flip-flop. When the switch SW33 is in an off state and the switch SW34 is in an on state (in the first time interval T1), the flip-flop holds a value at the first output terminal 3 immediately before the switch SW 33 is turned off (at a start point of the first time interval T1). Then, the inverter 37 outputs an inverted value of the value at the first output terminal 3 immediately before the switch SW33 is turned off (at the start point of the first time interval T1) to the terminal 6. On the other hand, when the switch SW33 is in an on state and the switch SW34 is the off state (in the second time interval T2), the inverter 37 outputs the inverted value of the value at the first output terminal 3 to the terminal 6 (thereby forming a through latch circuit of the inverted output).

The inverters 39 and 40 constitute a flip-flop. When the switch SW35 is in an off state and the switch SW36 is in an on state (in the first time interval T1), the flip-flop holds a value at the second output terminal 4 immediately before the switch SW 35 is turned off (at the start point of the first time interval T1). Then, the inverter 39 outputs an inverted value of the value at the second output terminal 4 immediately before the switch SW35 is turned off (at the start point of the first time interval T1) to the terminal 5. On the other hand, when the switch SW35 is in an on state and the switch SW36 is the off state (in the second time interval T2), the inverter 39 outputs the inverted value of the value at the second output terminal 4 to the terminal 5.

Figure 13:
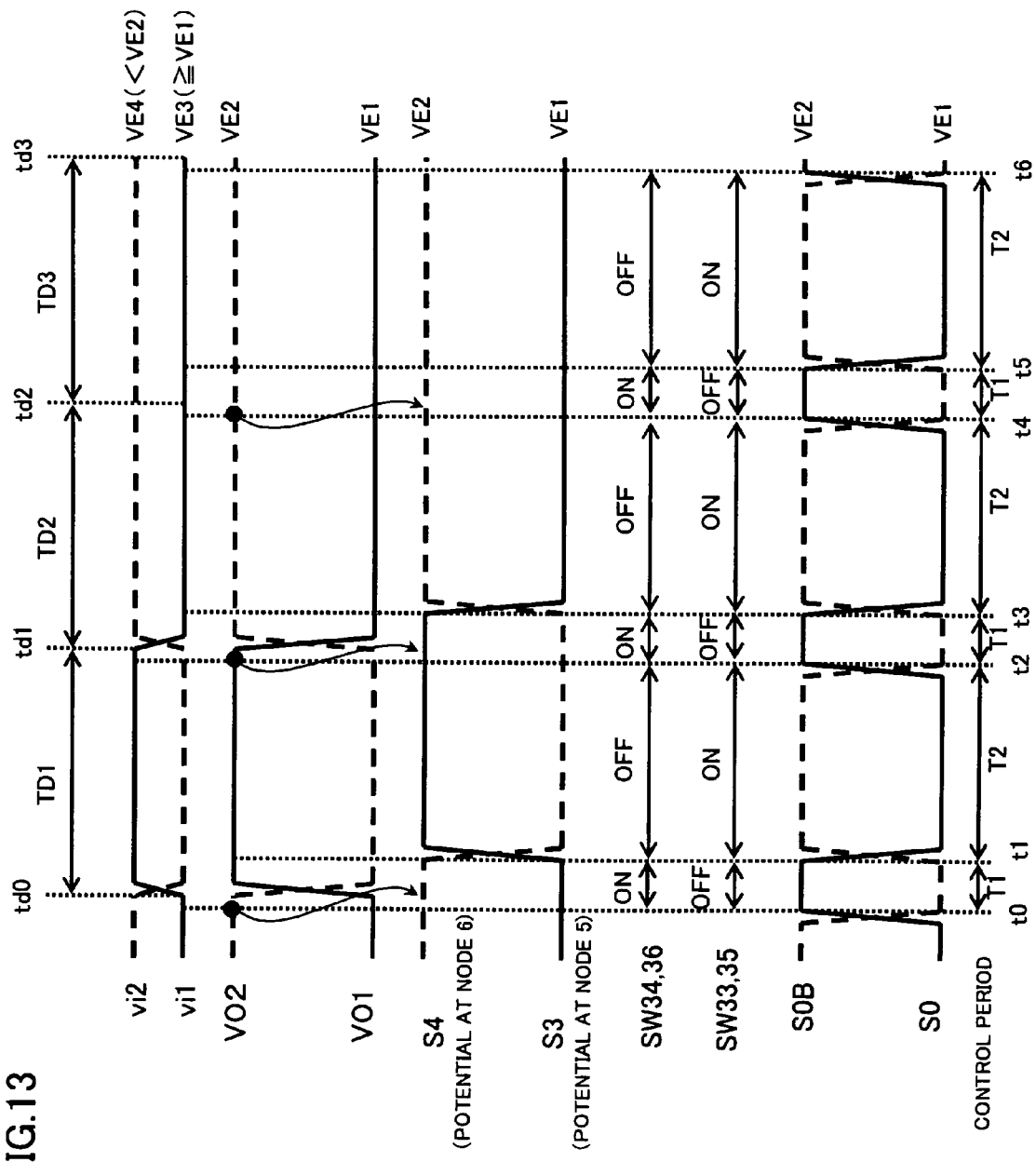
FIG. 13 is a diagram showing a timing operation example of an exemplary embodiment 1-8 of the present invention.

FIG. 13 is a diagram showing an operation example of the circuit in FIG. 12. FIG. 13 shows the example where input signals are supplied in a predetermined cycle of a data signal or the like. FIG. 12 illustrates voltage waveforms of a voltage vi1 (indicated by a solid line) at a terminal 1, a voltage vi2 (indicated by a broken line) at a terminal 2, a voltage VO1 (indicated by a solid line) at the output terminal 3, and a voltage VO2 (indicated by a broken line) at the output terminal 4, the control signal S3 (indicated by a solid line) and the control signal S4 (indicated by a broken line), the first control signal S0 (indicated by a solid line) and the first control signal S0B (indicated by a broken line), turning on or off of the switches SW34, SW36, SW33, and SW35, shown in FIG. 12, control timings in the first time intervals (T1) and the second time intervals (T2), and data period timing relationships. A voltage level relationship is set to VE2>VE4>VE3≧VE1, in which the voltage level VE2 is set to be at a high potential and the voltage level VE1 is set to be at a low potential. In three data periods TD1, TD2, and TD3, an input signal vi1 of which the amplitude is defined by the voltage levels VE3 and VE4 is set to be at a high level (VE4) in the period TD1, and is set to be at a Low level (VE3) in the periods TD2 and TD3. An input signal vi2 is set to be the inverted phase signal of the input signal vi1.

In the example shown in FIG. 13, the complementary signal S0B of the first control signal S0 is supplied to the latch unit 30. The second control signal S3 and the third control signal 4 output from the latch unit 30 in FIG. 12 become the same as those in FIG. 9, thereby allowing implementation of a similar operation to the operation of the latch unit 30 in FIG. 6.

At a time t0 in an initial state, the input signals vi1 and vi2 are respectively set to a Low level (VE3) of a low amplitude and the High level (VE4) of the low amplitude. Then, an output signal VO1 of the first output terminal 3 and an output signal VO2 of the second output terminal 4 are respectively set to a Low level (VE1) of a high amplitude and the High level (VE2) of the high amplitude. In this case, the latch unit 30 detects the voltage VO1 at the first output terminal 3 and the voltage VO2 at the second output terminal 4 immediately before the switches SW33 and SW35 are turned off in response to rising of the first control signal S0 to a High level of the high amplitude at the start time (t0) of the first time interval T1, so that the control signal S4 assumes the High level of the high amplitude and the control signal S3 assumes a Low level of the high amplitude. When the switches SW33 and SW35 are turned off responsive to the first control signal S0 and the switches SW34 and SW36 are turned on responsive to the control signal S0B in the first time interval T1 (period from t0 to t1), the inverters 37 and 38 form the flip-flop, and the inverters 39 and 40 form the flip-flop. Then, the flip-flops respectively hold the value immediately before the switch SW33 is turned off and the value immediately before the switch SW35 is turned off. A current path between the second output terminal 4 and the second power supply terminal E2 in the second level shifter 20 is disconnected in the first time interval T1 (in the period from t0 to t1).

When the input signals vi1 and vi2 are then respectively changed to a High level (VE4) of the low amplitude and a Low level (VE3) of the low amplitude at a subsequent time td0, the first level shifter 10 changes (discharges) the voltage VO2 at the second output terminal 4 from the High level (VE2) of the high amplitude to a Low level (VE1) of the high amplitude. In response to the operation of the first level shifter 10, the second level shift unit 20 changes (charges) the voltage level VO1 at the first output terminal 3 from a Low level (VE1) of the high amplitude to a High level (VE2) of the high amplitude. Even when the amplitudes of the input signals vi1 and vi2 are small and discharging capability of the first level shifter 10 is comparatively small, the second output terminal 4 and the second power supply terminal E2 is disconnected in the first time interval T1. Thus, the first level shifter 10 can quickly drive the second output terminal 4 to a Low level (VE1) of the low amplitude.

At the time t1, the first time interval T1 is finished. Then, the disconnection of the current path between the second output terminal 4 and the second power supply terminal E2 in the second level shifter 20 is cancelled.

In the second time interval T2 (period from t1 to t2), the first control signal S0 and the complementary signal S0B of the first control signal S0 respectively assume a Low level of the high amplitude and the High level of the high amplitude. Then, the switches SW33 and SW35 are turned on, and the switches SW34 and SW36 are turned off. Thus, the latch unit 30 outputs inverted signals of the voltage VO1 at the first output terminal 3 and the voltage VO2 at the second output terminal 4 to the terminals 6 and 5, respectively, in a through mode. The first output terminal 3 and the second output terminal 4 are stably held at the High level (VE2) of the high amplitude and a Low level (VE1) of the high amplitude, respectively.

Next, at the time t2, the latch unit 30 detects the voltage VO1 at the first output terminal 3 and the voltage VO2 at the second output terminal 4 immediately before the switches SW 33 and SW35 are turned off in response to rising of the first control signal S0 to a High level of the high amplitude. Then, the control signals S4 and S3 respectively assume the High level of the high amplitude and a Low level of the high amplitude. When the switches SW33 and SW35 are turned off responsive to the first control signal S0 and the switches SW34 and SW36 are turned on responsive to the control signal S0B in the first time interval T1 (period from t2 to t3), the inverters 37 and 38 form the flip-flop, and the inverters 39 and 40 form the flip-flop. Then, the flip-flops respectively hold the value immediately before the switch SW33 is turned off and the value immediately before the switch SW35 is turned off. The latch unit 30 detects the first output terminal 3 at the High level (VE2) of the high amplitude, and disconnects a current path between the first output terminal 3 and the second power supply terminal E2 in the second level shifter 20 in the first time interval T1 (in the period from t2 to t3), according to the second control signal S3 and the third control signal S4.

When the input signals vi1 and vi2 are respectively changed to the Low (VE3) level of the low amplitude and the High level (VE4) of the low amplitude at a subsequent time td1, the first level shifter 10 changes (discharges) the voltage level (VO1) at the first output terminal 3 from the High level (VE2) of the high amplitude to a Low level (VE1) of the high amplitude. In response to the operation of the first level shifter 10, the second level shifter 20 changes (charges) the voltage level (VO2) at the second output terminal 4 from a Low level (VE1) of the high amplitude to a High level (VE2) of the high amplitude. Even when the discharging capability of the first level shifter 10 is comparatively small, the current path between the first output terminal 3 and the second power supply terminal (E2) is disconnected in the first time interval T1 constituted from the period from t2 to t3. Thus, the first level shifter 10 can quickly drive the first output terminal 3 to a Low level (VE1) of the high amplitude.

At the time t3, the first time interval T1 is finished. The disconnection of the current path between the first output terminal 3 and the second power supply terminal E2 in the second level shifter 20 is cancelled.

In the second time interval T2 (period from t3 to t4), the first control signal S0 and the complementary signal S0B of the first control signal S0 respectively assume a Low level of the high amplitude and the High level of the high amplitude. Then, the switches SW33 and SW35 are turned on, and the switches SW34 and SW36 are turned off. Thus, the latch unit 30 outputs inverted signals of the voltage VO1 at the first output terminal 3 and the voltage VO2 at the second output terminal 4 to the terminals 6 and 5, respectively, in a through mode. The first output terminal 3 and the second output terminal 4 are stably held at a Low level (VE1) of the high amplitude and the High level (VE2) of the high amplitude, respectively.

Next, at the time t4, the latch unit 30 detects the voltage VO1 at the first output terminal 3 and the voltage VO2 at the second output terminal 4 immediately before the switches SW 33 and SW35 are turned off in response to rising of the first control signal S0 to a High level of the high amplitude. Then, the control signals S4 and S3 respectively assume the High level of the high amplitude and a Low level of the high amplitude. When the switches SW33 and SW35 are turned off responsive to the first control signal S0 and the switches SW34 and SW36 are turned on responsive to the control signal S0B in the first time interval T1 (in the period from t4 to t5), the inverters 37 and 38 form the flip-flop, and the inverters 39 and 40 form the flip-flop. Then, the flip-flops respectively hold the value immediately before the switch SW33 is turned off and the value immediately before the switch SW35 is turned off. The latch unit 30 detects the second output terminal 4 at the High level (VE2), and disconnects the current path between the second output terminal 4 and the second power supply terminal E2 in the second level shifter 20 in the first time interval T1 (in the period from t4 to t5), according to the second control signal S3 and the third control signal S4.

When the input signals vi1 and vi2 are respectively kept at a Low level (VE3) of the low amplitude and the High level (VE4) of the low amplitude at a subsequent time td2, the first level shifter 10 drives the first output terminal 3 at a Low level (VE1) of the high amplitude. In this period (from t4 to t5), the current path between the second output terminal 4 and the second power supply terminal E2 is disconnected. Thus, the second level shifter 20 does not perform the charging operation on the second output terminal 4. The second output terminal 4 is held at the High level (VE2) of the high amplitude by a parasitic capacitance.

At the time t5, the first time interval T1 is finished. Then, the disconnection between the second output terminal 4 and the power supply terminal E2 in the second level shifter 20 is cancelled.

In the second time interval T2 (period from t5 to t6), the first control signal S0 and the complementary signal S0B of the first control signal S0 respectively assume a Low level of the high amplitude and the High level of the high amplitude. Then, the switches SW33 and SW35 are turned on, and the switches SW34 and SW36 are turned off. Thus, the latch unit 30 outputs the inverted signals of the voltages at the first output terminal 3 and the second output terminal 4 to the terminals 6 and 5, respectively, in a through mode. The first output terminal 3 and the second output terminal 4 are stably held at a Low level (VE1) of the high amplitude and the High level (VE2) of the high amplitude, respectively.

In the first time interval T1 (period from t4 to t5) where data of the same value is continuous over a plurality of data cycles, the second output terminal 4 at the High level (VE2) of the high amplitude is held by a parasitic capacitance. However, the first time interval T1 is short, so that a possibility that the logic level of the second output terminal 4 varies and the second output terminal malfunctions due to the influence of noise or the like scarcely exists (is avoided).

Exemplary Embodiment 1-9

Figure 14:
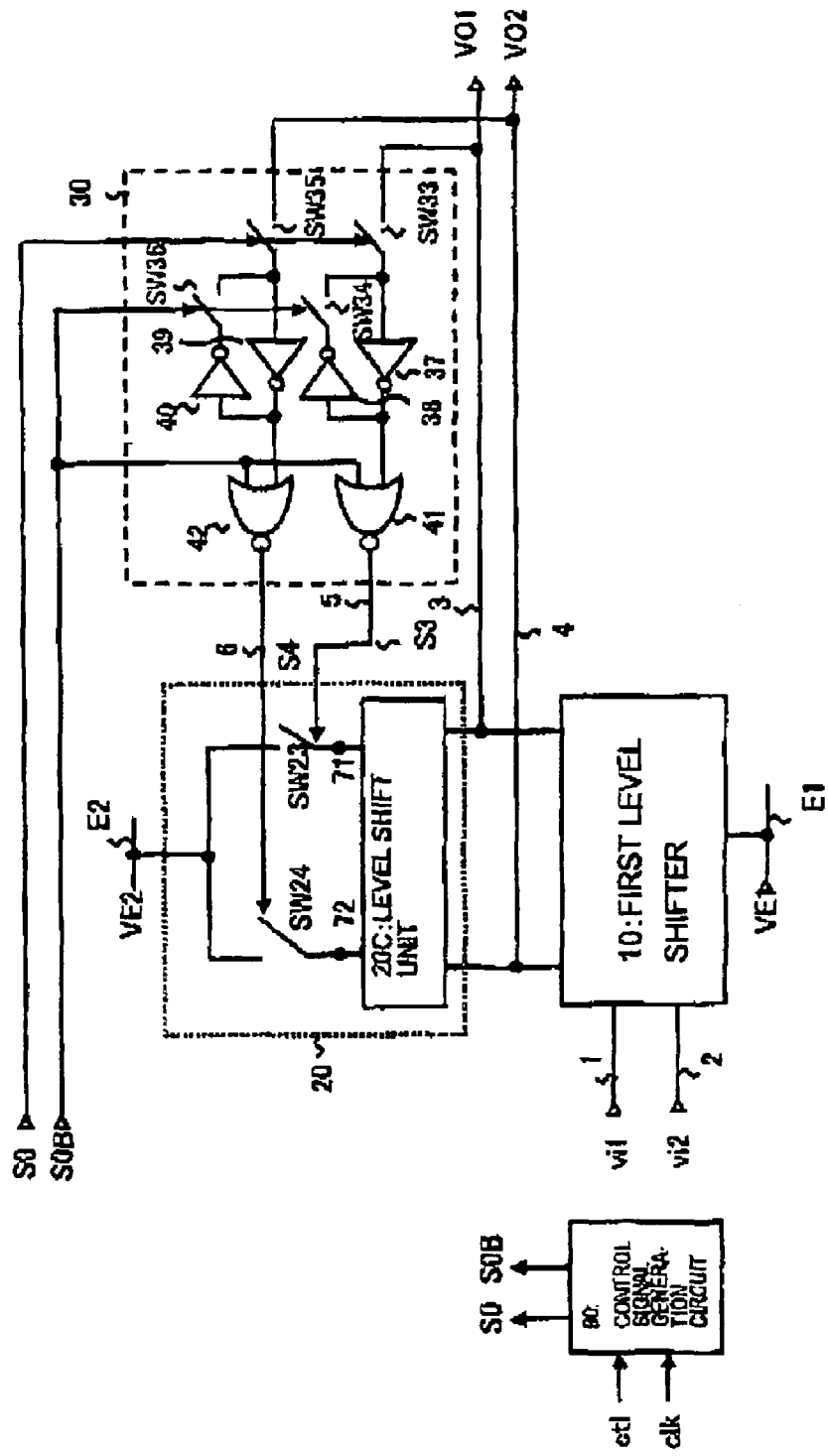
FIG. 14 is a diagram showing a configuration of an exemplary embodiment 1-9 of the present invention.

FIG. 14 is a diagram showing another configuration example of the latch unit 30 in FIG. 1. Referring to FIG. 14, in addition to the latch of the configuration in FIG. 12, the latch unit 30 includes NOR circuits 41 and 42 which are driven by power supplies VE2 and VE1. That is, the latch unit 30 includes the NOR circuit 41 and the NOR circuit 42. The NOR circuit 41 receives an output signal of an inverter 37 and a control signal S0B (which is the complementary signal of a control signal S0) at two input terminals thereof. An output terminal of the NOR circuit 41 is connected to a terminal 5, and the NOR circuit 41 supplies a second control signal S3 to a switch SW23 of a second level shifter 20. The NOR circuit 42 receives an output signal of an inverter 39 and the control signal S0B at two input terminals thereof. An output terminal of the NOR circuit 42 is connected to a terminal 6, and the NOR circuit 42 supplies a third control signal S4 to a switch SW24 of the second level shifter 20.

Figure 15:
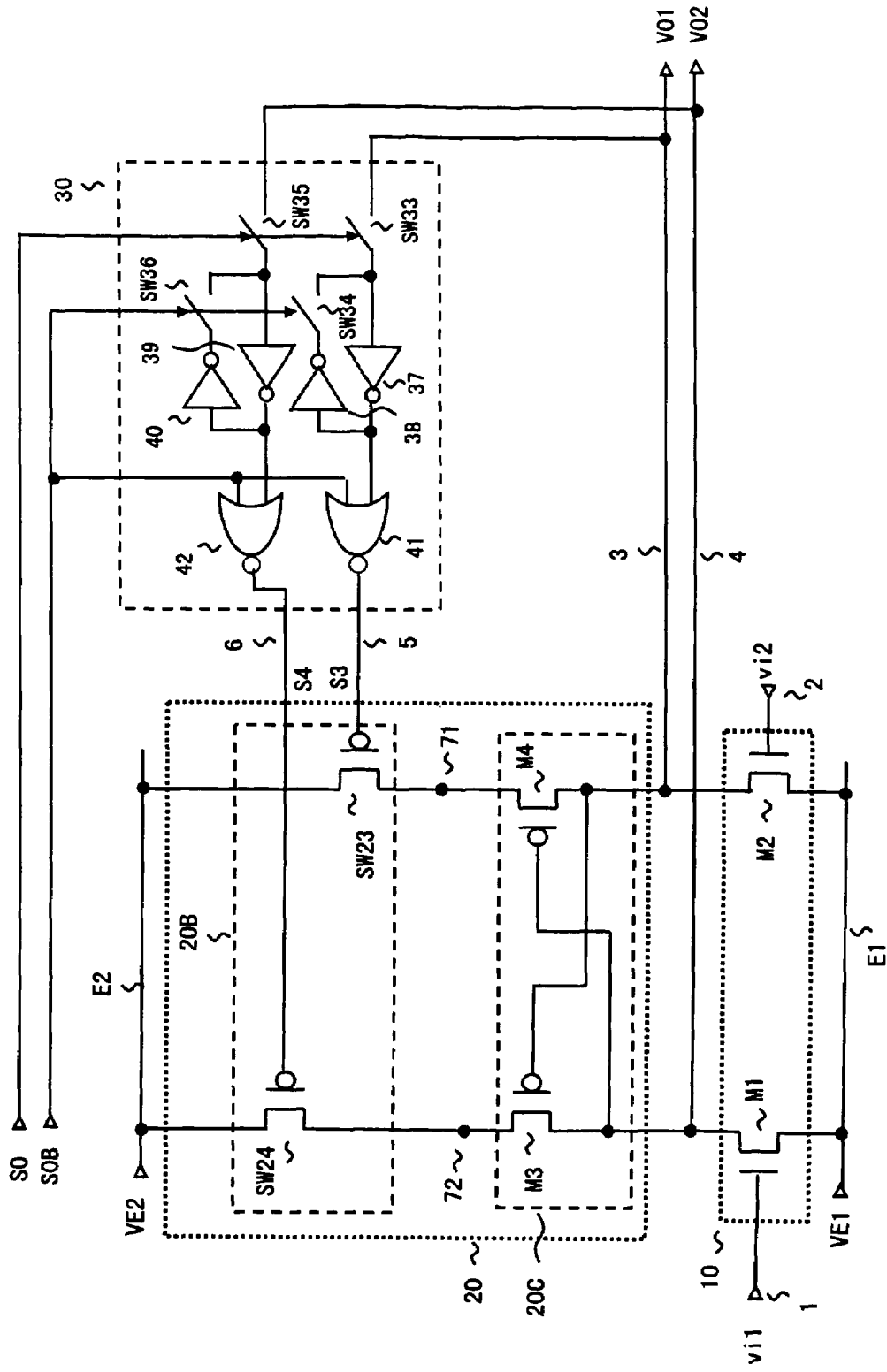
FIG. 15 is a diagram showing a configuration of an exemplary embodiment 1-10 (a specific example of FIG. 14) of the present invention.

The switches SW23 and SW24 of the second level shifter 20 are turned on when the second control signal S3 and the third control signal S4 respectively output from the NOR circuit 41 and the NOR circuit 42 of the latch unit 30 are Low. When the second control signal S3 and the third control signal S4 are High, the switches SW23 and SW24 are turned off. As shown in FIG. 15, for example, the switches SW23 and SW24 respectively include P-channel MOS transistors with sources thereof connected in common to a second power supply terminal E1 and drains thereof connected to terminals 71 and 72, respectively.

Only while the control signal S0B is at a Low level of a high amplitude (in a first time interval T1), the NOR circuits 41 and 42 output signals obtained by inverting the outputs of the inverters 37 and 39 to the terminals 5 and 6, respectively. While the control signal S0B is at a High level of the high amplitude (in a second time interval T2), the NOR circuits 41 and 42 output a high-amplitude fixed Low level to the terminals 5 and 6. Voltage levels obtained by latching voltage levels of the output terminals 3 and 4 at a start time of the first time interval T1 are respectively output in the form of the second control signal S3 output from the NOR circuit 41 and the third control signal S4 output from the NOR circuit 42 in the first time interval T1 alone. In the second time interval T2, the control signals S3 and S4 are both held at a Low level of a high amplitude, and the switches SW23 and SW24 are both turned on.

More specifically, when the first control signal S0 is at the High level of the high amplitude (in the first time interval T1), the inverters 37 and 39 output inverted values of a voltage VO1 at the first output terminal 3 and a voltage VO2 at the second output terminal 4 immediately before the switches SW33 and SW35 are turned off, latched by flip-flops (formed of the inverters 37 and 38) and (formed of the inverters 39 and 40) to the NOR circuits 41 and 42, respectively. When the voltage VO1 at the first output terminal 3 and the voltage VO2 at the second output terminal 4 immediately before the switches SW33 and SW35 are turned off (at the start time of the first time interval T1) are at a Low level (VE1) of a high amplitude and a High level (VE2) of the high amplitude, the inverter 37 outputs the High voltage level (VE2) of the high amplitude and the inverter 39 outputs the Low voltage level (VE1) of the high amplitude. When the first control signal S0 is at the High level of the high amplitude, the control signal S0B is at a Low level of the high amplitude. Then, the NOR circuits 41 and 42 function as inverters, and the second control signal S3 from the NOR circuit 41 and the third control signal S4 from the NOR circuit 42 respectively assume a Low level of the high amplitude and a High level of the high amplitude. Accordingly, in the second level shifter 20, the switch SW24 is turned off, and the switch SW23 in turned on. On the other hand, when the first control signal S0 is at a Low level of the high amplitude (in the second time interval T2), the second control signal S3 from the NOR circuit 41 and the third control signal S4 from the NOR circuit 42 both assume a Low level of the high amplitude, as described before. Then, the switches SW23 and SW24 in the second level shifter 20 are both turned on.

In the configuration described with reference to FIGS. 3 and 4, one of the switches SW23 and SW24 is turned off in the first time interval T1, based on the voltages at the first output terminal 3 and the second output terminal 4 (second control signal S3 and third control signal S4). In the second time interval T2, one of the switches SW 23 and SW24 is turned on, and the other of the switches SW23 and SW24 is turned off (it means that a path between the output terminal and the second power supply terminal E2 is turned off). In the second time interval T2, by turning on both of the switches SW21 and SW22 controlled to be turned on or off responsive to the first control signal S0, the current path between the second power supply terminal E2 and each of the first output terminal 3 and the second output terminal 4 is conducted.

On contrast therewith, in this embodiment (FIG. 14), one of the second control signal S3 and the third control signal S4 corresponding to the output terminal at the High level of the high amplitude is set to be at the High level of the high amplitude in the first time interval T1. One of the switches SW23 and SW24 is thereby turned off and the other of the switches SW23 and SW24 is thereby turned on. In the second time interval T2, both of the second control signal S3 and the third control signal S4 are both set to a Low level of the high amplitude, so that both of the switches SW23 and SW24 are set to be in an on state. The level shift unit 20C is formed of the P-channel MOS transistors M3 and M4 shown in FIG. 7, in which gates and the drains are cross-connected. One of the P-channel MOS transistors M3 and M4 with the gate thereof connected to one of the first output terminal 3 and the second output terminal 4 at the High level of the high amplitude and the drain thereof connected to the other of the first output terminal 3 and the second output terminal 4 is turned off. The other of the first output terminal 3 and the second output terminal 4 is set to a Low level (VE1) of the high amplitude by the first level shifter 10. The other of the P-channel MOS transistors with the gate thereof connected to the other of the first output terminal 3 and the second output terminal 4 and the drain thereof connected to the one of the output terminals is turned on, and the one of the output terminals is set to a High level (VE2) of the high amplitude.

According to this embodiment, the first switch circuit 20A (including the switches SW21 and SW22) needed in FIGS. 3 and 4 can be omitted, and the need for supply of the first control signal S0 that controls turning on and off of the first switch circuit 20A (including the switches SW21 and SW22) to the second level shift circuit 20 is thereby eliminated. In the example shown in FIG. 14, control over the level shifter 20 is performed only by the second control signal S3 and the third control signal S4 from the latch unit 30, and the first control signal S0 is not supplied to the level shifter 20.

Exemplary Embodiment 1-10

FIG. 15 shows a specific example of a level shift circuit to which configurations of the level shifter 20 and the latch unit 30 in FIG. 14 have been applied. Since the configuration of the latch unit 30 is set to be the same as that in FIG. 14, a description of the latch unit 30 will be omitted.

Referring to FIG. 15, a first level shifter 10 includes N-channel MOS transistors M1 and M2 with sources thereof connected to a first power supply terminal E1, drains thereof connected to a second output terminal 4 and a first output terminal 3, respectively, and gates thereof connected to terminals 1 and 2, respectively. A low-amplitude input signal vi1 is applied to the terminal 1, while a low-amplitude input signal vi2 (which is the complementary signal of the signal vi1) is applied to the terminal 2.

A second level shifter 20 includes a switch unit 20B and a level shift unit 20C. The level shift unit 20C includes P-channel MOS transistors M3 and M4 with sources thereof connected to terminals 72 and 71, respectively, drains thereof connected to the second output terminal 4 and the first output terminal 3, respectively, and each gate thereof cross-connected to a drain of the other transistor (output terminal 3 or 4).

Switches SW23 and SW24 in the switch unit 20B respectively include P-channel MOS transistors with sources thereof connected in common to a second power supply terminal E2, and drains thereof connected to the terminals 71 and 72, respectively. A second control signal S3 and a third control signal S4 are supplied to gates of the P-channel MOS transistors, respectively. Referring to FIG. 15, in the configuration of the second level shifter 20, the switch unit 20B and the level shift unit 20C are cascode-connected so that the switch unit 20B is located on the side of the second power supply terminal E2 and the level shift unit 20C is located on the side of the output terminals 3 and 4. The switch unit 20B and the level shift unit 20C may be, as a matter of course, cascode-connected so that the level shift unit 20C is located on the side of the second power supply terminal E2 and the switch unit 20B is located on the side of the output terminals 3 and 4.

Figure 16:
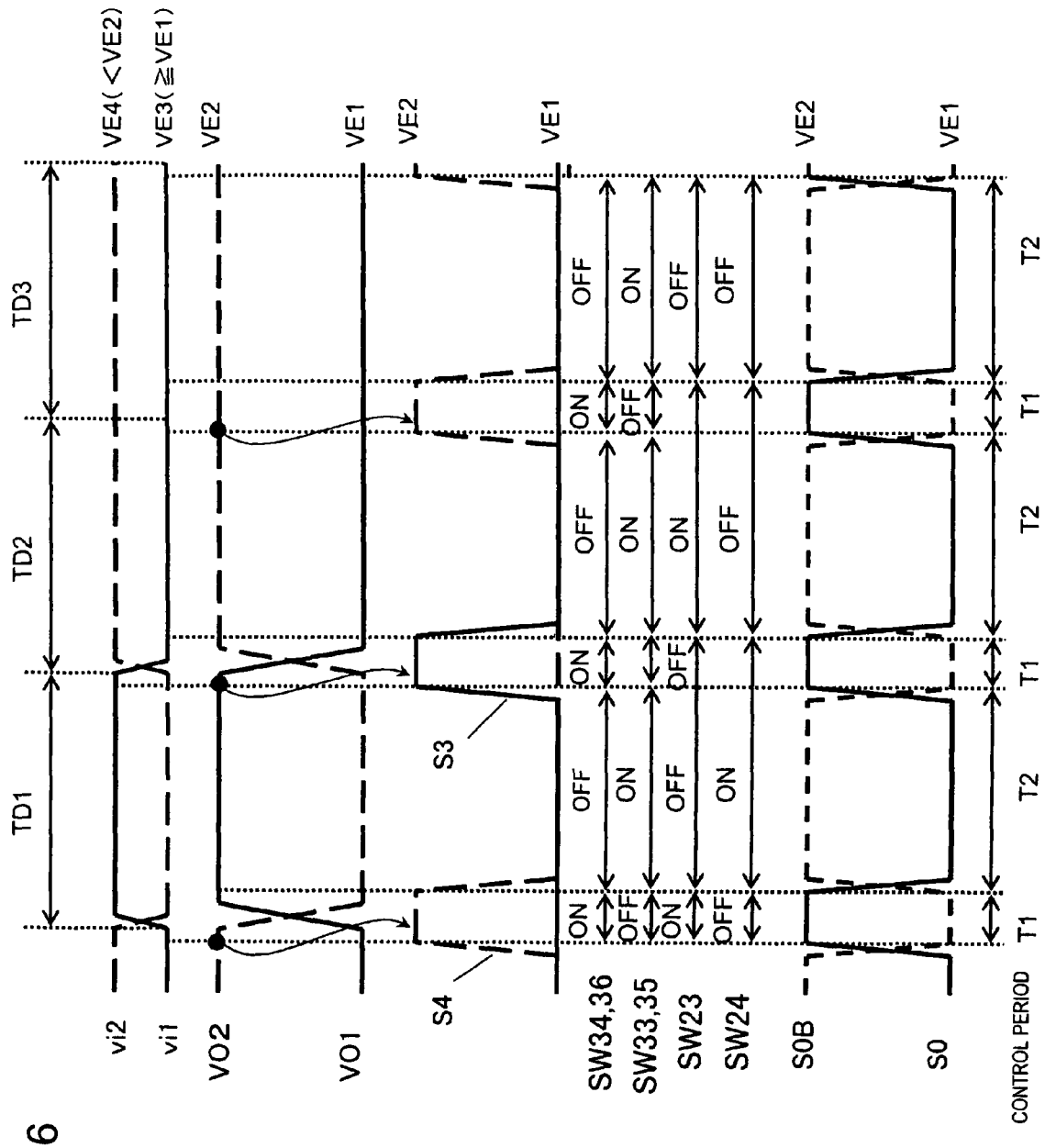
FIG. 16 a diagram showing a timing operation example of exemplary embodiments 1-9 and 1-10 of the present invention.

FIG. 16 is a diagram showing an operation example of the level shift circuit in each of FIGS. 14 and 15. FIG. 16 shows the example where the input signals are supplied in a predetermined cycle of a data signal or the like. Voltage waveforms of a voltage vi1 (indicated by a solid line) at the terminal 1, a voltage vi2 (indicated by a broken line) at the terminal 2, the voltage VO1 (indicated by a solid line) at the output terminal 3, and the voltage VO2 (indicated by a broken line) at the output terminal 4, the control signal S3 (indicated by a solid line) and the control signal S4 (indicated by a broken line), turning on or off of the switches SW23 and SW24, voltage waveforms of the first control signal S0 (indicated by a solid line) and the complementary signal S0B of the first control signal S0 (indicated by a broken line), turning on or off of the switches SW34, SW 36, SW33, and SW35, in FIG. 14, control timings in the first time intervals (T1) and the second time intervals (T2), and data period timing relationships. A voltage level relationship is set to VE2>VE4>VE3≧VE1, in which the voltage level VE2 is set to be at a high potential and the voltage level VE1 is set to be at a low potential, as in FIG. 2. In three data periods TD1, TD2, and TD3, the input signal vi1 of which the amplitude is defined by the voltage levels VE3 and VE4 is set to be at a high level (VE4) in the period TD1, and is set to be at a Low level (VE3) in the periods TD2 and TD3. The input signal vi2 is set to be the inverted phase signal of the input signal vi1.

In the example shown in FIG. 16, only during periods where the first control signal S0 is at the High level of the high amplitude, the second control signal S3 and the third control signal S4 are supplied to the second level shifter 20 from the latch unit 30. During periods where the first control signal S0 is at a Low level of the high amplitude, the second control signal S3 and the third control signal S4 supplied to the second level shifter 20 are set to be at a Low level of the high amplitude.

At a time t0 in an initial state, the input signals vi1 and vi2 are respectively set to a Low level (VE3) of a low amplitude and the High level (VE4) of the low amplitude. Then, an output signal VO1 of the first output terminal 3 and an output signal VO2 of the second output terminal 4 are respectively set to a Low level (VE1) of the high amplitude and the High level (VE2) of the high amplitude. The latch unit 30 detects the voltage VO1 at the first output terminal 3 and the voltage VO2 at the second output terminal 4 immediately before the switches SW33 and SW35 are turned off in response to rising of the first control signal S0 to a High level of the high amplitude at the start time (to) of the first time interval T1, so that the control signal S4 assumes the High level of the high amplitude and the control signal S3 assumes a Low level of the high amplitude. Then, the switch SW24 is turned off, and the switch S23 is turned on. When the switches SW33 and SW35 are turned off responsive to the first control signal S0 and the switches SW34 and SW36 are turned on responsive to the control signal S0B in the first time interval T1 (in the period from t0 to t1), the inverters 37 and 38 form the flip-flop, and the inverters 39 and 40 form the flip-flop. Then, the flip-flops respectively hold the value immediately before the switch SW33 is turned off and the value immediately before the switch SW35 is turned off. Then, the NOR circuit 41 supplies the inverted value of the output of the inverter 37 to the terminal 5 as the second control signal S3, and the NOR circuit 42 supplies the inverted value of the output of the inverter 38 to the terminal 6 as the third control signal S4. The current path between the second output terminal 4 and the second power supply terminal E2 in the second level shifter 20 is disconnected in the first time interval T1 (in the period from t0 to t1).

When the input signals vi1 and vi2 are then respectively changed to a High level (VE4) of the low amplitude and a Low level (VE3) of the low amplitude at a subsequent time td1, the first level shifter 10 changes (discharges) the voltage VO2 at the second output terminal 4 from the High level (VE2) of the high amplitude to a Low level (VE1) of the high amplitude. In response to the operation of the first level shifter 10, the second level shift unit 20 changes (charges) the voltage VO1 at the first output terminal 3 from a Low level (VE1) of the high amplitude to a High level (VE2) of the high amplitude. Even when the amplitudes of the input signals vi1 and vi2 are small and discharging capability of the first level shifter 10 is comparatively small, the second output terminal 4 and the second power supply terminal E2 are disconnected in the first time interval T1. Thus, the first level shifter 10 can quickly drive the second output terminal 4 to a Low level (VE1) of the high amplitude.

At the time t1, the first time interval T1 is finished. When the control signal S0B assumes the High level of the high amplitude, the outputs of the NOR circuits 41 are 42 are fixed at a Low level of the high amplitude. Turning off of the switch SW24 in the second level shifter 20 is thereby canceled.

In the second time interval T2 (period from t1 to t2), the first control signal S0 and the complementary signal S0B of the first control signal S0 respectively assume a Low level of the high amplitude and the High level of the high amplitude. Then, the switches SW33 and SW35 are turned on, and the switches SW34 and SW36 are turned off. Thus, the latch unit 30 supplies inverted signals of the voltage at the first output terminal 3 and the voltage at the second output terminal 4 to the NOR circuits 41 and 42, respectively, in a through mode. The outputs of the NOR circuits 41 and 42 that have received the control signal S0B at the high level of the high amplitude are fixed at a Low level of the high amplitude. The switches SW23 and SW24 of the second level shifter 20, which have received the second control signal S3 at a Low level and the third control signal S4 at a Low level are both turned on, so that the current path between the second power supply terminal E2 and each of the first output terminal 3 and the second output terminal 4 is brought into a conduction state or a conductable state. The first output terminal 3 and the second output terminal 4 are stably held at the High level (VE2) of the high amplitude and a Low level (VE1) of the high amplitude, respectively.

Next, at the time t2, the latch unit 30 detects the voltage VO1 at the first output terminal 3 and the voltage VO2 at the second output terminal 4 immediately before the switches SW 33 and SW35 are turned off in response to rising of the first control signal S0 to a High level of the high amplitude. Then, the control signal S3 from the NOR circuit 41 and the control signal S4 from the NOR circuit 42 respectively assume the High level and Low level of the high amplitude. When the switches SW33 and SW35 are turned off responsive to the first control signal S0 and the switches SW34 and SW36 are turned on responsive to the control signal S0B in the first time interval T1 (in the period from t2 to t3), the inverters 37 and 38 form the flip-flop, and the inverters 39 and 40 form the flip-flop. Then, the flip-flops respectively hold the value immediately before the switch SW33 is turned off and the value immediately before the switch SW35 is turned off. The latch unit 30 detects the first output terminal 3 at the High level (VE2) of the high amplitude, and causes the switch SW23 between the first output terminal 3 and the second power supply terminal E2 in the second level shifter 20 to turn off using the second control signal S3 and the third control signal S4 in the first time interval T1 (in the period from t2 to t3). The switch SW24 is maintained in an on state.

When the input signals vi1 and vi2 are respectively changed to a High level (VE4) of the low amplitude and a Low level (VE3) of the low amplitude at a subsequent time td1, the first level shifter 10 changes (discharges) the voltage level VO1 at the first output terminal 3 from the High level (VE2) of the high amplitude to a Low level (VE1) of the high amplitude. In response to the operation of the first level shifter 10, the second level shifter 20 changes (charges) the voltage level VO2 at the second output terminal 4 from a Low level (VE1) of the high amplitude to a High level (VE2) of the high amplitude. Even when the discharging capability of the first level shifter 10 is comparatively small, the current path between the first output terminal 3 and the second power supply terminal (E2) is disconnected in the first time interval T1 (period from t2 to t3). Thus, the first level shifter 10 can quickly drive the first output terminal 3 to a Low level (VE1).

At the time t3, the first time interval T1 is finished. Then, when the control signal S0B assumes the High level of the high amplitude, the outputs of the NOR circuits 41 and 42 are fixed at a Low level of the high amplitude. Turning off of the switch SW23 between the first output terminal 3 and the second power supply terminal E2 in the second level shifter 20 is thereby cancelled.

In the second time interval T2 (period from t3 to t4), the first control signal S0 and the complementary signal S0B of the first control signal S0 respectively assume the Low level of the high amplitude and the High level of the high amplitude. Then, the switches SW33 and SW35 are turned on, and the switches SW34 and SW36 are turned off. Thus, the latch unit 30 supplies the inverted signals of the voltage VO1 at the first output terminal 3 and the voltage VO2 at the second output terminal 4 to the NOR circuits 41 and 42, respectively, in a through mode. The outputs of the NOR circuits 41 and 42 that have received the control signal S0B at the high level of the high amplitude are both fixed at a Low level of the high amplitude. The switches SW23 and SW24 which have respectively received the second control signal S3 at the low level and the third control signal at a Low level are turned on, so that the current path between the second power supply terminal E2 and each of the first output terminal 3 and the second output terminal 4 is brought into the conduction or conductable state. The first output terminal 3 and the second output terminal 4 are stably held at a Low level (VE1) of the high amplitude and the High level (VE2) of the high amplitude, respectively.

Next, at the time t4, the latch unit 30 detects the voltage VO1 at the first output terminal 3 and the voltage VO2 at the second output terminal 4 immediately before the switches SW 33 and SW35 are turned off in response to rising of the first control signal S0 to a High level of the high amplitude. Then, the control signals S4 and S3 respectively assume the High level of the high amplitude and a Low level of the high amplitude. When the switches SW33 and SW35 are turned off responsive to the first control signal S0 and the switches SW34 and SW36 are turned on responsive to the control signal S0B in the first time interval T1 (in the period from t4 to t5), the inverters 37 and 38 form the flip-flop, and the inverters 39 and 40 form the flip-flop. Then, the flip-flops respectively hold the value immediately before the switch SW33 is turned off and the value immediately before the switch SW35 is turned off. The latch unit 30 detects the second output terminal 4 at the High level (VE2) of the high amplitude, and causes the switch SW24 between the second output terminal 4 and the second power supply terminal E2 in the second level shifter 20 to be turned off in the first time interval T1 (in the period from t4 to t5) according to the second control signal S3 and the third control signal S4. The switch SW23 is kept in an on state.

When the input signals vi1 and vi2 are respectively kept at a Low level (VE3) of the low amplitude and the High level (VE4) of the low amplitude at a subsequent time td2, the first level shifter 10 drives the voltage VO1 at the first output terminal 3 at a Low level (VE1) of the high amplitude. In this period (from t4 to t5), the current path between the second output terminal 4 and the second power supply terminal (E2) in the second level shifter 20 is disconnected. Thus, the second level shifter 20 does not perform the charging operation on the second output terminal 4. The second output terminal 4 is held at the High level (VE2) of the high amplitude by a parasitic capacitance.

At the time t5, the first time interval T1 is finished. Then, when the control signal S0B assumes the High level of the high amplitude, the outputs of the NOR circuits 41 and 42 are fixed at a Low level of the high amplitude. Turning off of the switch SW23 between the second output terminal 4 and the second power supply terminal E2 in the second level shifter 20 is thereby cancelled.

In the second time interval T2 (period from t5 to t6), the first control signal S0 and the complementary signal S0B of the first control signal S0 respectively assume a Low level of the high amplitude and the High level of the high amplitude. Then, the switches SW33 and SW35 are turned on, and the switches SW34 and SW36 are turned off. Thus, the latch unit 30 supplies the inverted signals of the voltage VO1 at the first output terminal 3 and the voltage VO2 at the second output terminal 4 to the NOR circuits 41 and 42, respectively, in a through mode. The outputs of the NOR circuits 41 and 42 that have received the control signal S0B at the High level of the high amplitude are both fixed at a Low level of the high amplitude. The switches SW23 and SW24 which have respectively received the second control signal S3 at a Low level of the high amplitude and the third control signal S4 at a Low level of the high amplitude are both turned on, so that the current path between the second power supply terminal E2 and each of the first output terminal 3 and the second output terminal 4 is brought into the conduction or conductable state. The voltage (VO1) at the first output terminal 3 and the voltage (VO2) at the second output terminal 4 are stably held at a Low level (VE1) of the high amplitude and the High level (VE2) of the high amplitude, respectively.

In the first time interval T1 (period from t4 to t5) where data of the same value continues over a plurality of data cycles, the second output terminal 4 at the High level (VE2) is held by a parasitic capacitance. However, the first time interval T1 is short, so that there is scarcely a possibility that the logic level of the second output terminal 4 varies and the second output terminal 4 malfunctions due to the influence of noise or the like.

In the embodiment represented by FIG. 15, each of the N-channel MOS transistors M2 and M1 in the first level shifter 10 should include capability of quickly discharging one of the first output terminal 3 and the second output terminal 4 disconnected from the second power supply terminal E2 in the first time interval T1, and may be therefore formed with a comparatively small element size. On the other hand, each of the P-channel MOS transistors M4 and M3 in the level shift unit 20C should include capability of quickly charging one of the first output terminal 3 and the second output terminal 4 connected to the N-channel MOS transistor M2 or M1 turned off responsive to the input signal vi1 or vi2 in the first time interval T1, and may be formed with a comparatively small element size. Further, each of the switches SW23 and SW24 in the second switch 20B, and each of the devices in the latch unit 30 may be formed with a sufficiently small element size. Further, the level shift circuit in the embodiment described above can perform a high-speed level shift operation without depending on a speed in a change of the voltage level (rise or fall time) of the first control signal S0. For this reason, the first control signal S0 generated by the control signal generation circuit 90 (in FIG. 14) does not always need to be a high-speed signal (with a quick rise or fall time). A signal generated by an existing level shift circuit or the like may be employed.

Exemplary Embodiment 2

Figure 17:
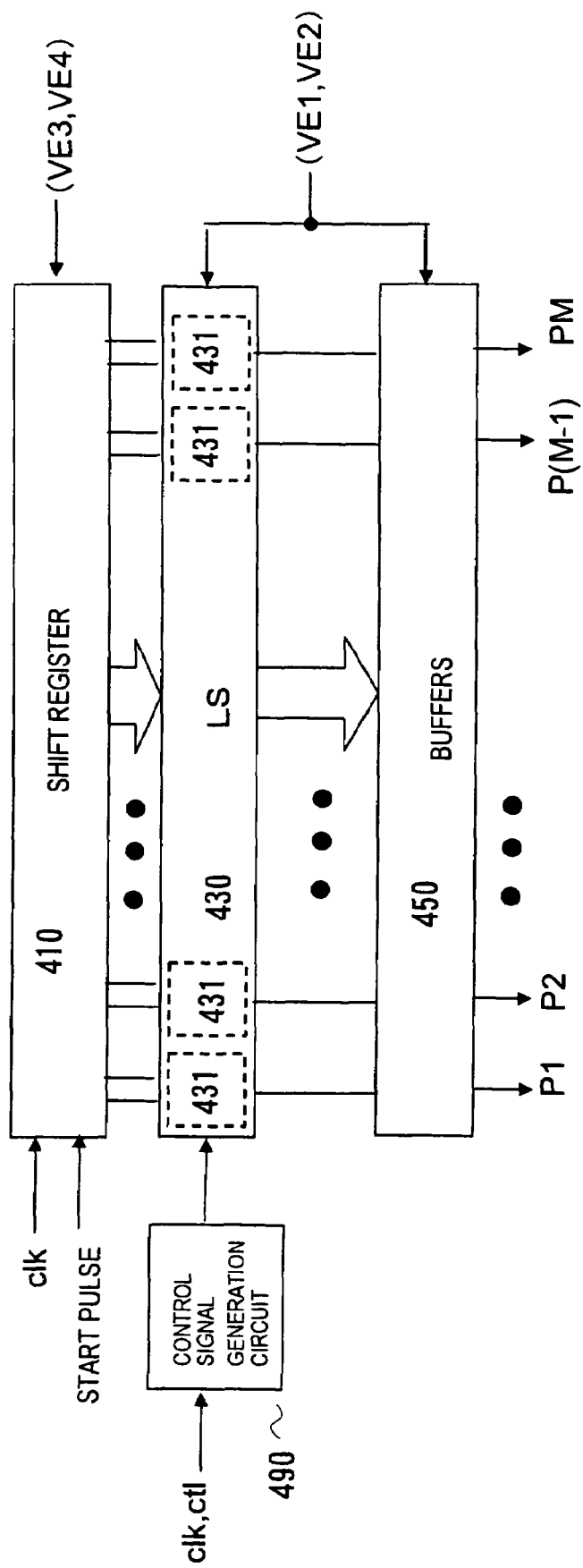
FIG. 17 is a diagram showing an example of a configuration of a row driver in an exemplary embodiment 2 of the present invention.

FIG. 17 is a diagram showing an embodiment of a configuration of a row driver (scan driver) of a display system of the present invention. FIG. 17 shows an example where the present invention has been applied to a level shift circuit of a multiple output driver. Referring to FIG. 17, the row driver includes a shift register 410 that transfers a start pulse to a subsequent stage based on a clock signal clk, level shift circuits 430 that includes level shift circuits 431 which differentially receive respective output signals (scan signals) of respective stages of the shift register 410 and perform level shifting, buffers 450 each of which receives a high-amplitude output signal of a corresponding one of the level shift circuits 431 at a single end and outputs a scan signal to a corresponding one of scan lines (scan lines) P1, P2, . . . or PM, and a control signal generation circuit 490 that receives a low-amplitude clk (clock) and a signal ct1 (timing control signal) and supplies a high-amplitude control signal S0 (corresponding to the first control signal S0 in FIG. 1). Each level shift circuit 431 is provided corresponding to each stage of the shift register 410. The shift register 410 is driven by low-voltage power supplies (VE3, VE4), and the level shift circuits 430 and the buffers 450 are driven by high-voltage power supplies (VE1, VE2).

The configuration shown in FIG. 17 uses the level shift circuit described in each of the embodiments 1-1 to 1-7 as the level shift (LS) circuit 431. The control signal generation circuit 490 outputs the control signal S0 common to the respective level shift circuits 431, using an existing level shifter. As described above, the rise or fall speed of the voltage level of the control signal S0 does not affect the operating speed of each level shift circuit 431. By applying the level shift circuit according to the present invention, the scan driver that operates at high speed with low power dissipation can be implemented, and cost reduction due to area saving can also be implemented.

Exemplary Embodiment 3

Figure 18:
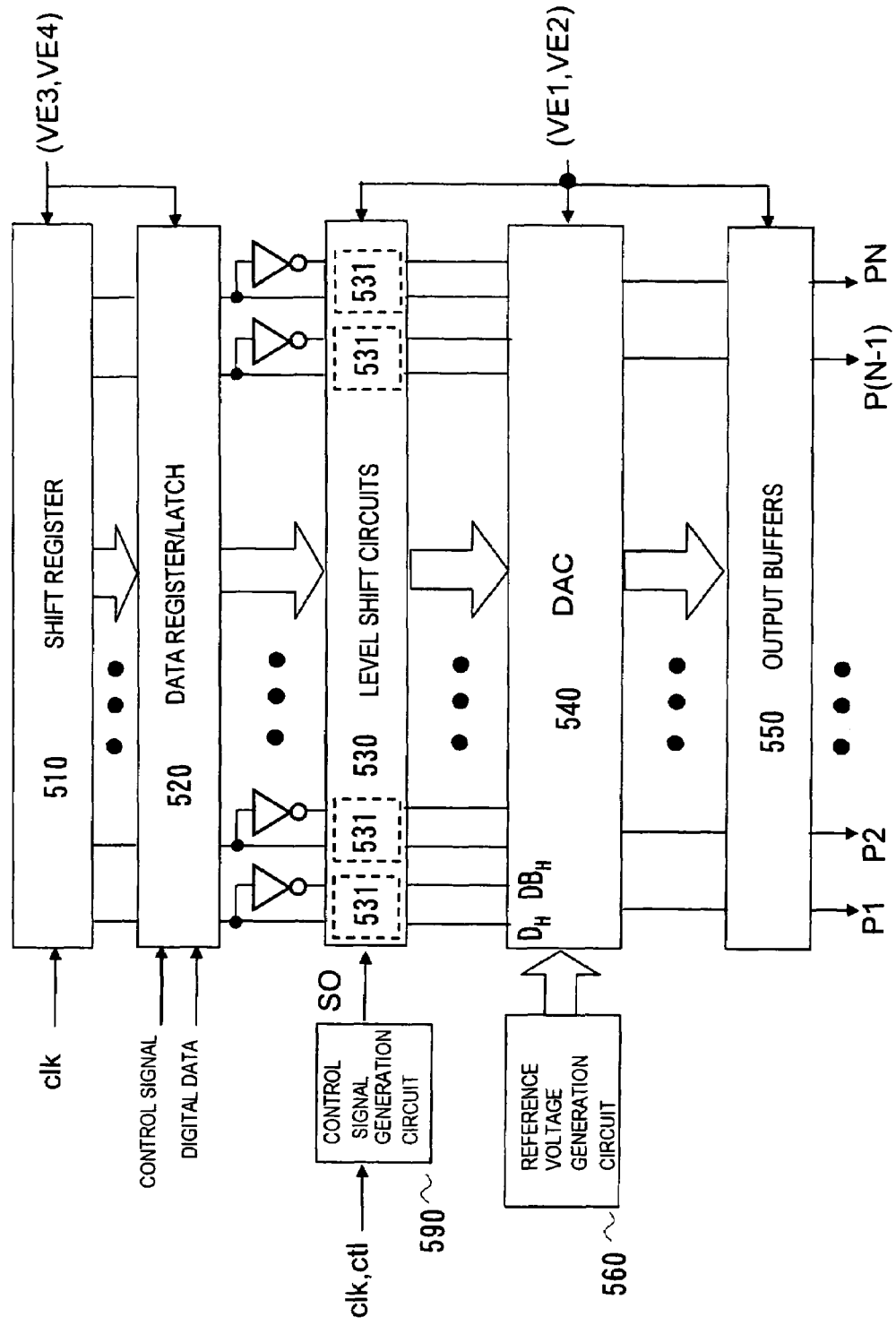
FIG. 18 is a diagram showing an example of a configuration of a column driver in an exemplary embodiment 3 of the present invention.

FIG. 18 is a diagram showing an embodiment of a configuration of a data driver of a display system of the present invention. FIG. 18 shows an example where the present invention has been applied to a level shift circuit of a multiple output driver. Referring to FIG. 18, the data driver includes a shift register 510 that receives a clock signal clk and generates a latch timing signal that performs latch address selection, a data register/latch 520 that latches digital data based on an output (latch timing signal) of the shift register 510, level shift circuits 530 including a plurality of level shift circuits 531 that differentially receive output data signals in respective stages of the data register latch 520 and perform level shifting, a plurality of digital-to-analog converters (DAC) 540 that respectively receive output signals (video data) of the level shift circuits 530 and reference voltages that have mutually different levels from a reference voltage generation circuit 560 and output gray scale voltages corresponding to the video data, output buffers 550 each of which receives a corresponding one of the output voltages of the digital-to-analog converters (DAC) 540 and drives a data line, and a control signal generation circuit 590 that receives a low-amplitude signal clk (clock) and a signal ct1 (timing control signal) and supplies a high-amplitude control signal S0 (corresponding to the first control signal S0 in FIG. 1) to each of the level shift circuits 531. The shift register 510 and the data register/latch 520 are driven by low-voltage power supplies (VE3, VE4). The level shift circuits 530, digital-to-analog converters (DAC), and output buffers 550 are driven by high-voltage power supplies (VE1, VE2).

In the configuration shown in FIG. 18, the level shift (LS) circuits 531 differentially receive the outputs of the data register/latch 520 and differentially output the output signals. The level shift circuit uses any one of the embodiment 1-1 to 1-7.

The control signal generation circuit 590 outputs the control signal S0 in common to the respective level shift circuits 531, using an existing level shifter. As described above, a rise or fall time (speed) of the voltage level of the control signal S0 does not affect the operating speed of each level shift circuit 531. By applying the level shift circuit of the present invention, a data driver that operates at high speed with lower power dissipation can be implemented. Cost reduction due to area saving can also be implemented.

Exemplary Embodiment 4

Figure 19:
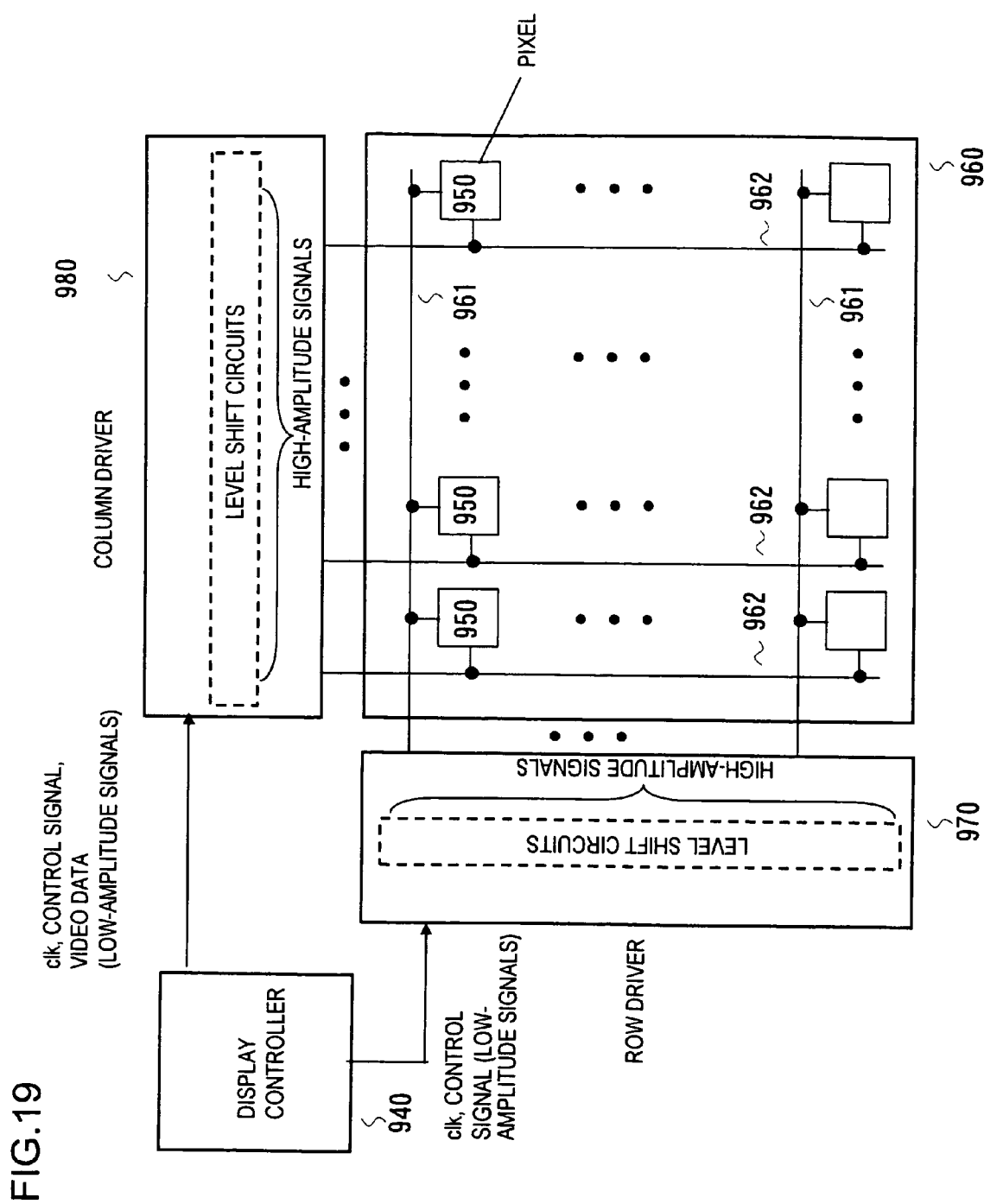
FIG. 19 is a diagram showing an example of a configuration of a display system in an exemplary embodiment 4 of the present invention.

FIG. 19 is a diagram showing a configuration example of a display system of the present invention. In the display system in an active matrix driven system, a display unit 960 is formed of a structure including a semiconductor substrate with a plurality of pixels 950 arranged thereon in a matrix form, an opposing substrate with one transparent electrode formed on an entire surface thereof, and a display element sealed between the two substrates that are opposed to each other. On the semiconductor substrate, data lines 962 that send a plurality of level voltages (gray scale voltages) to be applied respective electrodes of the pixels and scan lines 961 that send scan signals are wired in a lattice form. A pixel 950 is arranged in a mutual intersection between each scan line (scan electrode line) 961 and each data line (data electrode line) 962. In the case of the display system in a passive matrix driven system, a display unit 960 is formed of a structure in which a substrate with data lines 962 that send a plurality of level voltages (gray scale voltages) wired thereon and a substrate with scan lines 961 that send scan signals wired thereon are opposed, and a display element is sealed between the substrates. A region in which each data line 962 and each scan line 961 intersect constitutes a pixel 950.

In the case of the display system in the active matrix driven system, according to a scan signal on each scan line 961, turning on/off of a switch (TFT) of the pixel 950 is controlled. When the pixel switch is turned on, a video signal (gray scale voltage corresponding to the video signal) on the data line 962 to which the pixel 950 is connected is applied to the electrode of the pixel, thereby displaying an image.

The scan signal is supplied to the corresponding scan line 961 from a row (scan) driver 970 and supply of the gray scale voltage to each pixel is performed from a column (data) driver 980 via the corresponding data line 962.

Data rewriting of one screen is usually performed in one frame period (usually 1/60 seconds). Using each scan line, every pixel line (every line) is selected one by one, and within a selected period, the gray scale voltage is supplied through each data line. A display controller 940 supplies a clock signal, a control signal (start pulse), and the like to the row driver 970, and supplies a clock clk, a control signal, and video data (low-amplitude digital signals) to the column driver 980.

As described with reference to FIGS. 17 and 18, the display system in this embodiment includes the level shift circuit of the present invention as each of the row driver 970 and the column driver 980, and the level shift circuit outputs a high-amplitude signal.

FIG. 20 includes diagrams each showing an example of the pixel 950 in FIG. 19. FIG. 20A schematically shows a configuration of the pixel 950 in a liquid crystal unit of a passive matrix type. Transmittance of a liquid crystal element 953 sandwiched between an intersection of a scan electrode line 961 and a data electrode line 962 changes in accordance with a difference of voltages applied to the scan electrode line 961 and the corresponding data electrode line 962, and causes back light (or reflected light) to pass therethrough. FIG. 20B shows a configuration of the pixel 950 in a liquid crystal unit of an active matrix type. A gate of a pixel switch (TFT) 951 is connected to the scan line 961. One of a drain and a source of the pixel switch (TFT) 951 is connected to the corresponding data line 952. The other of the drain and the source of the pixel switch (TFT) 951 is connected to a pixel electrode 962. A liquid crystal element 953 is sandwiched between the pixel electrode 952 and an opposing transparent electrode 954. When the scan line 961 is at a high potential and the pixel switch (TFT) 951 is turned on, the gray scale voltage on the corresponding data line 962 is applied to the pixel electrode 952. Transmittance of the liquid crystal element 953 changes according to a potential difference between the pixel electrode 962 and the common electrode 954, thereby causing back light (or reflected light) to pass through the liquid crystal element. FIG. 20C is a diagram showing a configuration of the pixel 950 (in a current driving system) in an organic EL (Electro Luminescence) display unit of the active matrix type. The pixel 950 is of a current driven type. A gate of a pixel switch (TFT) 951 is connected to the scanning line 961. One of a drain and a source of the pixel switch (TFT) 951 is connected to the corresponding data line 962. The other of the drain and the source of the pixel switch (TFT) is connected to a gate of an organic EL element driving transistor (P-channel TFT transistor) 955. A source of the driving transistor 955 is connected to a power supply 958. A drain of the driving transistor 955 is connected to an EL element 956. A capacitance 957 for data signal holding is connected between the source and the gate of the driving transistor 955. When the scan line 961 is at a high potential, the pixel switch (TFT) 951 is turned on. The gray scale voltage on the corresponding data line is applied to the gate of the driving transistor 955 and the capacitance 957, thereby flowing current through the organic EL element 956. The organic EL element 956 thereby emits light.

The level shift circuit described in each of the embodiments described above may be formed on a single crystal semiconductor substrate using a CMOS process or the like. Alternatively, the level shift circuit may be formed on a TFT (Thin Film Transistor) substrate.

In the example shown in each of FIGS. 7 and 8, the example where the charging elements in the level shifter 20 on a higher potential side are formed of the P-channel transistors and the discharging elements in the level shifter 10 on a lower potential side are formed of the N-channel transistors. Conductivity types of the transistors in the present invention are not of course limited to such a configuration. When the charging elements in the level shifter 20 are formed of the N-channel transistors, a drop corresponding to the threshold voltage of each N-channel transistor is present in an output voltage. Depending on the application example, however, the level shifter 20 may also be formed of the N-channel transistors.

Likewise, depending on the application example, the level shifter 10 may be formed of the P-channel transistors.

Each disclosure of Patent Document 1 described above is incorporated herein by reference. Modifications and adjustments of exemplary embodiments are possible within the scope of the overall disclosure (including claims) of the present invention, and further based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the basic technical concept.

What is claimed is:

1. A level shift circuit comprising:
a first level shifter connected between a first power supply terminal that supplies a first voltage and a first output terminal and a second output terminal, the first level shifter receiving a first input signal and a second input signal from a first input terminal and a second input terminal, respectively, and setting one of the first and second output terminals to a first voltage level, based on the first and second input signals;
a second level shifter connected between a second power supply terminal that supplies a second voltage and the first and second output terminals, the second level shifter setting an other of the first and second output terminals to a second voltage level, while the one of the first and second output terminals being set to the first voltage level by the first level shifter; and
a circuit that receives a first control signal, disconnects a current path in the second level shifter between the second power supply terminal and one of the first and second output terminals that has been set to the second voltage level at a time point when the first and second input signals are supplied to the first and second input terminals and connects a current path in the second level shifter between the second power supply and the other of the first and second output terminals, for a first time interval including the time point when the first and second input signals are supplied to the first and second input terminals, and cancels the disconnection of the current path between the one of the first and second output terminals and the second power supply terminal for a second time interval after the first time interval,
wherein the setting the one of the first and second output terminals to the first voltage level by the first level shifter and the setting the other of the first and second output terminals to the second voltage level by the second level shifter are operated in the first time interval, and
wherein output amplitudes at the first and second output terminals are set to be larger than amplitudes of the first and second input signals.

2. The level shift circuit according to claim 1, wherein the first and second input signals are supplied to the first and second input terminals in a predetermined cycle, and the first time interval includes time periods before and after the time point when the first and second input signals are supplied to the first and second input terminals, and a sum of the first and second time intervals is set to be the same as a time period of the cycle of the first and second input signals.

3. The level shift circuit according to claim 1, further comprising:
a latch unit that receives respective voltages at the first and second output terminals, and provides a latch operation of the voltage at each of the first and second output terminals controlled by the first control signal to produce a second control signal and a third control signal, wherein the second level shifter includes:
a first switch unit that disconnects current paths between the second power supply terminal and the first output terminal and between the second power supply terminal and the second output terminal, for the first time interval, and cancels the disconnection of the current paths for the second time interval, based on the first control signal; and
a second switch unit that disconnects at the first time interval, the current path between the second power supply terminal and the one of the first and second output terminals that assumes the second voltage level at a time of a start of the first time interval and cancels the disconnection of the current path between the second power supply terminal and the one of the output terminals for the second time interval, based on the second and third control signals.

4. The level shift circuit according to claim 3, wherein the first switch unit includes a first switch and a second switch that are inserted in the current path between the second power supply terminal and the first output terminal and in the current path between the second power supply terminal and the second output terminal, respectively, and are controlled to be commonly turned on or off, responsive to the first control signal, and
wherein the second switch unit includes:
a third switch that is inserted in the current path between the first output terminal and the second power supply terminal in parallel with the first switch, and is controlled to be turned on or off responsive to the second control signal; and
a fourth switch that is inserted in the current path between the second output terminal and the second power supply terminal in parallel with the second switch, and is controlled to be turned on or of responsive to the third control signal.

5. The level shift circuit according to claim 4, wherein the second level shifter includes first and second transistors having first terminals connected to the second power supply terminal, the first and second transistors performing level shifting to the second voltage level,
wherein the first and third switches are connected between a second terminal of the first transistor and the first output terminal in parallel, and
wherein the second and fourth switches are connected between a second terminal of the second transistor and the second output terminal in parallel.

6. The level shift circuit according to claim 4, wherein the second level shifter includes first and second transistors having first terminals connected to the first and second output terminals, respectively, the first and second transistors performing a level shift operation to the second voltage level,
wherein the first and third switches are connected in parallel between a second terminal of the first transistor and the second power supply terminal, and the second and fourth switches are connected in parallel between a second terminal of the second transistor and the second power supply terminal.

7. The level shift circuit according to claim 6, wherein the first transistor comprises a control terminal connected to the second output terminal, and the second transistor comprises a control terminal connected to the first output terminal.

8. The level shift circuit according to claim 3, wherein the latch unit, in the first time interval, stops receiving respective voltages at the first and second output terminals, based on the first control signal, and outputs signals obtained by latching respective voltage levels at the first and second output terminals at a time of a start of the first time interval as the second and third control signals, and
wherein the latch unit, in the second time interval, operates in a through mode to output, as the second and third control signals, signals which are based on the voltage levels at the first and second output terminals, respectively.

9. The level shift circuit according to claim 4, wherein the latch unit includes a fifth switch and a sixth switch each having one end respectively connected to the first and second output terminals, and having other ends respectively connected to control terminals of the third and fourth switches,
wherein the fifth and sixth switches are controlled to be turned on or off, responsive to the first control signal and hold voltages sampled by capacitors connected to the other ends thereof, respectively.

10. The level shift circuit according to claim 4, wherein the latch unit includes:
a fifth switch and a sixth switch each having one end connected to the first and second output terminals, respectively, the fifth and sixth switches being controlled to be turned on or off, by the first control signal;
a first inverter and a second inverter each having an input end connected to an other end of the fifth switch and an other end of the sixth switch, respectively; and
a third inverter and a fourth inverter each comprising an input end connected to output ends of the first and second inverters, respectively, output ends of the third and fourth inverters being connected to inputs of the first and second inverters via a seventh switch and an eighth switch which are controlled to be turned on or of by a complementary signal of the first control signal,
wherein output terminals of the first and second inverters are connected to control terminals of the fourth and third switches, respectively.

11. The level shift circuit according to claim 1, wherein the first level shifter includes a third transistor and a fourth transistor that are connected between the first power supply terminal and the first and second output terminals,
wherein the third and fourth transistors each comprising a control terminal connected to the first and second input terminals, respectively.

12. The level shift circuit according to claim 1, wherein the first level shifter includes:
a current source having one end connected to the first power supply terminal;
a third transistor connected between an other end of the current source and the first output terminal, the third transistor comprising a control terminal connected to the first terminal; and
a fourth transistor connected between the other end of the current source and the second output terminal, the fourth transistor comprising a control terminal connected to the second input terminal.

13. The level shift circuit according to claim 1, further comprising:
a first latch circuit and a second latch circuit that receive respective voltages at the first and second output terminals, in the first time interval based on the first control signal, and that output signals obtained by latching respective voltage levels at the first and second output terminals at a time of a start of the first time interval as a second control signal and a third control signal, and in the second time interval, operate in a through mode, to output signals based on the voltage levels at the first and second output terminals as the second and third control signals, respectively;
a first logic circuit that receives an output of the first latch circuit, and outputs the output signal of the first latch circuit as the second control signal for the first time interval, based on the first control signal; and a second logic circuit that receives an output of the second latch circuit, and outputs the output signal of the second latch circuit as the third control signal for the first time interval, based on the first control signal, wherein for the second time interval, the first and second logic circuits output signals that cancel the disconnection of the current path in the second level shifter between the first or second output terminal and the second power supply terminal, as the second and third signals.

14. A level shift circuit comprising:
a first transistor connected between a first power supply terminal and a first output terminal;
a second transistor connected between the first power supply terminal and a second output terminal, the first and second transistors receiving complementary input signals of a relatively low amplitude at control terminals thereof;
a third transistor connected between a second power supply terminal and the first output terminal;
a fourth transistor connected between the second power supply terminal and the second output terminals, the third and fourth transistors having control terminals connected to the second and first output terminals, respectively;
a latch unit that receives complementary output signals of a relatively high amplitude output from the first and second output terminals, respectively, and produces second and third complementary control signals at a timing specified by a first control signal supplied thereto;
a first switch connected between the second power supply terminal and the first output terminal in series with the third transistor;
a second switch connected between the second power supply terminal and the second output terminal in series with the fourth transistor, the first and second switches being commonly controlled to be turned on or off, responsive to the first control signal;
a third switch connected between the second power supply terminal and the first output terminal in series with the third transistor and in parallel with the first switch; and
a fourth switch connected between the second power supply terminal and the second output terminal in series with the fourth transistor and in parallel with the second switch, the third and fourth switches being controlled to be complementarily turned on or off responsive to the second and third control signals, respectively.

15. A level shift circuit comprising:
a first level shifter connected between a first power supply terminal that supplies a first voltage and first and second output terminals, the first level shifter receiving a first input signal and a second input signal from first and second input terminals, respectively, and setting one of the first and second output terminals to a first voltage level, based on the first and second input signals;
a second level shifter connected between a second power supply terminal that supplies a second voltage and the first and second output terminals, the second level shifter setting an other of the first and second terminals to a second voltage level, while the one of the first and second output terminals being set to the first voltage level by the first level shifter; and
a circuit that receives a first control signal and causes a current path in the second level shifter between the second power supply terminal and one of the first and second output terminals that is already set to the second voltage level at a time point when the first and second input signals are supplied to the first and second input terminals to be in a relatively high resistance state or an of state and a current path in the second level shifter between the second power supply terminal and the first and second output terminals to be an on state for a predetermined period, the predetermined period including the time point when the first and second input signals are supplied to the first and second input terminals, and cancels the high resistance state or off state of the current path in the second level shifter between the one of the first and second output terminals and the second power supply terminal after the predetermined period, wherein output amplitudes at the first and second output terminals are set to be larger than amplitudes of the first and second input signals.

16. A scan driver comprising:
a plurality of level shift circuits, each of the level shift circuits as set forth in claim 1, each of the level shift circuits receiving a signal of a relatively low-amplitude signal from a corresponding stage of a shift register that transfers a transfer signal and performing level shifting of the signal received to produce a signal of a relatively high amplitude; and
a plurality of buffers, each of the buffers receiving an output of a corresponding one of the level shift circuits and driving a scan line of a display panel.

17. The scan driver according to claim 16, further comprising:
a control signal generation circuit that receives a reference signal and a timing control signal, generates the first control signal of an amplitude defined by the first voltage level and the second voltage level, and supplies the generated signal to the level shift circuit.

18. A display system including the scan driver as set forth in claim 16.

19. A data driver comprising:
a plurality of level shift circuits, each of the level shift circuits as set forth in claim 1, each of the level shift circuits receiving a signal of a relatively low amplitude from a data latch circuit that latches digital data and performing level shifting of the signal received to produce a signal of a relatively high amplitude;
a plurality of digital-to-analog converters, each of which receives a digital signal from a corresponding level shift circuit of the plurality of level shift circuits and converts the received digital signal to an analog signal; and
a plurality of buffers, each of which receives an output of a corresponding digital-to-analog converter of the plurality of digital-to-analog converters and drives a data line of a display panel.

20. The data driver according to claim 19, further comprising:
a control signal generation circuit that receives a reference signal and a timing control signal, generates the first control signal of an amplitude defined by the first voltage level and the second voltage level, and supplies the first control signal to the level shift circuits.

21. A display system including the data driver as set forth in claim 19.

22. A semiconductor device including the level shift circuit as set forth in claim 1.

* * * * *